(12) United States Patent
Yi

(10) Patent No.: US 11,861,488 B1
(45) Date of Patent: *Jan. 2, 2024

(54) SCALABLE EXCITATORY AND INHIBITORY NEURON CIRCUITRY BASED ON VANADIUM DIOXIDE RELAXATION OSCILLATORS

(71) Applicant: HRL Laboratories, LLC, Malibu, CA (US)

(72) Inventor: Wei Yi, Moorpark, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 1189 days.

This patent is subject to a terminal disclaimer.

(21) Appl. No.: 15/976,687

(22) Filed: May 10, 2018

Related U.S. Application Data

(60) Provisional application No. 62/517,776, filed on Jun. 9, 2017.

(51) Int. Cl.
G06N 3/06 (2006.01)
G06N 3/065 (2023.01)
G06N 3/049 (2023.01)

(52) U.S. Cl.
CPC ............. *G06N 3/065* (2023.01); *G06N 3/049* (2013.01)

(58) Field of Classification Search
CPC .............................. G06N 3/0635; G06N 3/049
See application file for complete search history.

(56) References Cited

U.S. PATENT DOCUMENTS

| | | | |
|---|---|---|---|
| 3,483,110 A | 12/1969 | Rozgonyi | |
| 3,723,773 A * | 3/1973 | Adams | H03H 11/1213 333/132 |
| 6,426,891 B1 | 7/2002 | Katori | |
| 7,783,584 B1 * | 8/2010 | Hoppensteadt | G06N 3/049 706/15 |
| 8,324,976 B2 | 12/2012 | Borghetti | |
| 8,525,553 B1 * | 9/2013 | Yi | H03K 3/313 326/135 |
| 8,669,785 B2 | 3/2014 | Pickett | |
| 8,729,518 B2 | 5/2014 | Pickett | |
| 8,767,449 B2 | 7/2014 | Pickett | |
| 8,854,860 B2 | 10/2014 | Ribeiro | |
| 9,019,030 B1 * | 4/2015 | Abuelma'atti | H04L 27/127 361/437 |
| 9,627,490 B1 | 4/2017 | Eom | |
| 9,859,001 B2 | 1/2018 | Lee | |
| 2006/0011942 A1 | 1/2006 | Kim | |
| 2009/0134941 A1 * | 5/2009 | Kegasa | H03B 5/187 330/302 |
| 2009/0184305 A1 | 7/2009 | Lee | |

(Continued)

FOREIGN PATENT DOCUMENTS

CA 2285160 A1 4/2000

OTHER PUBLICATIONS

U.S. Appl. No. 15/879,363, filed Jan. 24, 2018, Yi.

(Continued)

*Primary Examiner* — Omar F Fernandez Rivas
*Assistant Examiner* — Tri T Nguyen
(74) *Attorney, Agent, or Firm* — Ladas & Parry, LLP

(57) ABSTRACT

A neuron circuit, comprising first and second NDR devices biased each with opposite polarities, said first and second NDR devices being coupled to first and second grounded capacitors.

13 Claims, 59 Drawing Sheets

(56) References Cited

U.S. PATENT DOCUMENTS

| | | | |
|---|---|---|---|
| 2010/0051892 A1 | 3/2010 | Mikawa | |
| 2011/0134579 A1 | 6/2011 | Hsu | |
| 2011/0181347 A1* | 7/2011 | Pickett | G11C 13/0002 327/538 |
| 2012/0014161 A1 | 1/2012 | Pickett | |
| 2012/0075907 A1 | 3/2012 | Jo | |
| 2012/0085985 A1 | 4/2012 | Yang | |
| 2012/0099362 A1 | 4/2012 | Ribeiro | |
| 2012/0104346 A1 | 5/2012 | Yi | |
| 2012/0132882 A1 | 5/2012 | Seo | |
| 2012/0138885 A1 | 6/2012 | Wu | |
| 2012/0249252 A1* | 10/2012 | Borghetti | H03B 7/00 331/132 |
| 2012/0286743 A1 | 11/2012 | Soltani | |
| 2012/0321938 A1 | 12/2012 | Oukassi | |
| 2013/0021835 A1 | 1/2013 | Hwang | |
| 2013/0099187 A1* | 4/2013 | Pickett | H01L 47/00 257/2 |
| 2013/0106480 A1 | 5/2013 | Ribeiro | |
| 2013/0155572 A1 | 6/2013 | Popovici | |
| 2013/0176766 A1 | 7/2013 | Pickett | |
| 2013/0234762 A1* | 9/2013 | Han | H01L 29/78684 327/109 |
| 2013/0242637 A1 | 9/2013 | Yang | |
| 2013/0249879 A1* | 9/2013 | Pickett | G09G 3/20 345/206 |
| 2013/0250420 A1 | 9/2013 | Yang | |
| 2014/0003139 A1 | 1/2014 | Pickett | |
| 2014/0029327 A1 | 1/2014 | Strachan | |
| 2014/0029330 A1 | 1/2014 | Muraoka | |
| 2014/0035614 A1* | 2/2014 | Pickett | G06N 3/049 326/30 |
| 2014/0214738 A1 | 7/2014 | Pickett | |
| 2014/0225646 A1 | 8/2014 | Pickett | |
| 2014/0252296 A1 | 9/2014 | Chueh | |
| 2014/0268995 A1 | 9/2014 | Joo | |
| 2014/0292428 A1 | 10/2014 | Koyama | |
| 2015/0053909 A1 | 2/2015 | Yang | |
| 2015/0137061 A1 | 5/2015 | Donghi | |
| 2015/0194203 A1 | 7/2015 | Pickett | |
| 2015/0207485 A1* | 7/2015 | Hsu | H03H 7/06 333/172 |
| 2015/0379395 A1* | 12/2015 | Pickett | G06N 3/0635 706/27 |
| 2016/0146862 A1* | 5/2016 | Cai | G01R 31/69 324/128 |
| 2016/0233251 A1 | 8/2016 | Sasaki | |
| 2016/0260779 A1 | 9/2016 | Kawashima | |
| 2016/0285022 A1 | 9/2016 | Gotanda | |
| 2016/0378896 A1* | 12/2016 | Abuelma'atti | G06F 17/10 703/2 |
| 2017/0040054 A1 | 2/2017 | Friedman | |
| 2017/0062048 A1* | 3/2017 | Ge | G11C 13/0002 |
| 2017/0219444 A1 | 8/2017 | Kim | |
| 2018/0212145 A1 | 7/2018 | Yi | |
| 2018/0226453 A1 | 8/2018 | Yi | |
| 2019/0122095 A1* | 4/2019 | Karg | G06N 3/063 |

OTHER PUBLICATIONS

U.S. Appl. No. 15/417,049, filed Jan. 26, 2017, Yi.
From U.S. Appl. No. 15/976,687, (filed May 10, 2018, non-publication request filed), Application and Office Actions.
From U.S. Appl. No. 15/417,049 (now published as US 2018-0212145 A1), Notice of Allowance dated Jan. 2, 2019.
From U.S. Appl. No. 15/417,049 (now published as US 2018-0212145 A1), Notice of Allowance dated May 1, 2018.
From U.S. Appl. No. 15/417,049 (now published as US 2018-0212145 A1), Notice of Allowance dated Apr. 4, 2018.
From U.S. Appl. No. 15/417,049 (now published as US 2018-0212145 A1), Office Action dated Dec. 4, 2017.
From U.S. Appl. No. 15/417,049 (now published as US 2018-0212145 A1), Office Action dated Aug. 25, 2017.
From U.S. Appl. No. 15/879,363 (now published as US 2018-0226453 A1), Office Action dated Jan. 16, 2019.
PCT International Search Report and Written Opinion from PCT/US2018/015110 dated May 8, 2018.
Apicella, P. "Leading tonically active neurons of the striatum from reward detection to context recognition", Trends in Neurosciences vol. 30, No. 6, pp. 299-306 (2007).
Beaumont, A. et al., Current-induced electrical self-oscillations across out-of-plane threshold switches based on VO2 layers integrated in crossbars geometry, Journal of Applied Physics, 115, 154502 (2014).
Cote, A.J., "Neuristor propagation in long-tunnel diodes," Proceedings of the IEEE 53, 164, 3 pages (1965).
Crane, H. D., "Neuristor—A novel device and system concept," Proceedings of the IRE 50, 2048-2060 (1962).
Crane, H.D., "The neuristor," IRE Transactions Electronic Computers, 9, pp. 370-371(1960).
Crunteanu, A., "Voltage- and current-activated metal-insulator transition in $VO_2$-based electrical switches: a lifetime operation analysis," Science and Technology Advanced Materials. 11, 065002 (2010).
Http://www.physiologyweb.com/lecture_notes/neuronal_action_potential/neuronal_action_potential_refractory_periods.html, Posted: Jul. 5, 2012.
Izhikevich, E.M. "Dynamical Systems in Neuroscience: The Geometry of Excitability and Bursting", The MIT Press, Cambridge MA (2007).
Izhikevich, E.M., et al., http://www.scholarpedia.org/article/FitzHugh-Nagumo_model (Accepted on Sep. 9, 2006).
Izhikevich, E. M., "Which model to use for cortical spiking neurons?" IEEE Transactions Neural Networks, vol. 15, No. 5. 1063-1070 (Sep. 2004).
Jo, et al., "Nanoscale Memristor Device as Synapse in Neuromorphic Systems," Nano Letters, 2010, 1297-1301.
Kawaradai, K., et al., "Neuristor-line operation with function of variable propagation velocity in plasma-coupled semiconductor devices," Proceedings Letters IEEE 61, (1973), 3 pages.
Kim, H.-T. et al., "Electrical oscillations induced by the metal-insulator transition in $VO_2$," Journal of Applied Physics 107, 023702 (2010).
Lee, Y. W. et al., "Metal-insulator transition-induced electrical oscillation in vanadium dioxide thin film," Applied Physics Letters, 92, 162903 (2008).
Nagumo, J. et al., "An active pulse transmission line simulating nerve axon," Proceedings of the IRE, 50, pp. 2061-2070 (1962).
Nishizawa, J.-I., "Two-line Neuristor with active element in series and in parallel," Int. J. Electronics, vol. 26, No. 5, pp. 437-369 (1969).
Pergament, A.L., et al., "Phase composition of anodic oxide films on transition metals: a thermodynamic approach," Thin Solid Films 322 (1998) pp. 33-36.
Pergament. A., et al. "Electrical Switching in Thin Film Structures Based on Transition Metal Oxides," Faculty of Physical Engineering, Petrozavodsk State University, Petrozavodsk 185910, Russia (2015), 26 pages.
Pickett, M. D., et al., "A scalable neuristor built with Mott memristors," Nature Materials, vol. 12, pp. 114-117 (2013).
Schultz, W., "Predictive reward signal of dopamine neurons," J. Neurophysiol. 80, 1-27 (1998).
Wang, Z., et al., "Memristors with diffusive dynamics as synaptic emulators for neuromorphic computing," Nature Materials, vol. 16, Jan. 2017.
Zhang, J-Gl, et al., "Filament Formation in Switching Devices Based on $V_2O_5$ Gel Films," J. Mater. Res., vol. 8, No. 3, pp. 558-564 (1993).
PCT International Preliminary Report on Patentability (Chapter I) from PCT/US2018/015110 dated Jul. 30, 2019.
U.S. Appl. No. 16/706,393, filed Dec. 6, 2019, Yi.
From U.S. Appl. No. 15/879,363 (now published as US 2018-0226453 A1), Office Action dated Mar. 19, 2019.

* cited by examiner

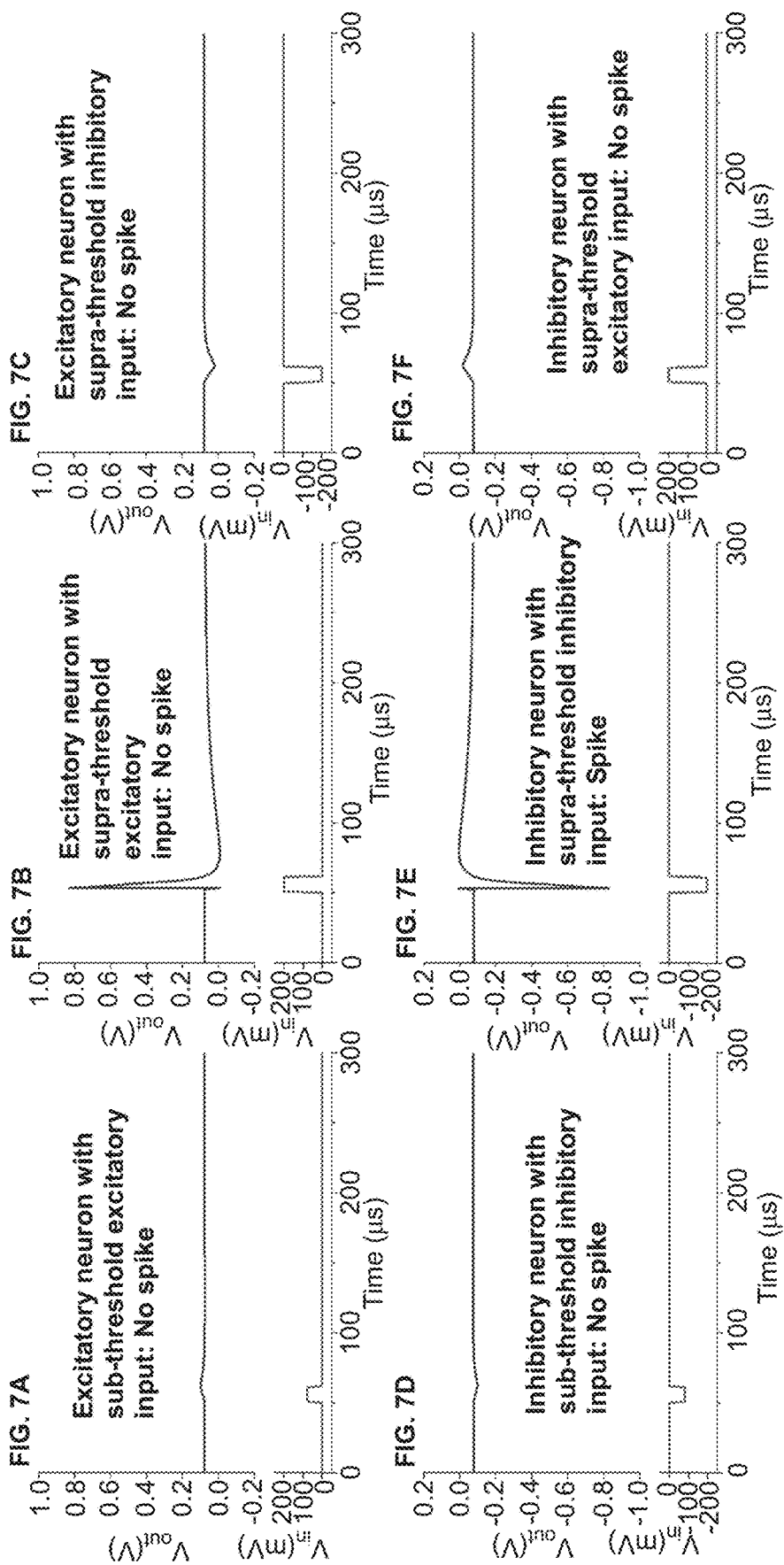

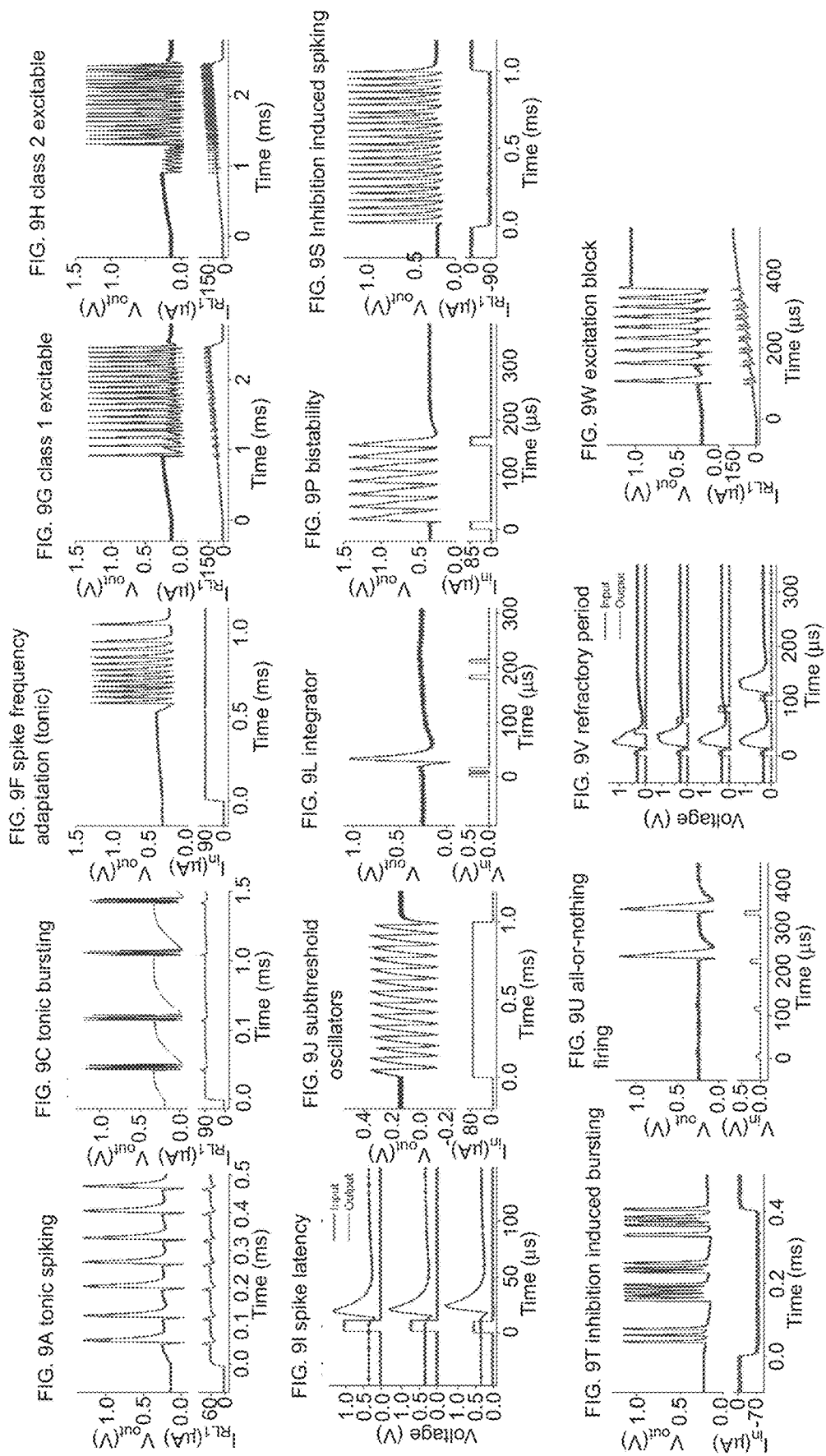

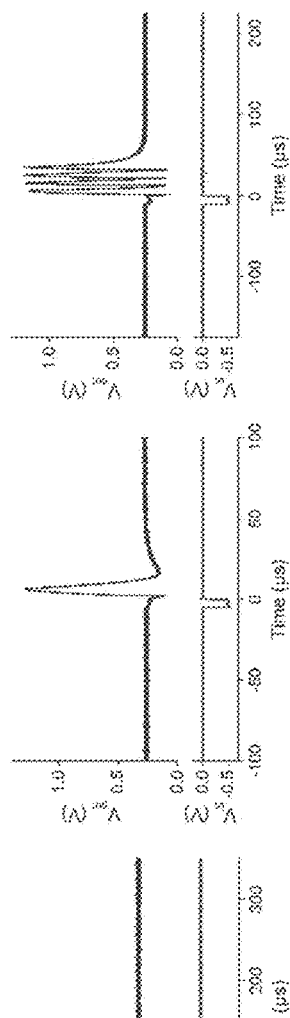
FIG. 10B phasic spiking (class 3 excitable)
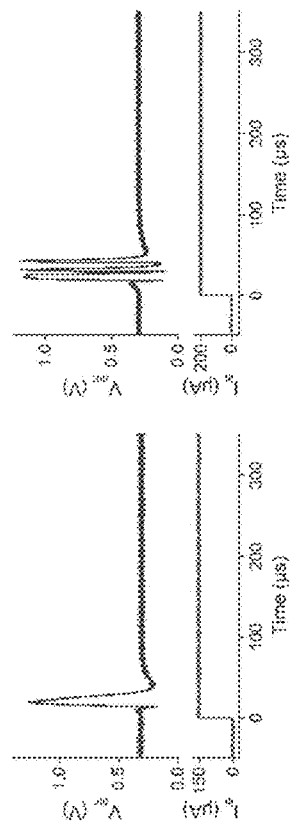
FIG. 10F spike frequency adaptation (phasic)
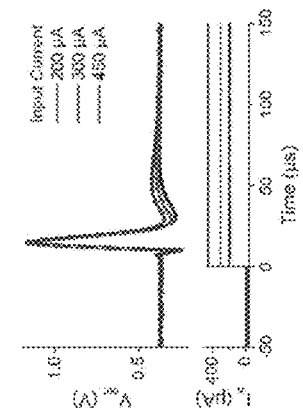
FIG. 10D phasic bursting
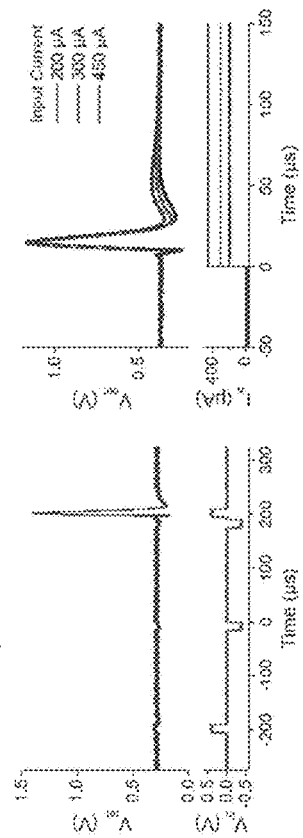
FIG. 10K resonator
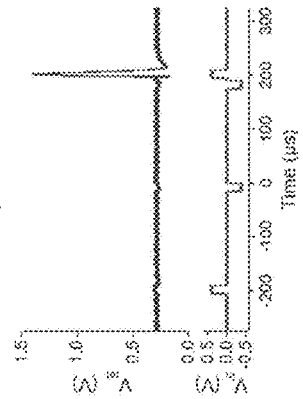
FIG. 10M rebound spike
FIG. 10O threshold variability
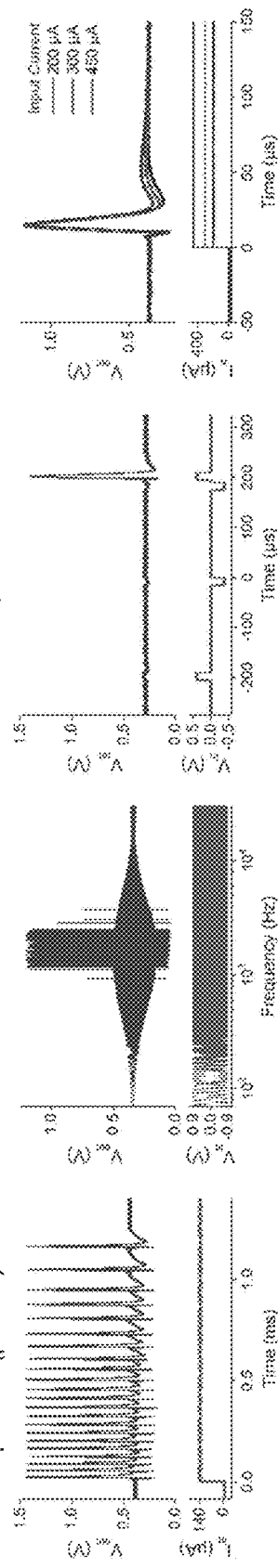
FIG. 10N rebound burst
FIG. 10Q depolarizing after-potential
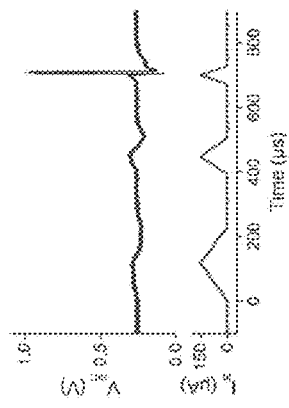
FIG. 10R accommodation

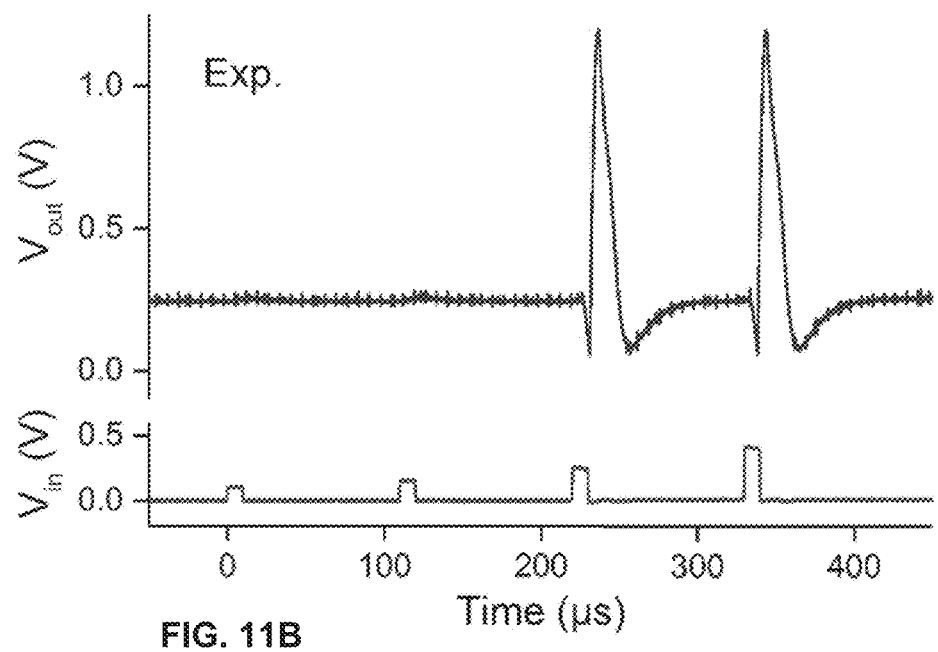
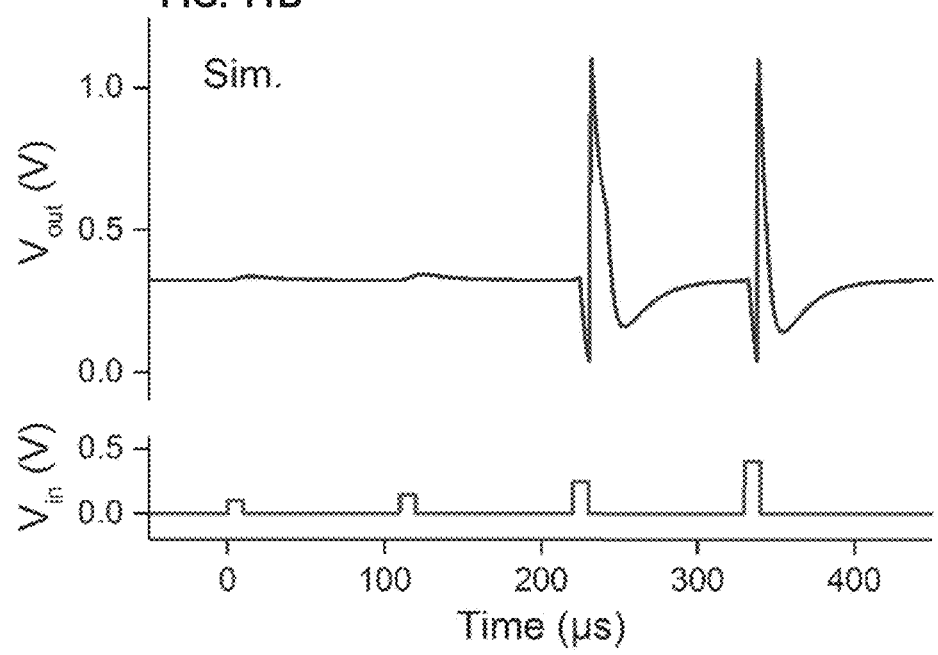

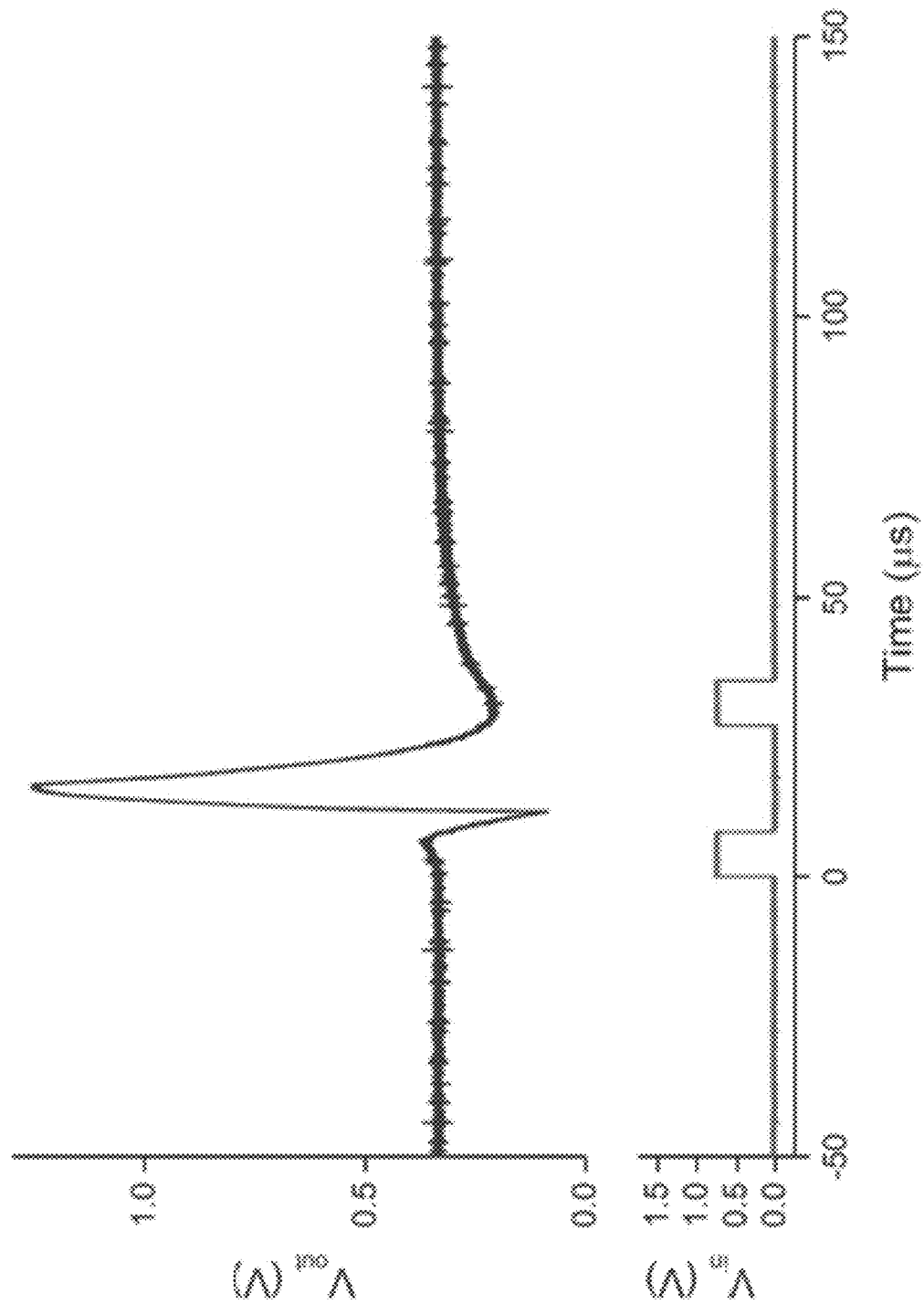

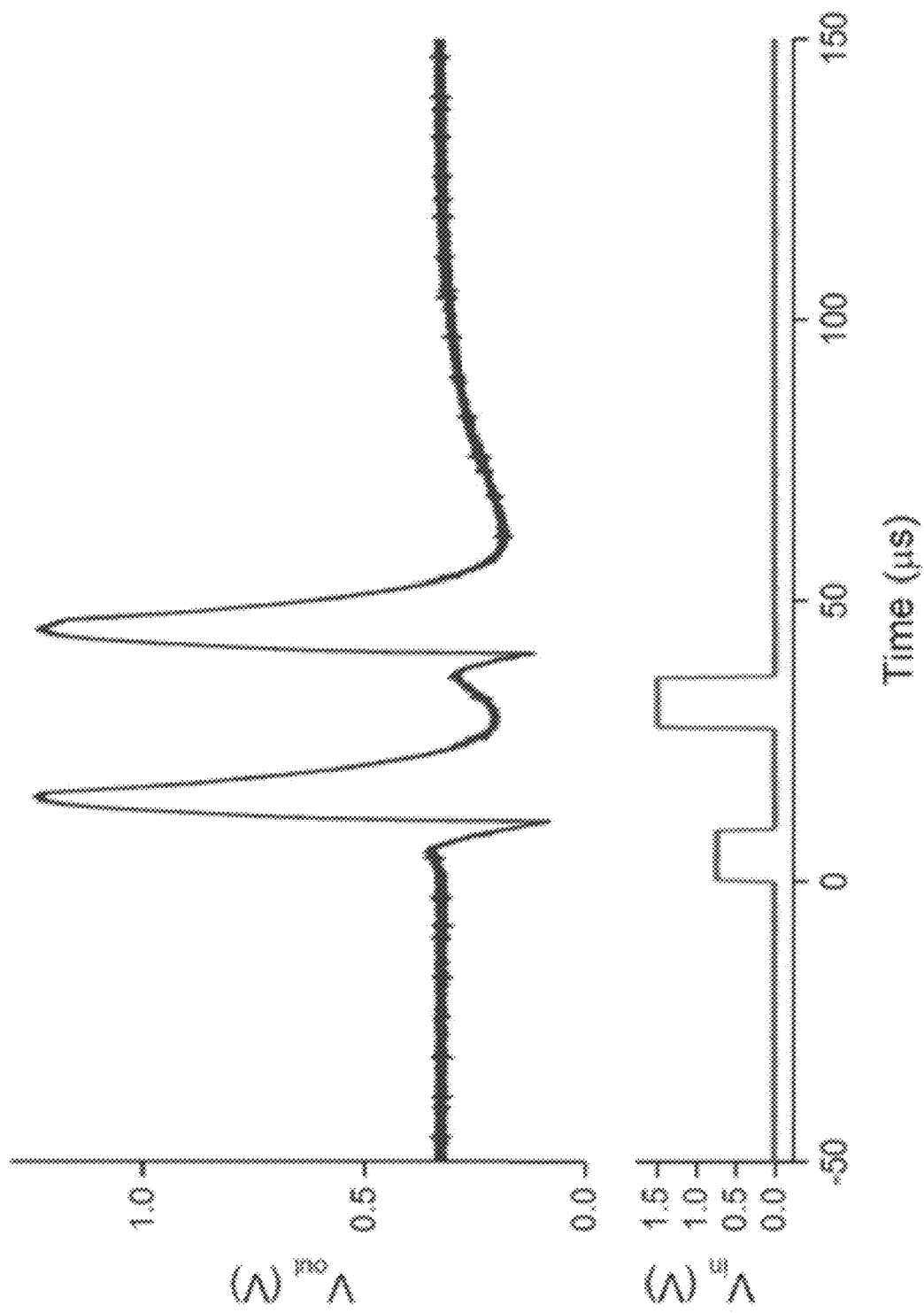

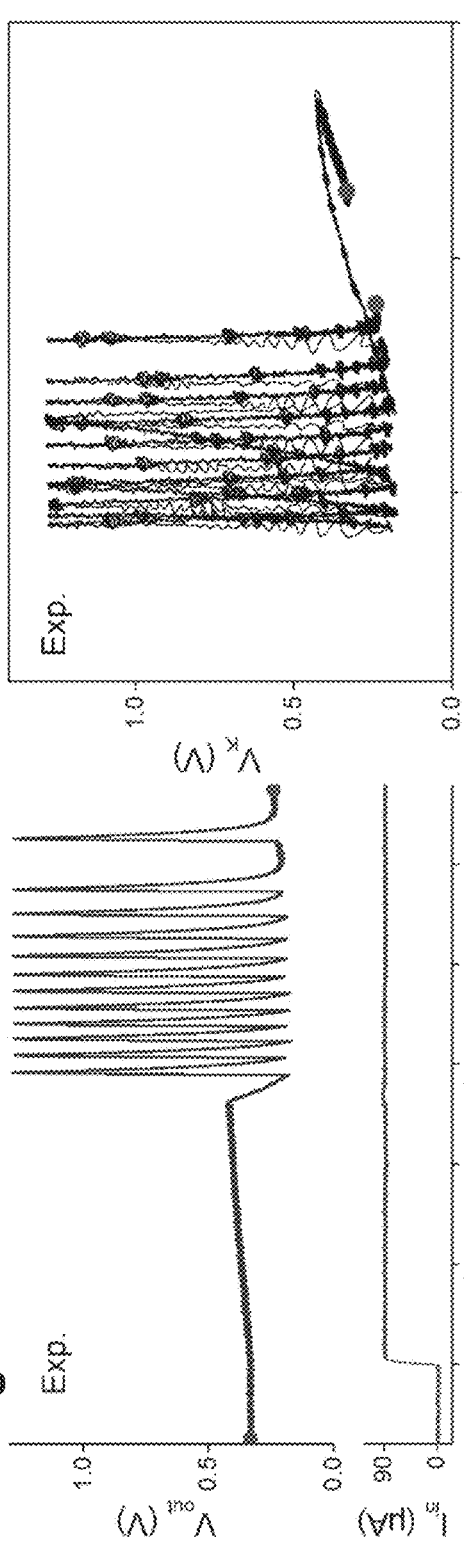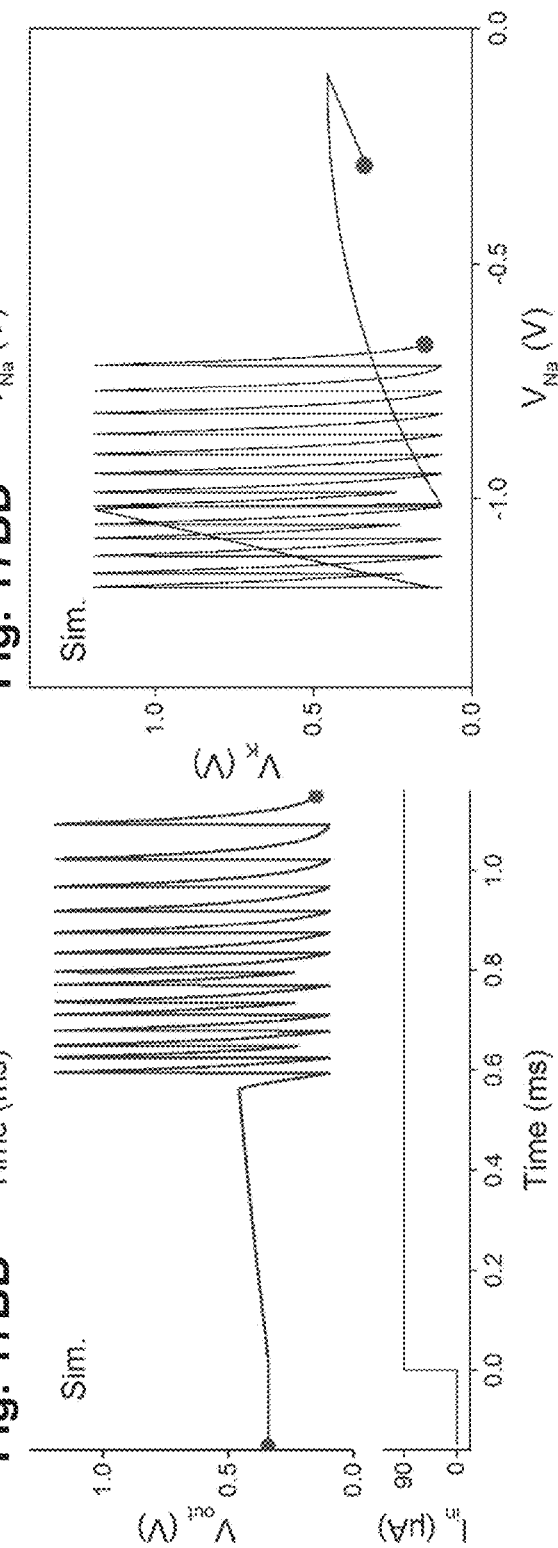
Fig. 17BA Exp.
Fig. 17BB Sim.
Fig. 17BC Exp.
Fig. 17BD Sim.

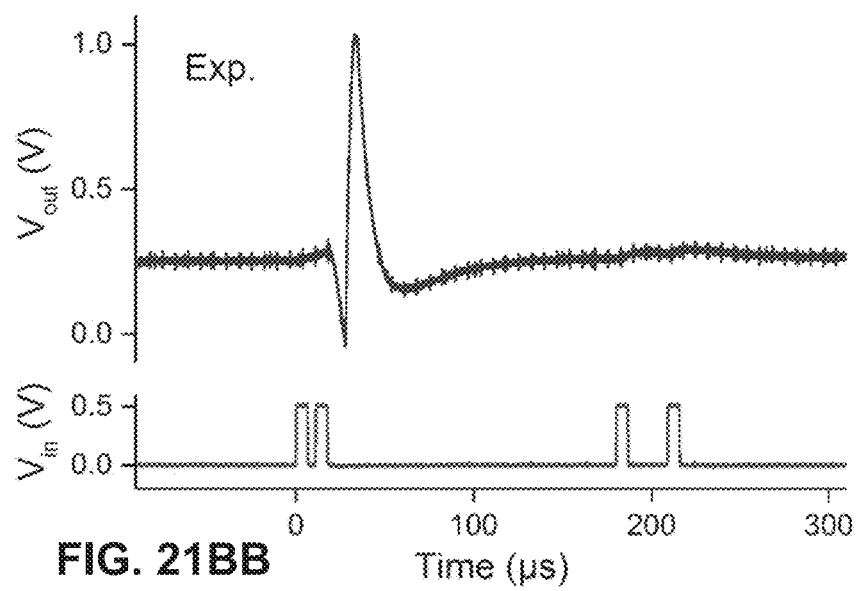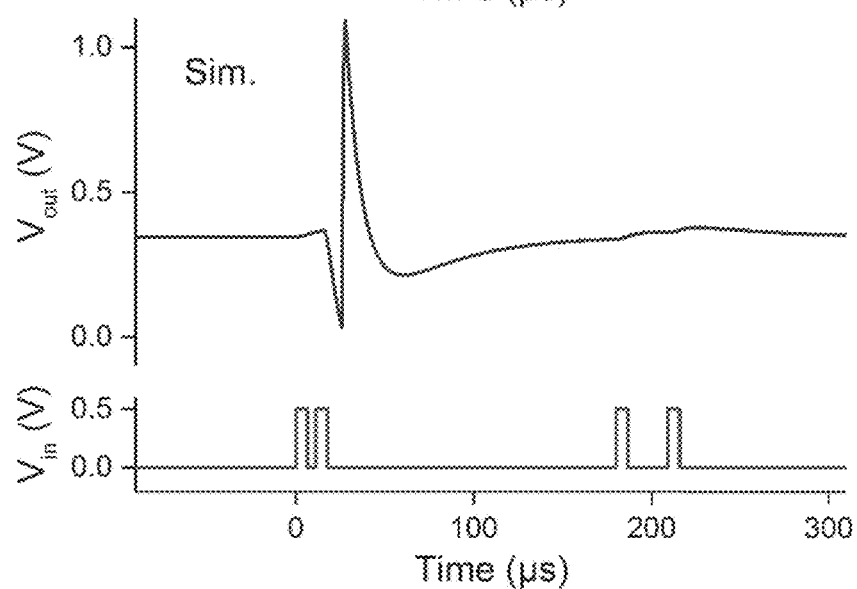

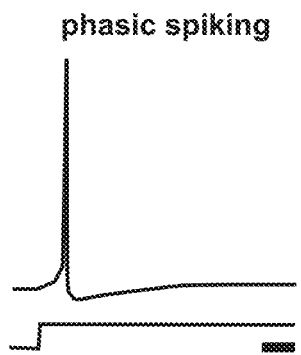
FIG. 26A
FIG. 26BA
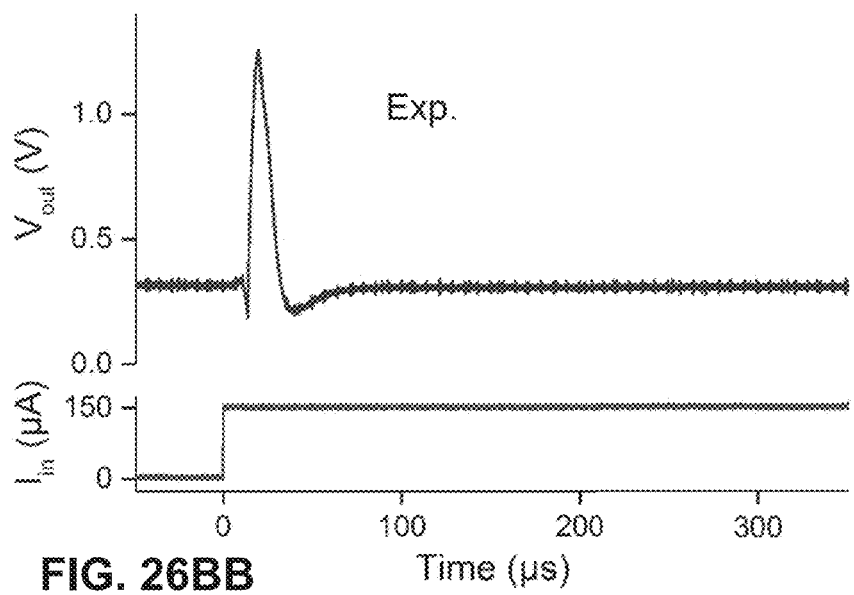
FIG. 26BB
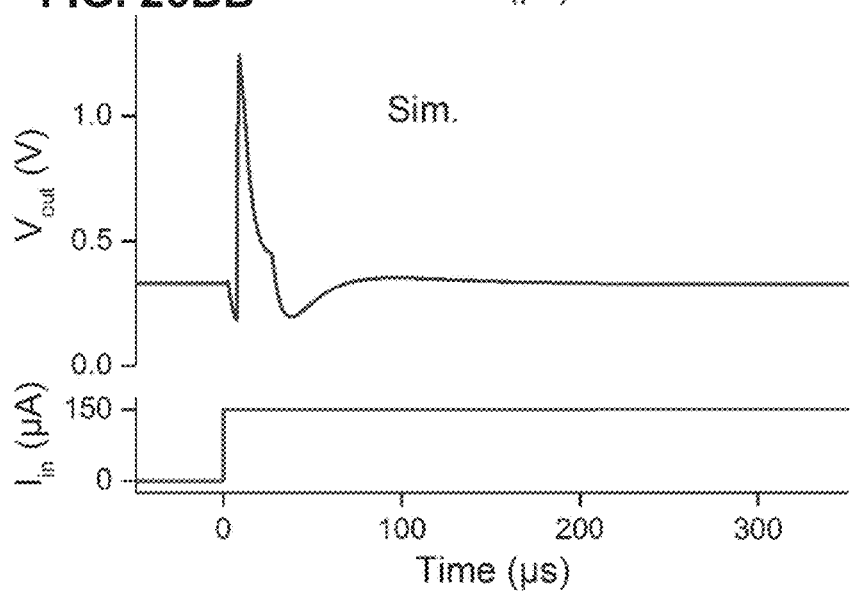

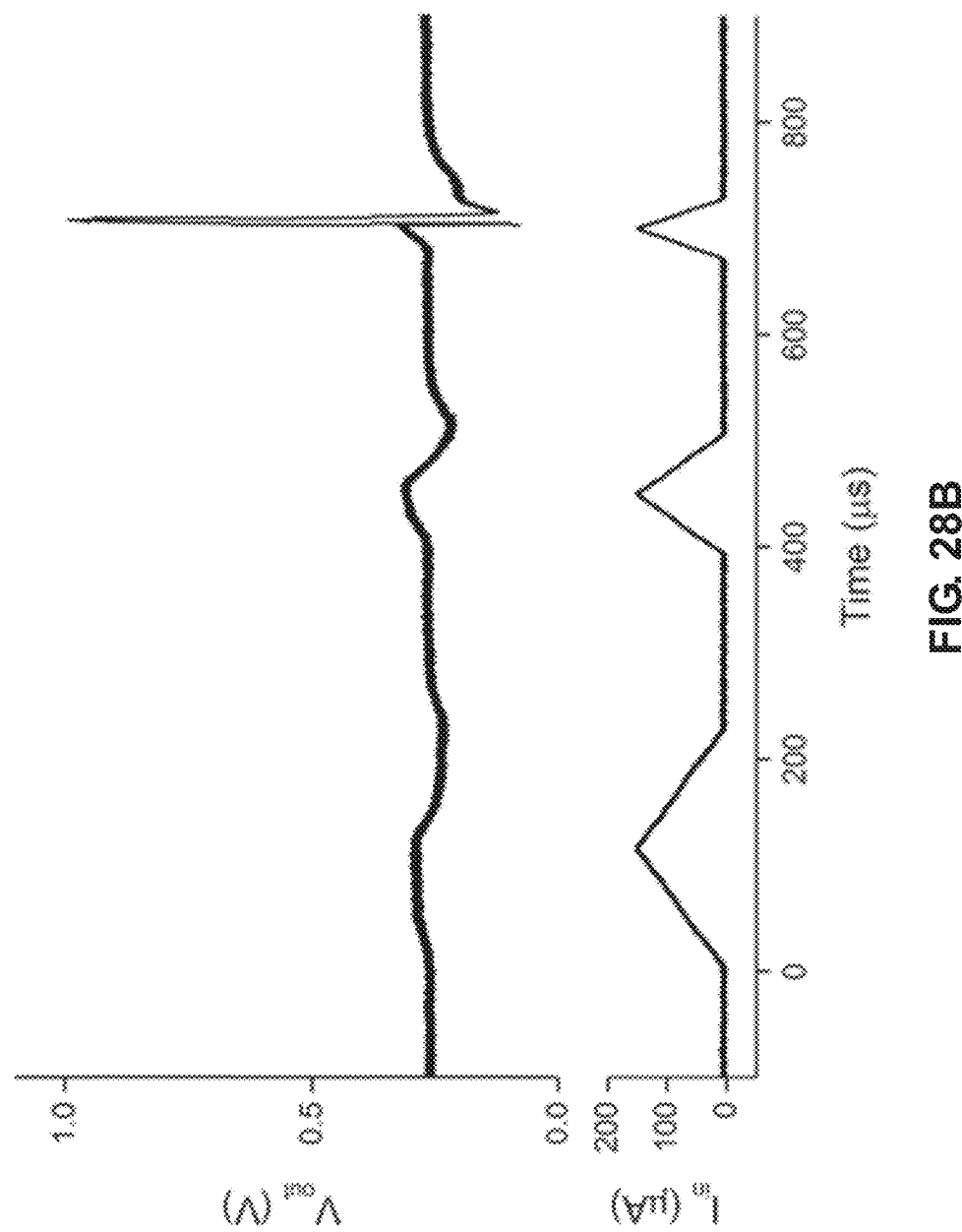

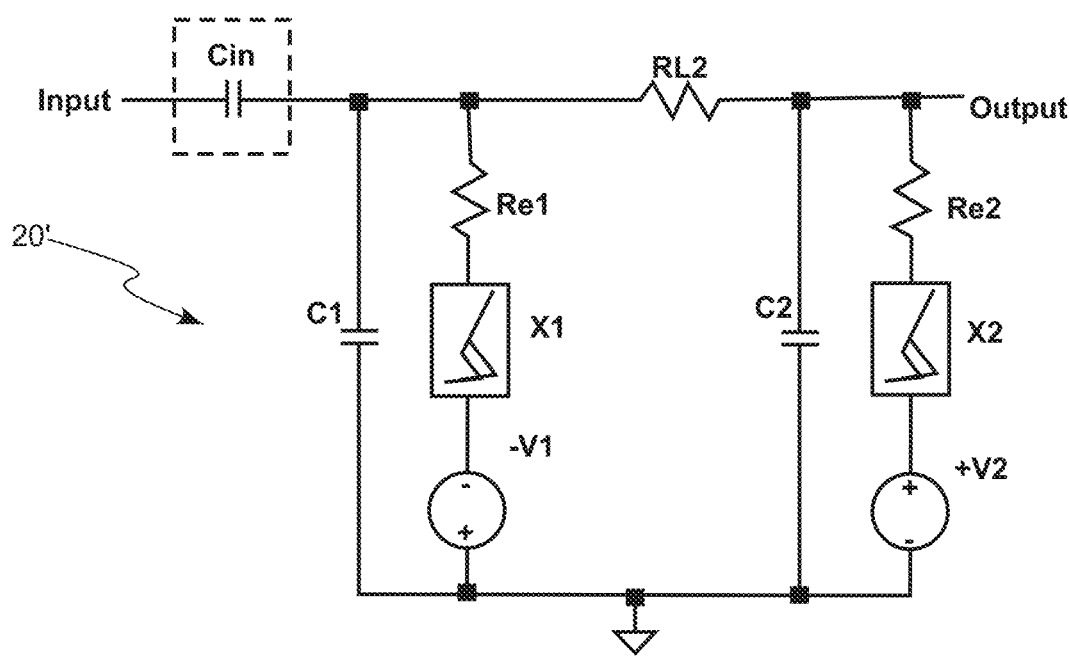
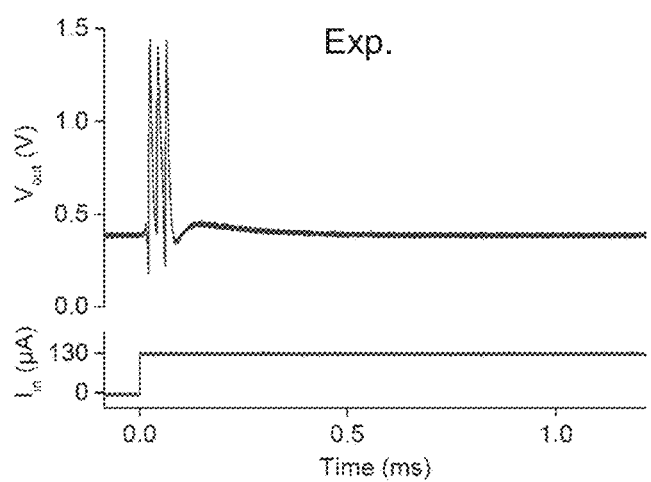
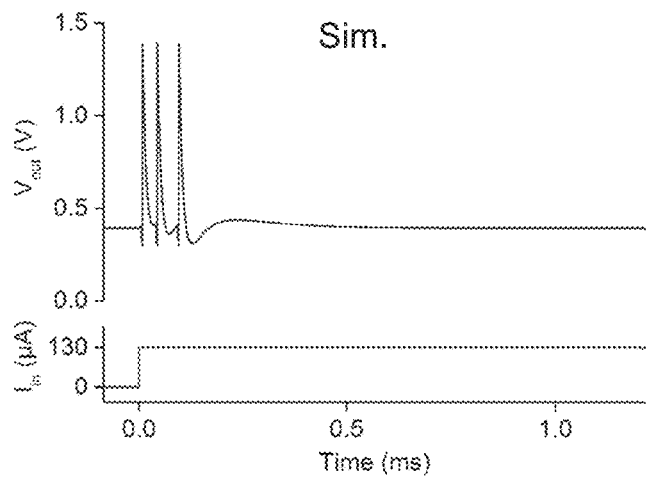
FIG. 34B

SCALABLE EXCITATORY AND INHIBITORY NEURON CIRCUITRY BASED ON VANADIUM DIOXIDE RELAXATION OSCILLATORS

CROSS REFERENCE TO OTHER APPLICATIONS

The present application is related to U.S. application Ser. No. 15/417,049, entitled "LOW-VOLTAGE THRESHOLD SWITCH DEVICES WITH CURRENT-CONTROLLED NEGATIVE DIFFERENTIAL RESISTANCE BASED ON ELECTROFORMED VANADIUM OXIDE LAYER" and filed on Jan. 26, 2017, which is hereby incorporated by reference in its entirety.

This application relates to and claims priority of U.S. patent application No. 62/517,776 (SCALABLE EXCITATORY AND INHIBITORY NEURON CIRCUITRY BASED ON VANADIUM DIOXIDE RELAXATION OSCILLATORS), filed Jun. 9, 2017 which is hereby incorporated by reference.

This application relates to U.S. patent application No. 62/569,288 (A SCALABLE, STACKABLE, AND BEOL-PROCESS COMPATIBLE INTEGRATED NEURON CIRCUIT), filed Oct. 6, 2017 which is hereby incorporated by reference. This application relates to U.S. patent application Ser. No. 15/879,363 (A SCALABLE, STACKABLE, AND BEOL-PROCESS COMPATIBLE INTEGRATED NEURON CIRCUIT), filed Jan. 24, 2018 which is hereby incorporated by reference.

TECHNICAL FIELD

This presentation relates to neuron circuits, tonic or phasic, that can be manufactured in a manner compatible with known manufacturing processes, such as CMOS manufacturing processes. This presentation also relates to neural circuits made with such neuron circuits.

BACKGROUND

Excitatory neurons and inhibitory neurons play different roles in e.g. mammalian brain cortex. Both types of neurons are key building blocks for constructing artificial neural networks (ANNs), which may find wide applications in the fields of neuromorphic (brain-like) computing, brain-machine interface, and neuroscience. Although only constituting 20-25% of all neurons in the cortex, inhibitory neurons play important roles in central nervous system (CNS). Simply put, inhibition acts as red traffic lights, stop signs, or speed bumps to slow down and regulate the information flows in the CNS. Inhibition can be classified into different types, by their locations, mechanisms, or types of neural circuits. By location, inhibition can be presynaptic, by reduced secretion of neural mediator molecules; or can be postsynaptic, by hyperpolarization or stabilization of the postsynaptic cell membrane.

FIG. 1A shows conceptually two excitatory neurons A, B and one inhibitory interneuron C connected through synapses 10, and FIG. 1B shows their corresponding neural network symbols. Essentially, electrical impulses (action potentials) sent by presynaptic neurons (A; C) through their axons 12, can produce postsynaptic potentials (PSPs) via various neurotransmitter mechanisms occurring in the synapse 10 junctions. For simplicity, details of axonal structures, such as the myelin sheath formed by glial cells, are omitted in FIG. 1A. Consequently, excitatory or inhibitory ionic currents are generated in dendrites 14 of a postsynaptic neuron (B), which are summed in the neuron cell body (soma) 16. The soma 16 performs certain transformation function, e.g. integration of dendritic currents into a voltage, and an action potential will be triggered near the axon hillock 18 if the membrane potential (MP) reaches a threshold value far enough from a resting potential (typically at −70 mV). For a neuron at the resting state, there are more sodium ions ($Na^+$) outside than inside the neuron; and more potassium ions ($K^+$) inside than outside the neuron. The neuron cell maintains its resting MP by at the same time pumping back into the neuron cell the potassium ions that leak out of the neuron cell, and pumping out sodium ions that leak into the neuron cell.

For neuromorphic computing and other applications, a simple structure is desired to imitate the excitatory and inhibitory neuron behaviors without the need of reproducing their biophysiological details. A possible way is to utilize threshold-activated electronic pulsatile circuitries that selectively respond to certain polarity of electrical stimuli, and generate an action potential (spike) in the corresponding polarity if the input goes beyond certain threshold value. For example, such an artificial excitatory neuron may generate positive spikes if and only if positive excitatory postsynaptic potentials (EPSPs) are fed into its input; whereas an artificial inhibitory neuron, on the contrary, may generate negative spikes if and only if negative inhibitory postsynaptic potentials (IPSPs) are fed into its input. The purpose of such spiking inhibitory neurons is to convert a weakly negative IPSP input into amplified negative spikes, and feed the negative spikes into the target neurons to slow down and regulate their activities. There exist other possible inhibitory mechanisms that do not require the use of negative spike action potentials. For example, a mechanism in which all output spike action potentials are positive, but those that are generated by inhibitory neurons reduce the PSP inside a receiving neuron, and this in turn make less likely the production of a regular positive spike action potential at the final output of a receiving neuron. Such mechanisms are beyond the scope of this presentation.

Current artificial neuron implementations (both excitatory and inhibitory) are predominantly based on Si VLSI circuits, often times using Si CMOS transistors operating in sub-threshold regimes. Si neurons utilize analog, digital, or mixed-mode CMOS circuits to synthesize abstracted models that can represent certain subset of biological neuron behaviors. Despite over 30 years of technological advancement, there are still significant gaps in energy efficiency (EE), size, and biological fidelity between today's state-of-the-art Si neurons and biological neurons. Si neurons suffer from a cost-fidelity dilemma, i.e., scalability and biological fidelity have so far not been simultaneously achievable. A fundamental reason is that known silicon devices are not inherently biomimetic and lack the stochasticity and criticality that biological neurons possess.

Hewitt Crane in early 1960s proposed a hypothesized circuit concept termed "Neuristor". The circuit could in principle support attenuation-less signal propagation in a manner similar to the action potential transmission along a nerve axon. (see H. D. Crane, "The neuristor". IRE Trans. Elect. Comput. 9, 370 (1960); and H. D. Crane, "Neuristor—a novel device and system concept". Proc. IRE 50, 2048 (1962)). However, Crane's proposal in the above references used a discrete-element relay as the active device, which is not practical.

There are several early experimental demonstrations of Neuristor concept, using different types of voltage-controlled or current-controlled Negative Differential Resistance (NDR) devices. These approaches are technologically flawed, either having poor scalability (e.g. involve bulky inductors that are hard to integrate), or consuming high standby power (e.g. voltage-controlled NDR). The interest on Neuristor diminished as Si CMOS became the mainstream technology. Such early experimental demonstrations of Neuristor concept include: "An active pulse transmission line simulating nerve axon", by J. Nagumo, S. Arimoto, and S. Yoshizawa, Proc. IRE 50, 2061 (1962); "Neuristor propagation in long-tunnel diodes", by A. J. Cote, Proc. IEEE 53, 164 (1965); "Two-line Neuristor with active element in series and in parallel", by J.-I. Nishizawa and A. Hayasaka, Int. J. Electronics 26, 437 (1969); and "Neuristor-line operation with function of variable propagation velocity in plasma-coupled semiconductor devices"; by K. Kawarada and T. Suzuki, Proc. IEEE 61, 1141 (1973).

In the last few years, current-controlled NDR phenomenon realized in nano-crossbar metal-oxide-metal structures has been utilized as scalable gain elements suitable for oscillatory circuitries and Neuristor circuit implementations. Such recent experimental demonstrations of Neuristor concept include: "Oscillator circuitry having negative differential resistance", by J. Borghetti, M. D. Pickett, G. Medeiros-Ribeiro, W. Yi, J. Yang, M. M. Zhang, U.S. Pat. No. 8,324,976 B2 (2012); "A scalable neuristor built with Mott memristors", by M. D. Pickett, G. Medeiros-Ribeiro and R. S. Williams, Nature Mater. 12, 114 (2013); "Logic circuits using Neuristors", by M. D. Pickett, U.S. Pat. No. 8,669,785 B2 (2014). See also US 2013/0099187 to Picket et al.; and US 2014/0214738 to Pickett.

A common feature of the above references is that two coupled Pearson-Anson (PA) type of relaxation oscillators based on current-controlled NDR devices can be used to generate threshold oscillations and neuron-like spike trains. The reference "A scalable neuristor built with Mott memristors" in particular used nanoscale metal-NbO2-metal NDR devices to demonstrate the scalability of such compact spiking circuitries. Noticeably, the Neuristor circuit in this reference only responds to positive EPSPs, either in the form of a positive voltage pulse or a positive current injection. Consequently, it is only capable to generate a positive excitatory action potential (spike).

FIG. 1C illustrates a circuit diagram of a neuristor circuit/node (300) as shown in US 2014/0214738 to Pickett. Neuristor circuit 300 uses two nominally identical Mott memristors (M1 and M2). In parallel with each of the Mott memristors is a capacitor (C1 and C2). The two channels are energized (d.c.-biased) with opposite polarity voltages, similar to the sodium and potassium channels of a biological neuron. Importantly, it is noticed that the d.c. bias polarities in FIG. 1C as shown in US 2014/0214738 are reversed as compared with the original neuristor circuit, as shown in FIG. 1a of reference "A scalable neuristor built with Mott memristors" by the same author, in which the sodium channel (C1, M1) is negatively biased and the potassium channel (C2, M2) is positively biased. In US 2014/0214738, no explanation has been provided about this discrepancy, and there is no description on what changes in the transfer function of the neuristor circuit would occur if the d.c. bias polarities of the two ion channels are reversed. Therefore, it looks to be an unintentional error in US 2014/0214738 rather than a purposeful alteration.

In FIG. 1C, the sodium and potassium channels are coupled to each other through a load resistor (RL2). The circuit has an input resistance (RL1) and an output impedance (Rout and Cout in parallel). This circuit is described by four coupled first-order differential equations that define four dynamic state variables for the system. These four state variables are: the normalized metallic channel radii (u1, u2) of the memristors (M1, M2) and the charges (q1, q2) stored in the capacitors (C1, C2). When a sub-threshold input voltage is applied, the response of the neuristor is minimal. However, when a supra-threshold input (input above the threshold) is applied, the output of the neuristor is substantially greater. For example, if the threshold of the neuristor is about 0.25 V, the application of a sub-threshold input voltage of 0.2 V for 10 microseconds may result in an output of tens of milli-volts. However, if the input voltage is 0.3 V the output of the neuristor may be a voltage spike with a peak close to the d.c. voltage bias, which can be greater than 0.3 V. Thus, the memristor-based neuristor of FIG. 1C exhibits both signal gain and thresholding. The re-charging of the capacitors control time delay that mimics the refractory period of biological systems. Interaction between the two memristors is mediated by resistor RL2. The system also produces constant spike amplitude/shape and constant velocity propagation through multiple neuristors connected in series. The amplitude and shape of the output pulse is determined by the electrical characteristics of the neuristor and the applied voltages (+Vd.c, and −Vd.c). The amplitude and shape of the output pulse is independent of the input. The input functions solely to trigger firing by the neuristor. The principles described above provide for a transistor-free spiking neuron architecture.

As described for example in Figure three of the publication "A scalable neuristor built with Mott memristors", a known neuristor circuit such as shown in FIG. 1C continues to fire a train of individual spikes at a constant frequency, or fires a periodic bursts of spikes when stimulated by a persistent d.c. current input. These characteristics are known as part of the spiking behaviors for tonically active neurons (TANs). Phasically active neurons (PANs), on the contrary, may fire only a single spike at the onset of the steady d.c. current input, and remain quiescent afterwards. Such a behavior is also called Class 3 excitable. Both TANs and PANs play important roles in the CNS. In a number of brain areas such as cortex, striatum, and midbrain, PANs involve a wide range of processes including motor control, cognition and reward-related learning (see W. Schultz, "Predictive reward signal of dopamine neurons", J. Neurophysiol. 80, 1 (1998); and P. Apicella, "Leading tonically active neurons of the striatum from reward detection to context recognition", Trends in Neurosciences 30, 299 (2007).). However, there was no demonstration or discussion of phasic spiking behaviors in these prior art.

A drawback of known neuristor circuits such as illustrated in FIG. 1C is that they use NbO2 as their NDR material. NbO2 is a Mott insulator with a critical temperature (TC) of 1080 K (or 807° C.) for Mott Insulator-to-Metal Transition, consequently NbO2 devices require a large local temperature rise of 800 K (or ° C.) to operate, which negatively impacts both the power consumption and the device longevity.

Another drawback of these known neuristor circuit is that they are not provided to generate inhibitory (negative) action potentials.

Another drawback of these known neuristor circuit is that, as outlined above, they only demonstrated a reduced number of tonic spiking behaviors: all-or-nothing firing (threshold spiking), refractory period, slow and fast tonic spiking, and tonic bursting, and no phasic spiking behavior.

There is accordingly a need for a neuron emulating circuit, or neuron circuit, which requires only a small temperature rise to operate and requires little energy to operate. There is also a need for a neuron circuit that generates inhibitory (negative) action potentials. There is also a need for a neuron circuit that generates phasic spiking behaviors.

SUMMARY

This presentation relates to compact biomimetic electronic circuitries that can serve as either excitatory or inhibitory neurons or neuron circuits in a spiking neural network (SNN). According to embodiments of this presentation, both the excitatory and inhibitory spiking neuron circuits consist of two resistively coupled PA type of relaxation oscillators based on VO2 NDR devices. According to an embodiment of this presentation, the neuron circuits can be tonic or phasic.

An embodiment of this presentation comprises a neuron circuit, having first and second NDR devices biased each with opposite polarities, said first and second NDR devices being coupled to first and second grounded capacitors.

According to an embodiment of this presentation, said first NDR device has a first node connected to an input node of the neuron circuit by a first load resistor or capacitor and a second node connected to a first voltage source; said first node of said first NDR device being coupled to said first grounded capacitor; and said second NDR device has a first node connected to said first node of said first NDR device by a second load resistor and a second node connected to a second voltage source; said first node of said second NDR device being coupled to said second grounded capacitor; said first node of said second NDR device forming an output node of the neuron circuit.

According to an embodiment of this presentation, said first voltage source is a negative voltage source and said second voltage source is a positive voltage source.

According to an embodiment of this presentation, said first voltage source is a positive voltage source and said second voltage source is a negative voltage source.

According to an embodiment of this presentation, at least one of the first and second NDR devices comprises between its first and second nodes a resistance connected in series with an NDR material.

According to an embodiment of this presentation, at least one of the first and second NDR devices comprises a vanadium dioxide layer between its first and second nodes.

According to an embodiment of this presentation, said first NDR device has a first node connected to an input node of the neuron circuit by a first capacitor and a second node connected to a first voltage source; said first node of said first NDR device being coupled to said first grounded capacitor; and said second NDR device has a first node connected to said first node of said first NDR device by a first load resistor and a second node connected to a second voltage source; said first node of said second NDR device being coupled to said second grounded capacitor; said first node of said second NDR device forming an output node of the neuron circuit; an optional second load resistance being in series or in parallel with the first load capacitor and the first node of said first NDR device.

According to an embodiment of this presentation, the first load capacitor, the first NDR device, the first voltage source and the first grounded capacitor are arranged to form a first relaxation oscillator; and the second load resistor, the second NDR device, the second voltage source and the second grounded capacitor are arranged to form a second relaxation oscillator.

According to an embodiment of this presentation, said vanadium dioxide layer is generated by electroforming from a vanadium pentoxide layer. The vanadium dioxide layer can be directly prepared by a variety of thin film deposition methods, including but not limited to, reactive d.c. or r.f. magnetron sputtering of vanadium metal or vanadium oxide targets, atomic layer deposition followed by post-deposition anneal, or metallic precursor oxidation.

According to an embodiment of this presentation, at least one of the first and second NDR devices comprises, on a substrate having a surface: a first electrode wire extending on said surface along a first direction; a vanadium pentoxide layer extending on and contacting at least a portion of said first electrode; a second electrode wire extending over said surface along a second direction, such that the second electrode wire extends on and contacts at least a portion of the vanadium pentoxide layer above the first electrode wire at a crossing point; wherein a region of vanadium dioxide is included in said vanadium pentoxide layer between the first and second electrodes at said crossing point.

According to an embodiment of this presentation, said vanadium pentoxide layer is disposed within a recess in a dielectric layer formed over said first electrode and at least part of said surface not covered by said electrode.

According to an embodiment of this presentation, the substrate comprises a Si substrate covered with an insulating layer of silicon dioxide ($SiO_2$), silicon nitride ($SiN_x$), silicon oxynitride ($SiO_xN_y$), hydrogenated silicon nitride ($Si_xN_yH_z$), silicon carbon nitride (SiCN), silicon oxyfluoride (SiOF), hydrogenated silicon oxycarbide (SiCOH), porous SiCOH, or a combination thereof. In some embodiments, the substrate may include two layers, including a first lower layer formed of Si under a second upper layer formed of $SiO_2$, $SiN_x$, SiCN, SiCOH, porous SiCOH, or a mixture thereof.

According to an embodiment of this presentation, at least one of the first and second electrode wires comprises one layer or multiple layers of an elemental metal, a metal alloy, a metal nitride, a metal silicide, a doped semiconductor material, or a mixture thereof. Non-limiting examples of suitable metals may include chromium (Cr), titanium (Ti), cobalt (Co), nickel (Ni), platinum (Pt), palladium (Pd), aluminum (Al), copper (Cu), molybdenum (Mo), tantalum (Ta), or tungsten (W). Non-limiting examples of suitable alloys may include alloys of any of the above metals (for example, TiW). Non-limiting examples of suitable metal nitrides may include nitride compounds of any of the above metals (such as TiN, TaN, and WN). Non-limiting examples of suitable metal silicides may include silicide compounds of any of the above metals (such as $TiSi_2$, $WSi_2$, $MoSi_2$, $TaSi_2$, NiSi, and $CoSi_2$). A non-limiting example of a suitable doped semiconductor material may include doped polysilicon (e.g., polycrystalline silicon).

According to an embodiment of this presentation, one of the first and the second electrode wires comprises a protrusion extending normal to said surface toward the other of the first and second electrode wires in said region of vanadium dioxide.

According to an embodiment of this presentation, said first and second voltage sources are voltage sources arranged to bias the first and second NDR devices close to, but less than their respective Mott insulator-to-metal transition threshold voltages.

According to an embodiment of this presentation, the first load resistor, the first NDR device, the first voltage source and the first grounded capacitor are arranged to form a first relaxation oscillator; and the second load resistor, the second NDR device, the second voltage source and the second grounded capacitor are arranged to form a second relaxation oscillator.

An embodiment of this presentation comprises a neural circuit having at least a neuron circuit as recited above, said neuron circuit having its input node arranged to receive an input stimulus of a voltage or current waveform through an input impedance; and having its output node arranged to provide an output voltage waveform through an output impedance.

An embodiment of this presentation comprises a neural circuit having, connected together, at least one neuron circuit as recited above (with first and second load resistors), where the first and second voltage sources are negative and positive voltage source; and at least one neuron circuit as recited above (with first and second load resistors), where the first and second voltage sources are positive and negative voltage source. An embodiment of this presentation comprises a neural circuit having, connected together, at least one neuron circuit as recited above (with first load capacitor and resistor), where the first and second voltage sources are negative and positive voltage source; and at least one neuron circuit as recited above (with first load capacitor and resistor), where the first and second voltage sources are positive and negative voltage source.

Embodiments of this presentation also relate to a method of fabricating a neuron circuit, comprising: providing first and second NDR devices biased each with opposite polarities, said first and second NDR devices being coupled to first and second grounded capacitors.

According to embodiments of this presentation, the method further comprises: connecting a first node of said first NDR device to an input node of the neuron circuit by a first load resistor; connecting a second node of said first NDR device to a first voltage source; and coupling said first node of said first NDR device to said first grounded capacitor; connecting a first node of said second NDR device to said first node of said first NDR device by a second load resistor; connecting a second node of said second NDR device to a second voltage source; coupling said first node of said second NDR device to said second grounded capacitor; and connecting an output node of the neuron circuit to said first node of said second NDR device.

According to embodiments of this presentation, said first voltage source is a negative voltage source and said second voltage source is a positive voltage source.

According to embodiments of this presentation said first voltage source is a positive voltage source and said second voltage source is a negative voltage source.

According to embodiments of this presentation, at least one of the first and second NDR devices comprises between its first and second nodes a resistance connected in series with a NDR material.

According to embodiments of this presentation, at least one of the first and second NDR devices comprises a vanadium dioxide layer between its first and second nodes.

According to embodiments of this presentation, the method further comprises: connecting a first node of said first NDR device to an input node of the neuron circuit by a first load capacitor; connecting a second node of said first NDR device to a first voltage source; and coupling said first node of said first NDR device to said first grounded capacitor; connecting a first node of said second NDR device to said first node of said first NDR device by a first load resistor; connecting a second node of said second NDR device to a second voltage source; coupling said first node of said second NDR device to said second grounded capacitor; and connecting an output node of the neuron circuit to said first node of said second negative differential resistance device.

According to embodiments of this presentation, said first voltage source is a negative voltage source and said second voltage source is a positive voltage source.

According to embodiments of this presentation, said first voltage source is a positive voltage source and said second voltage source is a negative voltage source.

According to embodiments of this presentation, at least one of the first and second NDR devices comprises between its first and second nodes a resistance connected in series with a NDR material.

According to embodiments of this presentation, at least one of the first and second NDR devices comprises a vanadium dioxide layer between its first and second nodes.

According to embodiments of this presentation the method further comprises a second load resistance in series or in parallel with the first load capacitor.

According to embodiments of this presentation, said first and second voltage sources are voltage sources arranged to bring the first and second NDR devices close to their respective Mott insulator-to-metal transition.

According to embodiments of this presentation, the first load resistor, the first NDR device, the first voltage source and the first grounded capacitor are arranged to form a first relaxation oscillator; and the second load resistor, the second NDR device, the second voltage source and the second grounded capacitor are arranged to form a second relaxation oscillator.

According to embodiments of this presentation, the first load capacitor, the first NDR device, the first voltage source and the first grounded capacitor are arranged to form a first relaxation oscillator; and the first load resistor, the second NDR device, the second voltage source and the second grounded capacitor are arranged to form a second relaxation oscillator.

Embodiments of this presentation also relate to a method of fabricating a neural circuit, the method comprising: providing at least a neuron circuit according to a method as outlined above, said neuron circuit having its input node arranged to receive an input voltage or current waveform through an input impedance; and having its output node arranged to provide an output waveform through an output impedance.

According to embodiments of this presentation, the method of fabricating neural circuits comprises: providing with the methods outlined above at least one neuron circuit (with first and second load resistors) where the first and second voltage sources are negative and positive voltage source; and at least one neuron circuit (with first and second load resistors), where the first and second voltage sources are positive and negative voltage source. According to embodiments of this presentation, the method of fabricating neural circuits comprises: providing with the methods outlined above at least one neuron circuit (with first load capacitor and resistor) where the first and second voltage sources are negative and positive voltage source; and at least one neuron circuit (with first load capacitor and resistor), where the first and second voltage sources are positive and negative voltage source.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 7A illustrates a response of an excitatory neuron circuit as shown in FIG. 3A to a sub-threshold excitatory (positive) voltage pulse of 80 mV.

FIG. 7B illustrates a response of an excitatory neuron circuit as shown in FIG. 3A to a supra-threshold excitatory voltage pulse of 200 mV.

FIG. 7C illustrates a response of an excitatory neuron circuit as shown in FIG. 3A to a supra-threshold inhibitory (negative) voltage pulse of −200 mV.

FIG. 7D illustrates a response of an inhibitory neuron circuit as shown in FIG. 3B to a sub-threshold inhibitory voltage pulse of −80 mV.

FIG. 7E illustrates a response of an inhibitory neuron circuit as shown in FIG. 3B to a supra-threshold inhibitory voltage pulse of −200 mV.

FIG. 7F illustrates a response of an inhibitory neuron circuit as shown in FIG. 3B to a supra-threshold excitatory voltage pulse of 200 mV.

FIGS. 9A, 9C, 9F, 9G, 9H, 9I, 9J, 9L, 9P, 9S, 9T, 9U, 9V, 9W illustrate experimental spiking behaviors observed for tonic neuron circuits according to embodiments of this presentation.

FIGS. 10B, 10D, 10M, 10N, 10F, 10K, 10O, 10Q, 10R illustrate experimental spiking behaviors observed for phasic neuron circuits according to embodiments of this presentation.

FIGS. 11A and 11B illustrate an experimental and a simulated all-or-nothing behavior of a neuron circuit.

FIGS. 14B and 14C illustrate a refractory period behavior of a tonic neuron circuit according to embodiments of this presentation with evidence of relative refractory period.

FIGS. 17BA-17BD illustrate an experimental (17BA) and simulated (17BB) tonic spike frequency adaptation behavior of tonic neuron circuits according to embodiments of this presentation.

FIGS. 21BA-21BB illustrate an experimental (21BA) and simulated (21BB) integrator behavior of tonic neuron circuits according to embodiments of this presentation.

FIG. 26A illustrates a theoretical phasing spiking behavior of a biological neuron.

FIGS. 26BA-26BB illustrate experimental (26BA) and simulated (26BB) phasing spiking behavior of a phasic neuron circuit according to embodiments of this presentation.

FIG. 28B illustrates an experimental accommodation behavior of a phasic neuron circuit as illustrated in FIG. 4A.

FIG. 34B-D illustrates the schematics of a tonic, a phasic and a mixed mode neuron circuit according to this presentation, as well as their compared response to a same current stimulus.

DETAILED DESCRIPTION

In the following description, numerous specific details are set forth to clearly describe various specific embodiments disclosed herein. One skilled in the art, however, will understand that the presently described invention may be practiced without all of the specific details discussed below. In other instances, well known features have not been described so as not to obscure this presentation.

As outlined above, according to embodiments of this presentation, both the excitatory and inhibitory spiking neuron circuits consist of two resistively coupled PA type of relaxation oscillators based on VO2 NDR devices. Depending on its biasing scheme, a VO2 relaxation oscillator according to an embodiment of this presentation can emulate the action of a specific type of voltage-gated nerve cell membrane protein ion channel, such as $K^+$, $Cl-$, and $Na^+$ ion channels. Depending on the topology of a circuit according to an embodiment of this presentation, either a positive or negative action potential can be generated by coordinated actions of a pair of two VO2 relaxation oscillators, each of them acting as a specific type of ion channel. According to an embodiment of this presentation, a PA relaxation oscillator is a dc biased network comprising one passive resistor, one passive capacitor, and one active current-controlled NDR device. The NDR active device is the gain element that enables electrical oscillations and signal amplification. According to an embodiment of this presentation, the NDR device comprises a scalable one-port (two-terminal) metal/VO2/metal nano-crossbar threshold switch. The resistive switching and NDR phenomena in the VO2 material is driven by a Joule-heating induced Mott insulator-to-metal phase transition (see U.S. patent application Ser. No. 15/417, 049). The VO2 NDR threshold switch is locally active in certain operating regimes, and can therefore provide a signal gain in the AC domain, a feature necessary for the spike generation and neural computation.

Figures 2A, 2B:
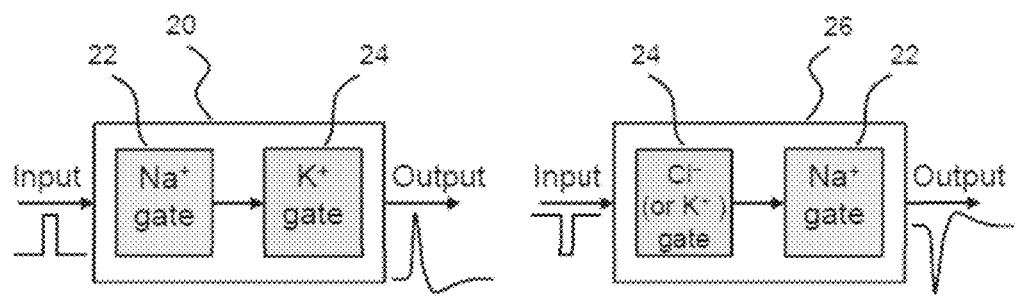
FIG. 2A schematically represents a function block diagram of an excitatory neuron circuit according to an embodiment of this presentation.
FIG. 2B illustrates schematically a function block diagram of an inhibitory neuron circuit according to an embodiment of this presentation.

FIG. 2A illustrates schematically a function block diagram of an excitatory neuron circuit 20 according to an embodiment of this presentation, comprising a negatively biased Na+ gate or channel 22 followed by a positively biased K+ gate or channel 24; and FIG. 2B illustrates schematically a function block diagram of an inhibitory neuron circuit 26 according to an embodiment of this presentation, comprising a positively biased Cl− (or K+) gate or channel 24 followed by a negatively biased Na+ gate or channel 22. According to an embodiment of this presentation, each gate or channel is a PA type of relaxation oscillator, each comprising as detailed hereafter a vanadium dioxide NDR switch (X1 or X2), a capacitor (C1 or C2), and a load resistor (RL1 or RL2). Input and output impedance blocks: Zin and Zout are acting as dendritic or axonal filters.

As detailed hereafter, according to an embodiment of this presentation, circuit 20 generates an amplified positive action potential in response to an excitatory (positive) voltage pulse that is higher than a threshold value. This characteristic resembles the all-or-nothing behavior of a biological neuron. However, when an inhibitory input, e.g. a negative voltage pulse, is fed into the circuit, it does not generate an action potential even if the amplitude of the input is greater than the threshold needed for action potential firing. Similarly, according to an embodiment of this presentation, circuit 26 generates an amplified negative action potential, in response to a negative voltage pulse that is greater than a threshold value; whereas when an excitatory input is fed into the circuit, it does not generate an action potential even if the amplitude of the input is greater than the threshold needed for action potentialfiring.

Figure 3A:
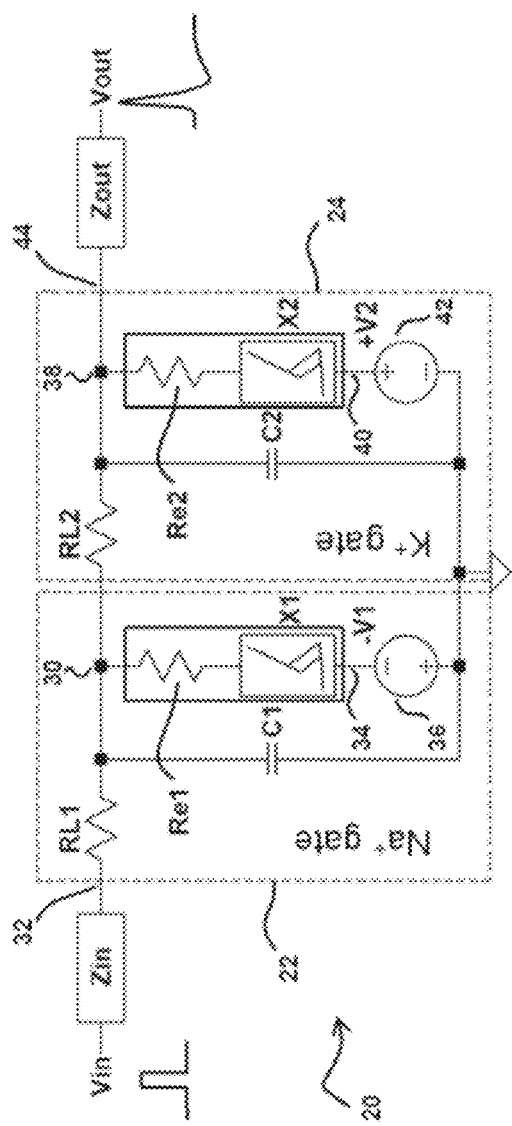
FIG. 3A shows a schematic of an excitatory tonic neuron circuit according to an embodiment of this presentation.

FIG. 3A shows a schematic of an excitatory neuron circuit 20 according to an embodiment of this presentation, comprising first (X1) and second (X2) NDR devices biased each with opposite polarities (−V1; +V2), said first and second NDR devices (X1, X2) being coupled to first and second grounded capacitors (C1, C2).

According to an embodiment of this presentation, said first NDR device (X1) has a first node 30 connected to an input node 32 of the neuron circuit 20 by a first load resistor RL1 and a second node 34 connected to a first voltage source 36; said first node (30) of said first NDR device (X1) being coupled to said first grounded capacitor (C1). According to an embodiment of this presentation, said second NDR device (X2) has a first node 38 connected to said first node 30 of said first NDR device X1 by a second load resistor RL2 and a second node 40 connected to a second voltage source 42; said first node 38 of said second NDR device X2 being coupled to said second grounded capacitor C2; said first node 38 of said second NDR device X2 forming an output node 44 of the neuron circuit 20.

According to an embodiment of this presentation, the first voltage source 36 is a negative voltage source and the second voltage source 42 is a positive voltage source. The voltages −V1, +V2 provided by voltages sources 36 and 42 can have a same amplitude or they can have different amplitudes. According to an embodiment of this presentation, the d.c. voltage supplies are amplitude-matched only if the two NDR devices X1 and X2 are well matched in their switching threshold voltages. If the switching threshold voltages of X1 and X2 are different, then the values of their d.c. voltage supplies have to be chosen differently, so that both NDR devices are biased at the proper operating points (less than, but close to their switching threshold voltage) for the neuron circuit to spike properly.

According to an embodiment of this presentation, the first and second NDR devices X1, X2 can each comprise, between their first (respectively 30, 38) and second (respectively 36, 40) nodes, a resistance (respectively Re1, Re2) in series with an NDR material. According to an embodiment of this presentation, the NDR material of the first and second NDR devices X1, X2 can be a layer or thin film of vanadium dioxide. According to an embodiment of this presentation, Re1 can have a value of a few hundred Ohm and can be the cumulative resistance of a first metal nanowire electrode arranged between the first node (30) and a first side of the NDR material of X1, and of a second metal nanowire electrode arranged between second node (34) and a second side of the NDR material of X1. Similarly, Re2 can have a value of a few hundred Ohm and can be the cumulative resistance of a first metal nanowire electrode arranged between the first node (38) and a first side of the NDR material of X2, and of a second metal nanowire electrode arranged between second node (40) and a second side of the NDR material of X2. According to an embodiment of this presentation, vanadium dioxide layer can generated by electroforming from a vanadium pentoxide layer, as detailed in U.S. application Ser. No. 15/417,049, which is incorporated by reference to this presentation.

Alternatively, the vanadium dioxide layer can be directly prepared by a variety of thin film deposition methods, including but not limited to, reactive d.c. or r.f. magnetron sputtering of vanadium metal or vanadium oxide targets, atomic layer deposition followed by post-deposition anneal, or metallic precursor oxidation.

According to an embodiment of this presentation, the first and second voltage sources (36, 42) are arranged to bring the first and second NDR devices (X1, X2) close to their respective Mott Insulator-to-Metal Transition; and the voltage biases can be adjusted to set desired levels of voltage or current threshold for the neuron action potential generation (spike firing) and desired signal gains. According to an embodiment of this presentation, the first load resistor, the first NDR device, the first voltage source and the first grounded capacitor are arranged to form a first relaxation oscillator; and the second load resistor, the second NDR device, the second voltage source and the second grounded capacitor are arranged to form a second relaxation oscillator.

According to an embodiment of this presentation, the NDR material of the first and second NDR devices X1, X2 can be a layer or thin film of vanadium dioxide, where vanadium dioxide has an Mott insulator-to-metal (IMT) transition temperature TC of 340 K (67° C.). The operation of such vanadium dioxide NDR devices only requires a very moderate Joule heating to raise the local temperature by 40 K (or ° C.) above room temperature. For example, the Inventor has calculated that a NDR device having a vanadium dioxide channel with a 10-nm radius (located for example in a thin film of vanadium pentoxide), has an extremely low estimated switching energy of 1.2 fJ, which is 50 times lower than a NbO2 device such as disclosed in the Pickett et al. document cited above. The Inventor projects that vanadium dioxide based neurons circuits according to embodiments of this presentation are capable to achieve a biologically-competitive 0.1 pJ/spike or less neuron energy use. A single VO2 NDR device can operate as low as 1.2 fJ, but the energy consumption of the complete neuron circuit (X1, X2, C1, C2, RL1, RL2) is dominated by the charging energy of the two capacitors. The 0.1 pJ/spike total energy consumption is estimated assuming exemplary d.c. bias level near 0.5 V and with 40-50 fF capacitors (such a small capacitor value is chosen for neuron size and spike frequency considerations).

According to an embodiment of this presentation, neuron circuit 20 can be used in a neural circuit having a plurality (not shown) of neuron circuits connected in a network (not shown); input node 32 being arranged to receive an input waveform through an input impedance Zin; and output node 44 being arranged to provide an output waveform through an output impedance Zout.

Figure 3B:
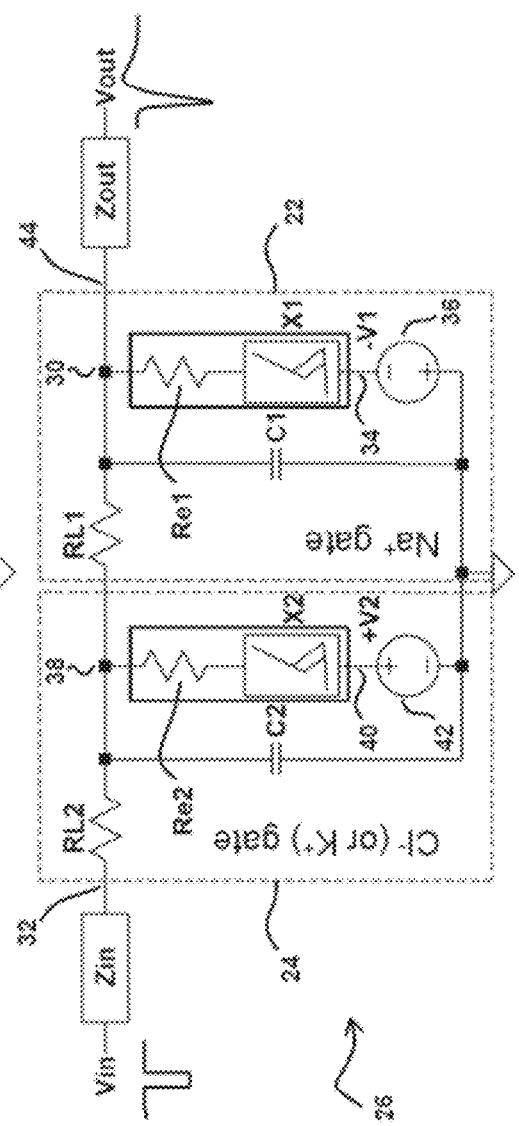
FIG. 3B shows a schematic of an inhibitory tonic neuron circuit according to an embodiment of this presentation.

FIG. 3B shows a schematic of an inhibitory neuron circuit 26 according to an embodiment of this presentation, comprising first (X2) and second (X1) NDR devices biased each with opposite polarities (+V2; −V1), said first and second NDR devices (X2, X1) being coupled to first and second grounded capacitors (C2, C1).

According to an embodiment of this presentation, said first NDR device (X2) has a first node 38 connected to an input node 32 of the neuron circuit 26 by a first load resistor RL2 and a second node 40 connected to a first voltage source 42; said first node 38 of said first NDR device X2 being coupled to said first grounded capacitor C2. According to an embodiment of this presentation, said second NDR device (X1) has a first node 30 connected to said first node 38 of said first NDR device X2 by a second load resistor RL1 and a second node 34 connected to a second voltage source 36; said first node 30 of said second NDR device X1 being coupled to said second grounded capacitor C1; said first node 30 of said second NDR device X1 forming an output node 44 of the neuron circuit 26.

According to an embodiment of this presentation, the first voltage source 42 of neuron circuit 26 is a positive voltage source and the second voltage source 36 is a negative voltage source. The voltages −V1, +V2 provided by voltages sources 36 and 42 can have a same amplitude or they can have different amplitudes.

According to an embodiment of this presentation, the first and second NDR devices X2, X1 can each comprise, between their first (respectively 38, 30) and second (respectively 40, 34) nodes, a resistance (respectively Re2, Re1) in series with an NDR material. According to an embodiment of this presentation, the NDR material of the first and second NDR devices X2, X1 can be a layer or thin film of vanadium dioxide, for example identical to the one detailed previously for neuron circuit 20.

According to an embodiment of this presentation, Re2 can have a value of a few hundred Ohm and can be the cumulative resistance of a first metal nanowire electrode arranged between the first node (38) and a first side of the NDR material of X2, and of a second metal nanowire electrode arranged between second node (40) and a second side of the NDR material of X2. Similarly, Re1 can have a value of a few hundred Ohm and can be the cumulative resistance of a first metal nanowire electrode arranged between the first node (30) and a first side of the NDR material of X1, and of a second metal nanowire electrode arranged between second node (34) and a second side of the NDR material of X1. According to an embodiment of this presentation, vanadium dioxide layer can generated by electroforming from a vanadium pentoxide layer, as detailed in U.S. application Ser. No. 15/417,049, which is incorporated by reference to this presentation.

Alternatively, the vanadium dioxide layer can be directly prepared by a variety of thin film deposition methods, including but not limited to, reactive d.c. or r.f. magnetron sputtering of vanadium metal or vanadium oxide targets, atomic layer deposition followed by post-deposition anneal, or metallic precursor oxidation.

According to an embodiment of this presentation, the first and second voltage sources (42, 36) are arranged to bring the first and second NDR devices (X2, X1) close to their respective Mott Insulator-to-Metal Transition; and the voltage biases can be adjusted to set desired levels of voltage or current threshold for the neuron action potential generation (spike firing) and desired signal gains. According to an embodiment of this presentation, the first load resistor, the first NDR device, the first voltage source and the first grounded capacitor are arranged to form a first relaxation oscillator; and the second load resistor, the second NDR device, the second voltage source and the second grounded capacitor are arranged to form a second relaxation oscillator.

Figure 1A:
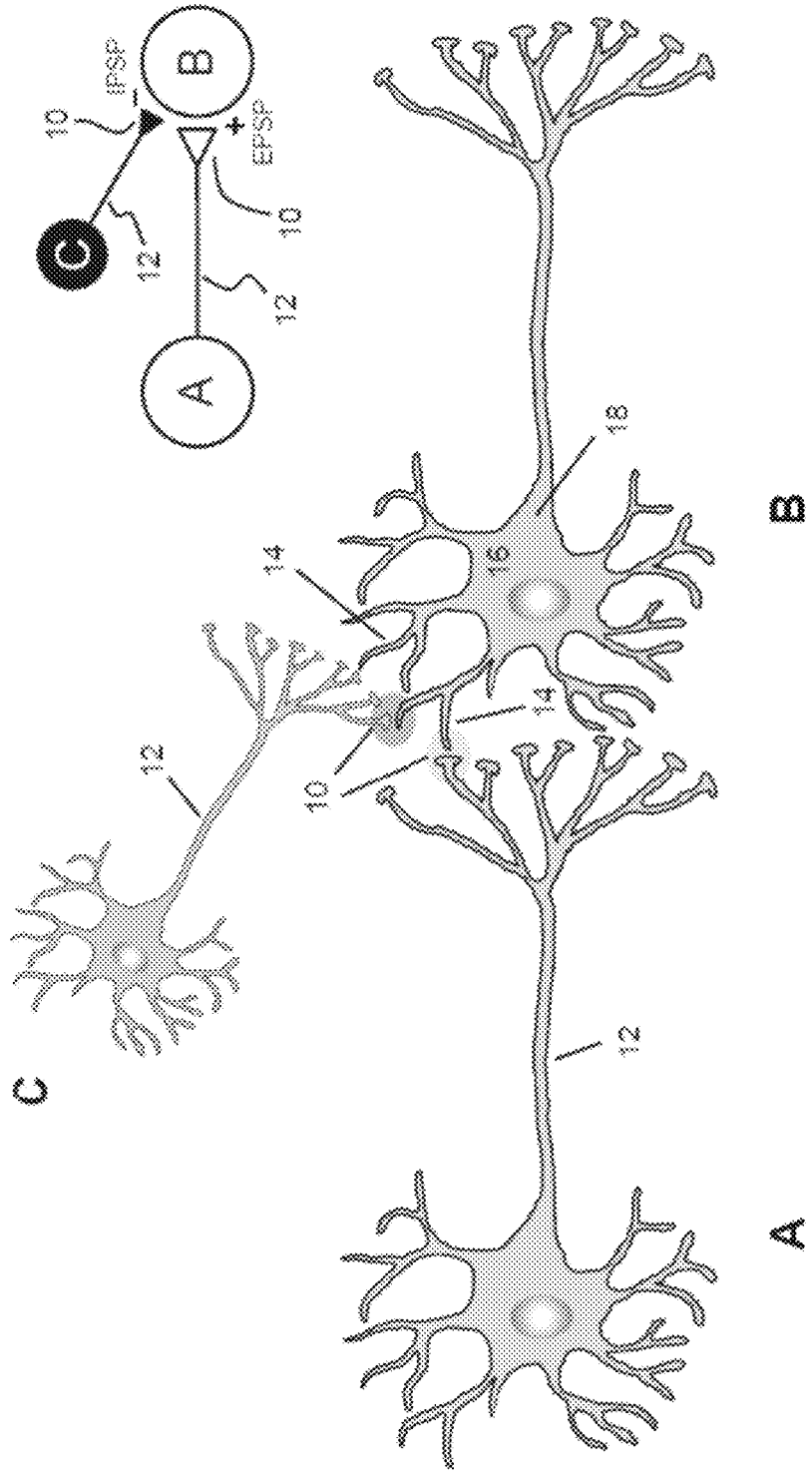
FIG. 1A schematically shows a neural network portion comprising two excitatory neurons and one inhibitory interneuron connected together.
Figure 1B:
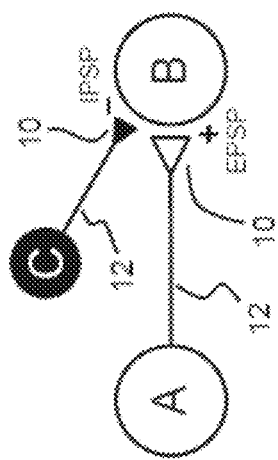
FIG. 1B shows a symbolic representation of the neural network portion of FIG. 1.

According to an embodiment of this presentation, one or more of neuron circuits 20 and 26 can be used in a neural circuit having a plurality (not shown) of neuron circuits connected in a network (not shown); for example as illustrated in FIG. 1B.

The Inventor used Mott IMT physics-based SPICE model of VO2 NDR devices to simulate the excitatory and inhibitory neuron circuits as shown in FIGS. 3A and 3B. In the SPICE model, the VO2 conduction channel is modeled as a cylindrical volume with a radius of 28-56 nm and a length of 50-100 nm. These dimensions are close to experimentally observed values in electroformed VO2 NDR devices (see U.S. patent application Ser. No. 15/417,049) or electroform-free VO2 NDR devices.

It is noted that the excitatory and inhibitory neuron circuits 20, 26 of FIGS. 3A and 3B are both tonic neuron circuits. According to embodiments of this presentation, and as detailed hereafter, tonic neuron circuits 20 and 26 can be made phasic by replacing the input load resistor (RL1 in 20; RL2 in 26) by a capacitor or a capacitor in series with a resistor.

Figure 4A:
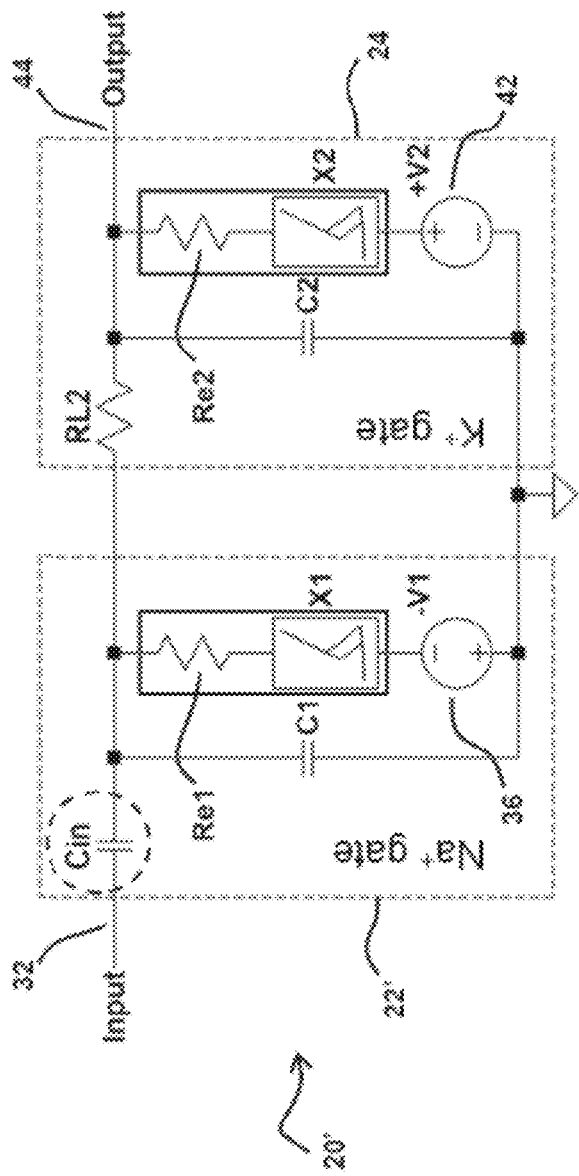
FIG. 4A shows a schematic of an embodiment of an excitatory phasic neuron circuit as shown in FIG. 2A.

FIG. 4A shows a schematic of an excitatory phasic neuron circuit 20' according to an embodiment of this presentation, essentially identical to neuron circuit 20 of FIG. 3A, except that instead of Na+ gate or channel 22, it comprises a Na+ gate or channel 22'. Na+ gate or channel 22' is essentially identical to Na+ gate or channel 22 except that first load resistance RL1 is replaced by a first load capacitor Cin. Capacitor Cin ensures that the phasic neuron only responds to the a.c. component (time derivative) of the input current in 32, but not the d.c. current level as in the case of tonic neurons.

Figure 4B:
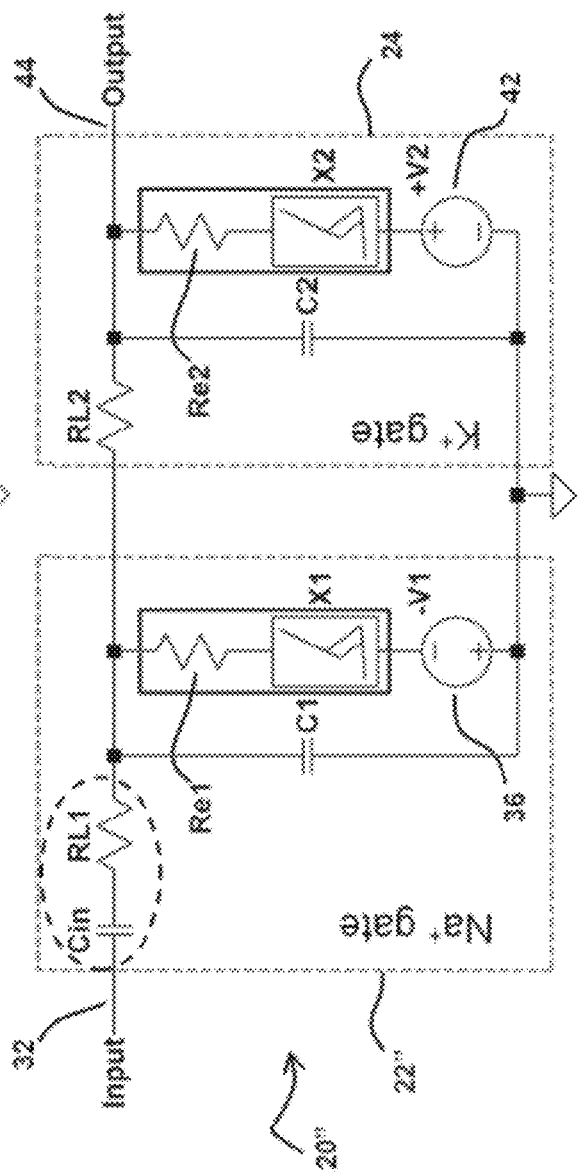
FIG. 4B shows a schematic of another embodiment of an excitatory phasic neuron circuit as shown in FIG. 2A.

FIG. 4B shows a schematic of an excitatory phasic neuron circuit 20" according to an embodiment of this presentation, essentially identical to neuron circuit 20 of FIG. 3A, except that instead of Na+ gate or channel 22, it comprises a Na+ gate or channel 22". Na+ gate or channel 22" is essentially identical to Na$^+$ gate or channel 22 except that a first load capacitor Cin is connected in series with first load resistance RL1. A neuron such as 22" can show the same (e.g. nine as illustrated in FIGS. 10B-10R: phasic spiking, phasic bursting, rebound spike, rebound burst, spike frequency adaptation, resonator, threshold variability, depolarizing after-potential, accommodation) spiking behaviors as would a neuron circuit 22' such as in FIG. 4A, but the operating points are shifted due to the added impedance of RL1.

Figure 5:
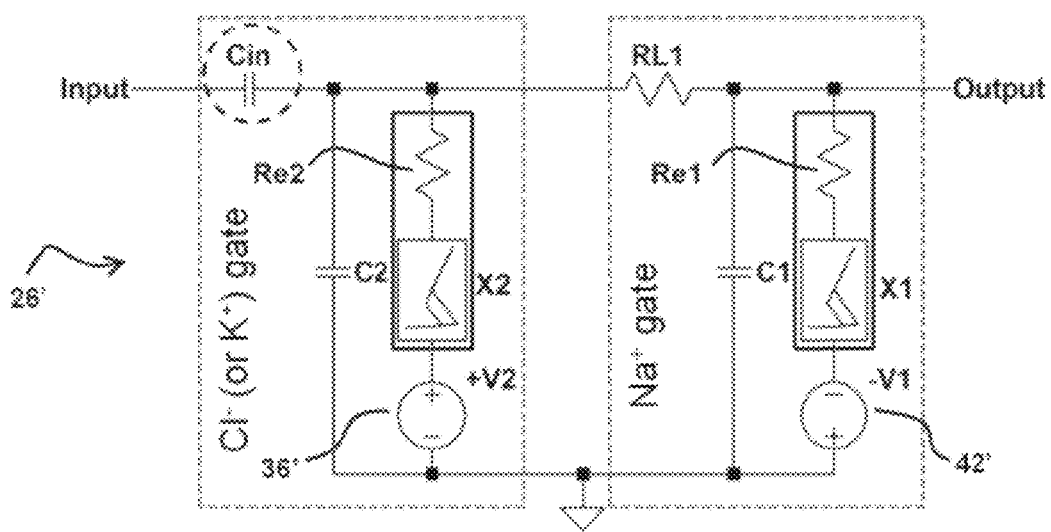
FIG. 5 shows a schematic of an inhibitory phasic neuron circuit according to an embodiment of this presentation.

FIG. 5 shows a schematic of an inhibitory phasic neuron circuit 26' according to an embodiment of this presentation, essentially identical to phasic neuron circuit 20' of FIG. 4A, but with a positive voltage source 36' (+V2) instead of negative voltage source 36 (−V1), and a negative voltage source 42' (−V1) instead of the positive voltage source 42 (+V2). Another way to describe an inhibitory phasic neuron circuit 26' according to an embodiment of this presentation would be that it is identical to a tonic inhibitory neuron 26 as illustrated in FIG. 3B, but with an input capacitor Cin replacing (or alternatively connected in series with) input resistor RL2.

Figure 6A:
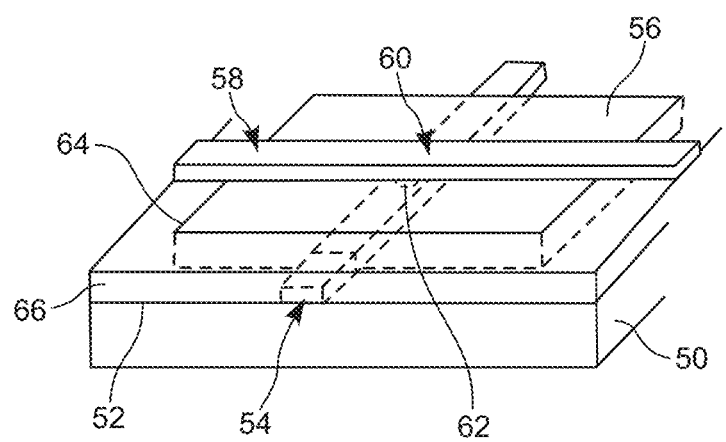
FIG. 6A is an elevation view of an exemplary metal-oxide-metal device structure of a current-controlled NDR threshold switch of the circuits shown in FIG. 3A or 3B.

FIG. 6A is an elevation view of an exemplary metal/oxide/metal device structure of a current-controlled NDR threshold switch or device (X1 or X2) of the neuron circuits (20, 26, 20', 20" or 26') shown in FIGS. 3A, 3B, 4A, 4B, 5.

According to an embodiment of this presentation, the NDR device (X1 or X2) comprises, on a substrate 50 having a surface 52, a first electrode wire 54 extending on said surface 52 along a first direction; a vanadium pentoxide layer 56 extending on and contacting at least a portion of said first electrode 54; a second electrode wire 58 extending over said surface 52 along a second direction, such that the second electrode wire 58 extends on and contacts at least a portion of the vanadium pentoxide layer 56 above the first electrode wire 54 at a crossing point 60; wherein a region of vanadium dioxide 62 is included in said vanadium pentoxide layer 56 between the first 54 and second 58 electrodes at said crossing point 60. According to an embodiment of this presentation, the vanadium pentoxide layer 56 can be disposed within a recess 64 in a dielectric layer 66 formed over said first electrode 54 and at least part of said surface 52 not covered by said electrode 54. According to an embodiment of this presentation, the substrate 50 can comprise a Si substrate covered with a layer of $SiO_2$, $SiN_x$, SiCN, SiCOH or porous SiCOH. According to an embodiment of this presentation, at least one of the first 54 and second 58 electrode wires comprises one layer or multiple layers of Cr, Ti, Co, Ni, Pt, Pd, Al, Cu, Mo, Ta, W, TiW, TiN, TaN, WN, TiSi2, WSi2, MoSi2, TaSi2, NiSi, CoSi2, and doped polysilicon. According to an embodiment of this presentation, at least one of the first and the second electrode wires comprises a protrusion (not shown) extending normal to said surface 52 toward the other of the first and second electrode wires in said region of vanadium dioxide 62.

According to an embodiment of this presentation, region 56 can be no different from dielectric layer 66 instead of being a region of vanadium pentoxide.

Figure 6B:
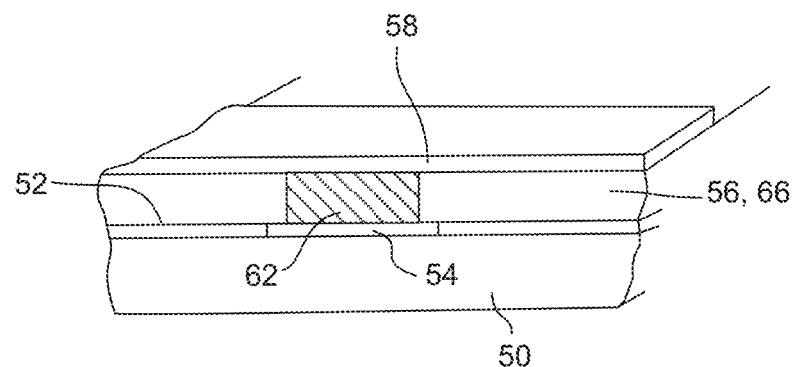
FIG. 6B is a cross-section view of a current-controlled NDR threshold switch such as shown in FIG. 6A.

FIG. 6B is a cross-section view of a current-controlled NDR threshold switch X1, X2 according to an embodiment of this presentation, showing a thin vanadium pentoxide layer 56 (or dielectric 66) covering a portion of first electrode 54 and of surface 52; and second electrode 58 extending on, and contacting, the region of vanadium dioxide 62 above the first electrode wire 54 at a crossing point of the two electrode wires. It is to be noted that the drawings in FIGS. 6A and 6B are not to scale. For example, the metal layers/electrodes (54, 58) can be as thick as, or thicker than, the VO2/dielectric layer (62/56, 66).

At this juncture, it is noted that there exist a number of publications on single vanadium dioxide based relaxation oscillators, including the reference "Metal-insulator transition-induced electrical oscillation in vanadium dioxide thin film", by Y. W. Lee et al., Appl. Phys. Lett. 92, 162903 (2008); the reference "Electrical oscillations induced by the metal-insulator transition in VO2", by H.-T. Kim et al., J. App. Phys. 107, 023702 (2010); the reference "Voltage- and current-activated metal-insulator transition in VO2-based electrical switches: a lifetime operation analysis", by A. Crunteanu, Sci. Technol. Adv. Mater. 11, 065002 (2010); and the reference "Current-induced electrical self-oscillations across out-of-plane threshold switches based on VO2 layers integrated in crossbars geometry", by A. Beaumont et al.,. J. Appl. Phys. 115, 154502 (2014). The three first references above all used lateral metal-VO2-metal device structures with electrodes separated by a few m, thus their switching threshold voltages are very large (10-25 V), and are unsuitable for low-power applications. The fourth reference above reported vertical metal-VO2-metal crossbar devices having a much thinner VO2 layer (130 nm), and demonstrated a threshold voltage as low as 0.8 V. A main drawback of the technology disclosed in this reference, though, was that it used a manufacturing process requiring sapphire substrates and high growth temperatures (~500° C.) and was thus not suitable for CMOS-compatible IC processes.

An embodiment of this presentation relates to an electronic circuit having one-port (two-terminal) passive elements (resistors, capacitors) and one-port locally-active VO2 nano devices that functions as electronic analog of an excitatory neuron, generating an amplified excitatory (positive) action potential (spike) if and only if excitatory (positive) voltage pulse or current inputs beyond certain thresholds are provided.

An embodiment of this presentation relates to an electronic circuit having one-port (two-terminal) passive elements (resistors, capacitors) and one-port locally-active VO2 nano devices that functions as electronic analog of an inhibitory neuron, generating an amplified inhibitory (negative) action potential (spike) if and only if inhibitory (negative) voltage pulse or current inputs beyond certain thresholds are provided.

According to an embodiment of this presentation, the aforementioned circuits are composed of two electrically coupled VO2 relaxation oscillators placed in series along the signal path.

According to an embodiment of this presentation, each of the aforementioned VO2 relaxation oscillator is used to emulate the action of a specific type of voltage-gated membrane protein ion channel in a nerve cell membrane, including K+, Cl−, or Na+ ion channels.

According to an embodiment of this presentation, the electrical coupling of the two VO2 relaxation oscillators can be achieved via a variety of passive first-order or higher-order RC filters, including but not limited to, first-order RC high-pass filter and RC parallel filter, second-order RC parallel filter, band-pass filter, and bridged-tee band stop (notch) filters.

According to an embodiment of this presentation, each of the aforementioned VO2 relaxation oscillator can be composed of a positively or negatively biased (polarized) VO2 nano device placed in parallel with a grounded charge storage capacitor resembling the membrane capacitance, where both the voltage-biased (polarized) VO2 nano device and the grounded membrane capacitor can be connected in series with a load resistor.

According to an embodiment of this presentation, the aforementioned VO2 nano device can be a current-controlled negative-differential-resistance (NDR) device, where the NDR is induced by a Mott insulator-to-metal (IMT) transition at sufficient Joule heating, by supplying a voltage bias across it and passing a current through it.

Such device is locally active within the NDR operating regime, hence it can provide a signal gain in the a.c. domain.

According to an embodiment of this presentation, the voltage biases applied to the VO2 nano devices in the aforementioned VO2 relaxation oscillator is designed to be close to, but not yet reaching the voltage threshold needed to trigger the Mott insulator-to-metal transition. The voltage biases can then be adjusted to set desired levels of voltage or current threshold for the neuron action potential generation (spike firing) and desired signal gains.

According to an embodiment of this presentation, for the aforementioned neuron circuits to function, the load impedance (resistor or capacitor or resistor and capacitor in series or parallel, where appropriate) in each of the two coupled VO2 relaxation oscillators has to be appropriately valued, so that its corresponding load line crosses the VO2 NDR regime in the current-voltage relationship at a single point, thereby an astable multivibrator can be formed when a reactive circuit element (a capacitor) is added in parallel. In other words, one needs to follow the general operating principle for a relaxation oscillator for the neuron circuits to function.

According to an embodiment of this presentation, the aforementioned VO2 nano device is a metal/VO2/metal tri-layer device. VO2 is the active work medium that provides the needed insulator-to-metal transition, mimicking the opening/close of a voltage-gated protein ion channel in the nerve cell membranes.

According to an embodiment of this presentation, in one possible physical implementation, the metal/VO2/metal tri-layer device can be formed by first depositing a set of metal nanowires, then depositing a layer of VO2 thin film, and finalizing the structure by depositing a second set of metal nanowires at an angle to the first set of nanowires. The first and second set of nanowires can be placed at an angle, which can be 90 degree.

According to an embodiment of this presentation, in yet another physical implementation, the metal/VO2/metal tri-layer device can be formed by first depositing a set of metal nanowires and achieve planarized surface after dielectric deposition and chemical mechanical polishing (CMP); then depositing a dielectric layer and etch nanoscale Via holes that open up the first set of metal nanowires; then deposit a layer of VO2 thin film to completely fill the Via holes; then etch off the redundant VO2 thin films deposited on the top surface of the dielectric layer followed by CMP planarization; and finalizing the structure by depositing a second set of metal nanowires at an angle to the first set of nanowires to form a cross-point junction covering the nanoscale Via holes. The first and second set of nanowires can be placed at an angle, which can be 90 degree. Such a metal/VO2/metal tri-layer device could look like the structure illustrated in FIG. 6A, where regions 66 and 64 would belong to a same dielectric layer; the region of vanadium dioxide 62 would be a layer of VO2 thin film that completely fills a Via hole; electrode 54 would be a planarized metal nanowire of the first set and electrode 58 a metal nanowire of the second set. According to an embodiment of this presentation, in yet another physical implementation, the VO2 layer in between the two sets of metal nanowires can be replaced by a layer of an insulating amorphous V2O5 thin film material. A nanocrystalline VO2 conduction channel can then be formed inside the insulating amorphous V2O5 layer at the crossing of the electrode wires by a one-time operation termed electroforming (see U.S. patent application Ser. No. 15/417,049).

According to an embodiment of this presentation, in a variation of the aforementioned physical implementations, the locally-active VO2 nano conduction channel may be directly deposited or electroformed inside nanoscale vias fabricated in a film of dielectric layer 66 commonly used in a semiconductor IC process, such as a film of $SiO_2$, $SiN_x$, SiCN, SiCOH or porous SiCOH; or other appropriate dielectric materials as recited in the present application.

According to an embodiment of this presentation, the VO2 material can be replaced with other types of materials possessing similar heat-driven insulator-to-metal transitions. The material can be a binary, ternary, or more sophisticated oxide compounds, or other materials such as chalcogenides.

Overall, a major benefit of a neuron circuit according to this presentation, as compared to conventional Si CMOS based solutions, comprises the superior device-level performance of vanadium dioxide (VO2) NDR switches, including scalability, switching speed (0.1 to 10 ps), and ultralow power consumption. Si devices are non-stackable, while the VO2 NDR devices are made by deposited films and can be stacked into multiple layers on the same substrate. The scalability of VO2 nano-crossbar devices is effectively $4F^2/N$ (F: half pitch of lithography, N: number of device layers), which cannot be achieved by Si technology. Unlike Si CMOS transistors, the operating energy of a VO2 nano-crossbar device scales down unbounded with lithographic resolution. The Inventor has demonstrated VO2 nano-crossbar devices that operate as low as 0.5V, which is ~40% lower than the best reported result for such devices (see U.S. patent application Ser. No. 15/417,049). The size and power scalabilities of VO2 NDR devices promise a viable path to scale the neuron size and operating energy beyond the limits of Si technology. Moreover, VO2 based relaxation oscillators are considered to have built-in stochasticity and criticality, therefore VO2 artificial neurons are inherently biomimetic.

VO2 is a superior NDR material than NbO2 in power scaling due to its much lower Mott IMT critical temperature at 340K (or 67 C), consequently VO2 devices require a modest local temperature rise of 40 K (or ° C.) to operate. Due to the heat-driven nature of Mott IMT, the threshold Joule heating power to trigger NDR switching is proportional to the volume of the VO2 channel and can be scaled down unbounded with lithography resolution. A VO2 NDR device based artificial neuron will thus have a reduced power consumption that can possibly rival biological levels.

Figure 1C:
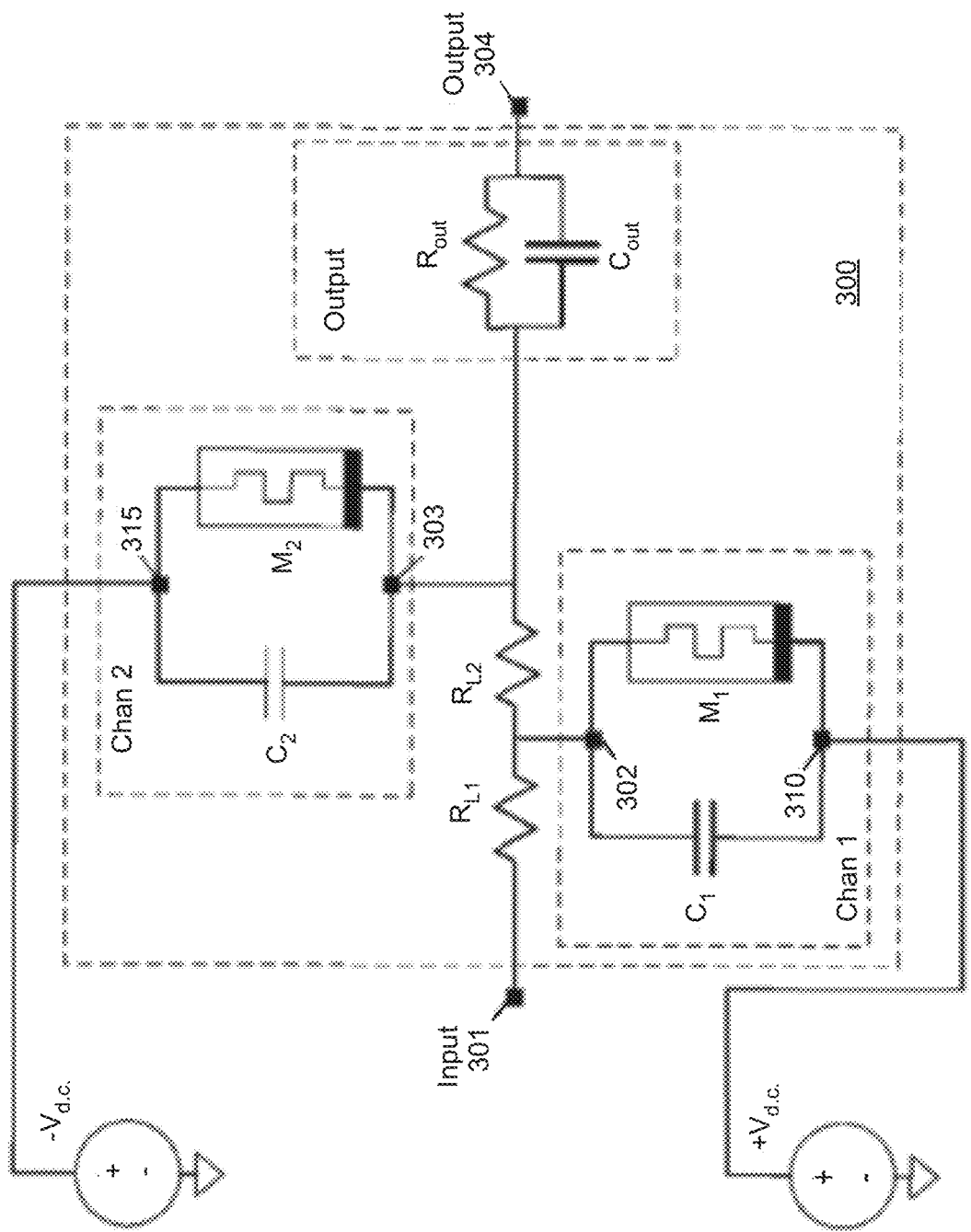
FIG. 1C schematically represents a known neuristor circuit.

There are several important differences that set apart the neuron circuitries according to this presentation from the known neuristors such as shown in FIG. 1C: in the known neuristors the two membrane capacitors are placed in parallel with the NDR devices and are biased by the same d.c. voltage source. In a biologically-plausible Hodgkin-Huxley (HH) neuron model, the membrane capacitor is grounded. In a neuron circuit according to this presentation, the two membrane capacitors are grounded instead of biased, in consistency with the original HH neuron model. The benefits of grounding the membrane capacitors include that the voltage across the capacitors becomes the actual cell membrane potential, and unbiased capacitors are more flexible in IC design. The design flexibility is based on the fact that the current across the capacitors is determined by the time derivative of voltage across it instead of absolute values. Further, in the known neuristors, only one type of RC parallel filter is used as the impedance blocks along the signal path. According to an embodiment of this presentation, a variety of passive first-order or higher-order RC filters can be used as Zin, Zout; including but not limited to, first-order RC high-pass filter and RC parallel filter, second-order RC parallel filter, band-pass filter, and bridged-tee band stop (notch) filters. In the known neuristors, there was no purposeful circuit design and demonstration of a phasic spiking neuron with Class 3 excitability, and there was no purposeful circuit design and demonstration for an inhibitive neuron that fires amplified negative spikes in response to a supra-threshold inhibitive stimuli.

This presentation will now discuss the functionalities and spiking dynamics/behaviors of neuron circuits such as illustrated in FIGS. 3, 4, 5.

FIG. 7A illustrates a SPICE model simulated response of an excitatory neuron circuit 20 as shown in FIG. 3A, to a sub-threshold excitatory (positive) voltage pulse of 80 mV.

FIG. 7B illustrates a SPICE model simulated response of an excitatory neuron circuit 20 as shown in FIG. 3A to a supra-threshold excitatory voltage pulse of 200 mV.

FIG. 7C illustrates a SPICE model simulated response of an excitatory neuron circuit 20 as shown in FIG. 3A to a supra-threshold inhibitory (negative) voltage pulse of −200 mV.

FIG. 7D illustrates a SPICE model simulated response of an inhibitory neuron circuit 26 as shown in FIG. 3B to a sub-threshold inhibitory voltage pulse of −80 mV.

FIG. 7E illustrates a SPICE model simulated response of an inhibitory neuron circuit 26 as shown in FIG. 3B to a supra-threshold inhibitory voltage pulse of −200 mV.

FIG. 7F illustrates a SPICE model simulated response of an inhibitory neuron circuit 26 as shown in FIG. 3B to a supra-threshold excitatory voltage pulse of 200 mV.

As shown in FIG. 7A-7C, SPICE model simulations of the excitatory neuron (the circuit 20 shown in FIG. 3A), using Mott physics-based model of vanadium dioxide NDR switches, showed that such a circuit responds to an excitatory input, e.g. a positive voltage pulse, and generates an amplified positive action potential, if the input is higher than certain threshold value. This behavior resembles the all-or-nothing firing behavior of a biological neuron. Further, when an inhibitory input, e.g. a negative voltage pulse, is fed into the circuit, it does not generate an action potential even if the amplitude of the input is greater than the threshold needed for action potential firing. As shown in FIG. 7D-7F, SPICE model simulations of an inhibitory neuron (the circuit 26 shown in FIG. 3B), using Mott physics-based model of vanadium dioxide NDR switches, showed that such a circuit does not respond to an excitatory input, e.g. a positive voltage pulse, even if the amplitude of the input is greater than the firing threshold. Further, when an inhibitory supra-threshold input, e.g. a negative voltage pulse, is fed into the circuit, it generates an amplified negative action potential, which has similar shape as an excitatory action potential, but with opposite polarity.

The Inventor also performed Mott physics-based SPICE model simulations at various settings of the passive R and C components and input stimuli (voltage pulse or current clamp) to reveal biologically-plausible spike action potential generations for the proposed neuron circuitries.

Figure 8:
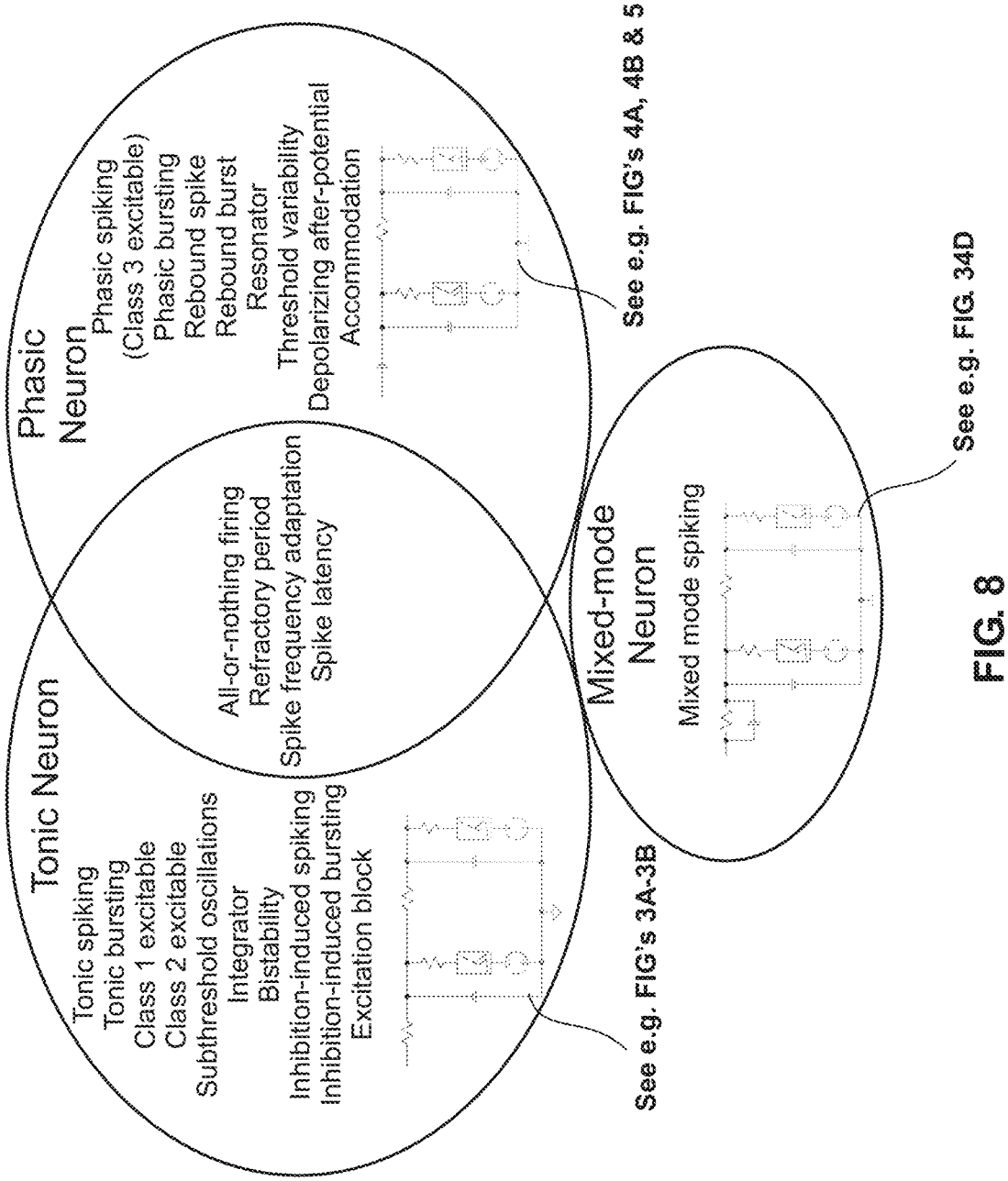
FIG. 8 is a chart summarizing the listed spiking behaviors experimentally demonstrated by neuron circuits according to embodiments of this presentation.

FIG. 8 is a chart illustrating firing modes or behaviors that excitatory neurons according to embodiments of this presentation were experimentally demonstrated to have. As shown in FIG. 8, and as detailed hereafter, tonic excitatory neurons such as illustrated in FIG. 3A were demonstrated to have Tonic Spiking behavior, Tonic Bursting behavior, Class 1 Excitable behavior, Class 2 Excitable behavior, Subthreshold Oscillations behavior, Integrator behavior, Bistability behavior, Inhibition-induced Spiking behavior, Inhibition-induced Bursting behavior, Excitation Block behavior, All-or-nothing behavior, Refractory Period behavior, Spike Frequency Adaptation behavior, and Spike Latency behavior. The last four behaviors are common properties shared with phasic excitatory neurons.

As also shown in FIG. 8, and as detailed hereafter, phasic excitatory neurons such as illustrated in FIG. 4A or 4B were demonstrated to Phasic Spiking (Class 3 Excitable) behavior, Phasic Bursting behavior, Rebound Spike behavior, Rebound Burst behavior, Resonator behavior, Threshold Variability behavior, Depolarizing After-Potential behavior, Accommodation behavior, All-or-nothing behavior, Refractory Period behavior, Spike frequency Adaptation behavior, and Spike Latency behavior. The last four behaviors are common properties shared with tonic excitatory neurons.

FIG. 8 also illustrates that mixed-mode neurons circuits can be made according to this presentation, as detailed hereafter in relation with FIGS. 34A-D.

FIGS. 9A-9W illustrate experimentally observed spiking behaviors for excitatory tonic neuron circuits according to embodiments of this presentation. FIG. 9A illustrates a tonic spiking behavior such as detailed hereafter in FIGS. 15A-B. FIG. 9C illustrates a tonic bursting behavior such as detailed hereafter in FIGS. 16A-D. FIG. 9F illustrates a spike frequency adaptation behavior such as detailed hereafter in FIGS. 17A-B. FIG. 9G illustrates a class 1 excitable behavior such as detailed hereafter in FIGS. 18A-B. FIG. 9H illustrates a class 2 excitable behavior such as detailed hereafter in FIGS. 18A-B. FIG. 9I illustrates a spike latency behavior such as detailed hereafter in FIGS. 19A-B. FIG. 9J illustrates a subthreshold oscillations behavior such as detailed hereafter in FIGS. 20A-B. FIG. 9L illustrates an integrator behavior such as detailed hereafter in FIGS. 21A-B. FIG. 9P illustrates a bistability behavior as detailed hereafter in FIGS. 22A-B; FIG. 9S illustrates an inhibition-induced spiking behavior such as detailed hereafter in FIGS. 23A-B. FIG. 9T illustrates an inhibition-induced bursting behavior such as detailed hereafter in FIGS. 24A-B. FIG. 9U illustrates an all-or-nothing behavior such as detailed hereafter in FIGS. 11A-B. FIG. 9V illustrates a refractory period behavior such as detailed hereafter in FIGS. 12A-B, 13 and 14A-B-C. FIG. 9W illustrates an excitatory block behavior such as detailed hereafter in FIGS. 25A-B.

Polarity-inverted mirror behaviors would be observed for inhibitory tonic neuron circuits according to embodiments of this presentation.

FIGS. 10B-10R illustrate spiking behaviors observed for phasic neuron circuits according to embodiments of this presentation. FIG. 10B illustrates a phasic spiking behavior such as detailed hereafter in FIGS. 26A-B. FIG. 10D illustrates a phasic bursting behavior such as detailed hereafter in FIGS. 27A-B. FIG. 10M illustrates a rebound spike behavior such as detailed hereafter in FIGS. 29A-D. FIG. 10N illustrates a rebound burst behavior such as detailed hereafter in FIGS. 30A-B. FIG. 10F illustrates a spike frequency adaptation behavior such as detailed hereafter in FIGS. 17CA-17CD. FIG. 10O illustrates a threshold variability behavior such as detailed hereafter in FIGS. 31A-B. FIG. 10Q illustrates a Depolarization After-Potential behavior such as detailed hereafter in FIGS. 33A-B. FIG. 10R illustrates an accommodation behavior such as detailed hereafter in FIGS. 28A-C.

Polarity-inverted mirror behaviors would be observed for inhibitory phasic neuron circuits according to embodiments of this presentation.

FIGS. 11A and 11B illustrate an all-or-nothing behavior of a neuron circuit. It is noted that all-or-nothing behavior is a behavior common to both tonic and phasic neurons. The measurement and simulation illustrated in FIGS. 11A and 11B were made with respect to a tonic neuron circuit according to an embodiment of the presentation, but they could also have been made with respect to a phasic neuron circuit according to an embodiment of the presentation. The all-or-none law is a principle that the strength by which a nerve or muscle fiber responds to a stimulus is independent of the strength of the stimulus. If that stimulus exceeds the threshold potential, the nerve or muscle fiber will give a complete response; otherwise, there is no response.

Figures 12A, 12B:
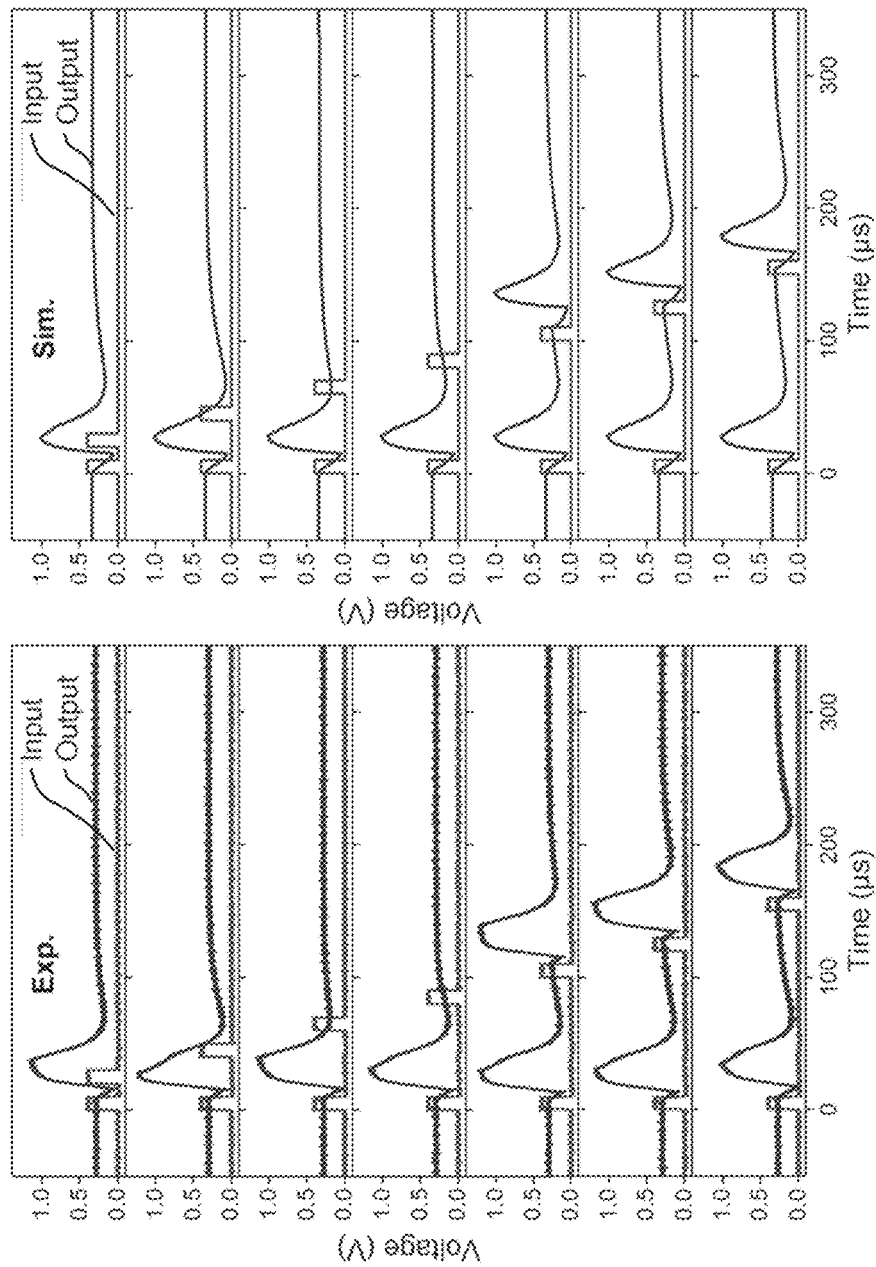
FIGS. 12A and 12B illustrate experimental and simulated refractory period behaviors of tonic neuron circuits according to embodiments of this presentation.

FIGS. 11A-11B illustrate that a neuron according to an embodiment of this presentation does not react to the first two sub-threshold input stimuli, but fires two spikes in response to the $3^{rd}$ and $4^{th}$ supra-threshold input stimuli. The two spikes have nearly the same shape and amplitude irrespective of the input strength. The data illustrated in FIGS. 11A-11B was measured for a neuron circuit according to an embodiment of this presentation, having the following characteristics and with the following stimuli:

Lot ID: 29E, Wafer ID: L29E-3
VO2 device ID: X1=5251-13, X2=5251-9
RL1=RL2=6 kΩ
C1=C2=2 nF (plus stray capacitance ~ 1 nF for each)
V1=−1.35 V, V2=1.35 V
Input voltage pulse width=10 μs
Sub-threshold Inputs: 0.1 V, 0.15 V
Supra-threshold Inputs: 0.25 V, 0.4 V FIGS. 12A and 12B illustrate experimentally observed (12A) and simulated (12B) refractory period behavior of tonic neuron circuits according to embodiments of this presentation. As detailed hereafter, in a neuron each action potential is followed by a refractory period, which can be divided into an absolute refractory period, during which it is impossible to evoke another action potential, followed by a relative refractory period during which a stronger-than-usual stimulus is required to trigger a firing of the neuron. (see for example [1] Purves, D; Augustine, GJ; Fitzpatrick, D; Hall, WC; Lamantia, A-S; McNamara, JO; White, LE (2008). Neuroscience (4th ed.). Sunderland, MA: Sinauer Associates. p. 49; or [2] Stevens, CF (1966). Neurophysiology: A Primer. New York: John Wiley and Sons. pp. 19-20; or [3] Bullock, TH; Orkand, R; Grinnell, A (1977). Introduction to Nervous Systems. A series of books in biology. San Francisco: W. H. Freeman. p. 151; or [4] Junge, D (1981). Nerve and Muscle Excitation (2nd ed.). Sunderland, Mass.: Sinauer Associates. pp. 4-5. [00198]. These two refractory periods (absolute and relative) are caused by changes in the state of sodium and potassium channels. When closing after an action potential, sodium channels enter an "inactivated" state, in which they cannot be made to open regardless of the membrane potential-this gives rise to the absolute refractory period. Even after a sufficient number of sodium channels have transitioned back to their resting state, it frequently happens that a fraction of potassium channels remains open, making it difficult for the membrane potential to depolarize, and thereby giving rise to the relative refractory period. Because the density and subtypes of potassium channels may differ greatly between different types of neurons, the duration of the relative refractory period is highly variable.

The absolute refractory period is largely responsible for the unidirectional propagation of action potentials along axons (see Purves, D; Augustine, GJ; Fitzpatrick, D; Hall, WC; Lamantia, A-S; McNamara, JO; White, LE (2008). Neuroscience (4th ed.). Sunderland, MA: Sinauer Associates. p. 56). At any given moment, the patch of axon behind the actively spiking part is refractory, but the patch in front, not having been activated recently, is capable of being stimulated by the depolarization from the action potential.

Figure 13:
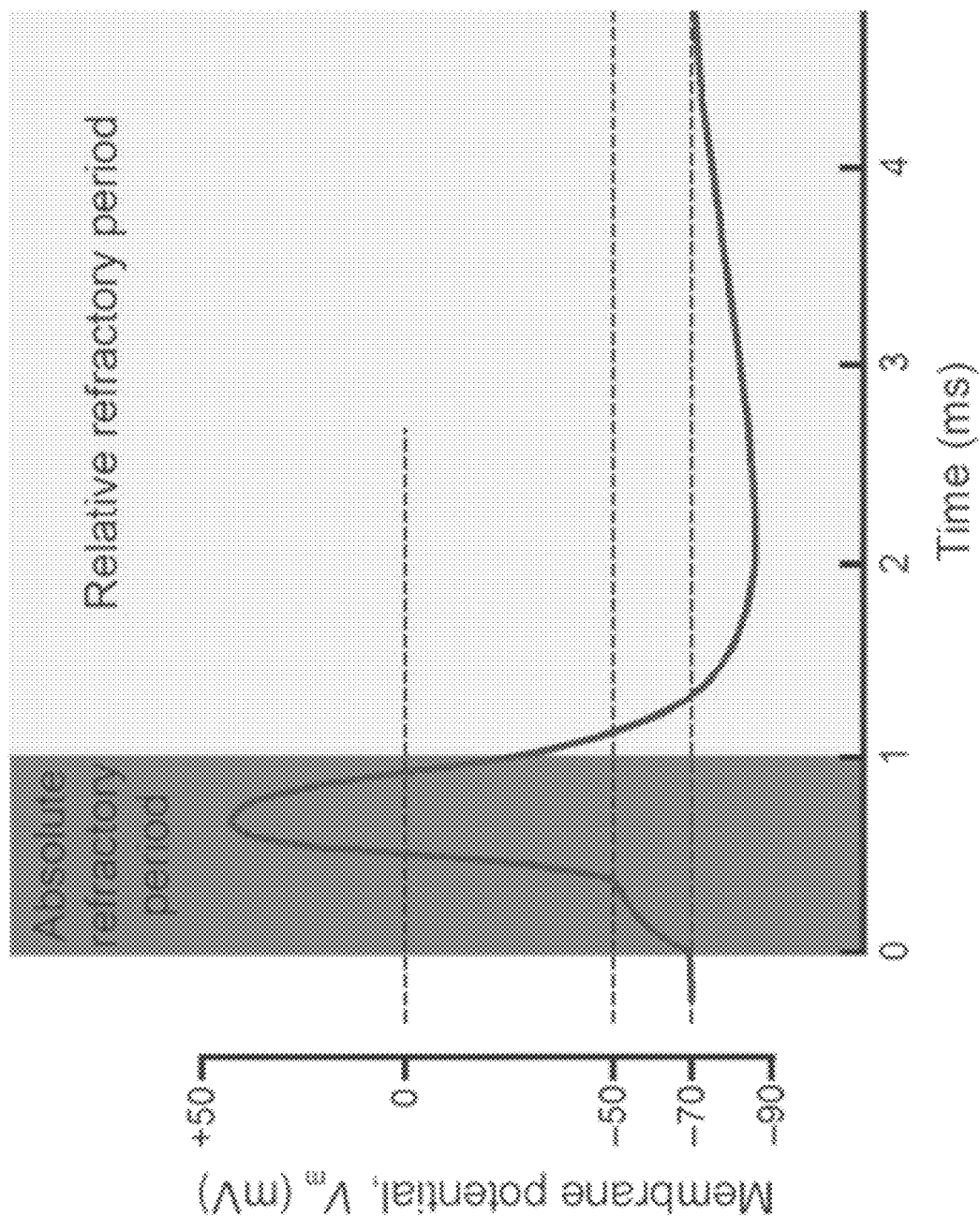
FIG. 13 illustrates a refractory period behavior of a biological neuron.

The data illustrated in FIGS. 12A and 12B was measured for a neuron circuit according to an embodiment of this presentation, having the following characteristics and with the following stimuli:
Lot ID: 29E, Wafer ID: L29E-3
VO2 device ID: X1=5050-15, X2=5050-7
RL1=RL2=5 kΩ
C1=C2=5 nF (plus stray capacitance ~1 nF for each)
V1=−1.6 V, V2=1.6 V
Dual voltage input pulses
Input voltage pulse width=10 μs
Pulse Period (from top to bottom):
20 μs, 40 μs, 60 μs, 80 μs, 100 μs, 120 μs, 150 μs FIG. 13 illustrates a refractory period behavior of a neuron. A figure such as FIG. 13 can be found at: http://www.physioloyweb.com/lecture notes/ . . . . . . neuronal_action_potential/neuronal_action_potential_refractory_periods.html. Each action potential is followed by a refractory period, which can be divided into an absolute refractory period, during which it is impossible to evoke another action potential, and then a relative refractory period, during which a stronger-than-usual stimulus is required (see "Purves, D; Augustine, GJ; Fitzpatrick, D; Hall, WC; Lamantia, A-S; McNamara, JO; White, LE (2008). Neuroscience (4th ed.). Sunderland, MA: Sinauer Associates. p. 49 and p. 56"; "Stevens, CF (1966). Neurophysiology: A Primer. New York: John Wiley and Sons. pp. 19-20"; "Bullock, TH; Orkand, R; Grinnell, A (1977). Introduction to Nervous Systems. A series of books in biology. San Francisco: W. H. Freeman. p. 151"; "Junge, D (1981). Nerve and Muscle Excitation (2nd ed.). Sunderland, Mass.: Sinauer Associates. pp. 4-5").

These two refractory periods are caused by changes in the state of sodium and potassium channel molecules. When closing after an action potential, sodium channels enter an "inactivated" state, in which they cannot be made to open regardless of the membrane potential-this gives rise to the absolute refractory period. Even after a sufficient number of sodium channels have transitioned back to their resting state, it frequently happens that a fraction of potassium channels remains open, making it difficult for the membrane potential to depolarize, and thereby giving rise to the relative refractory period. Because the density and subtypes of potassium channels may differ greatly between different types of neurons, the duration of the relative refractory period is highly variable. The absolute refractory period is largely responsible for the unidirectional propagation of action potentials along axons. At any given moment, the patch of axon behind the actively spiking part is refractory, but the patch in front, not having been activated recently, is capable of being stimulated by the depolarization from the action potential.

Figure 14A:
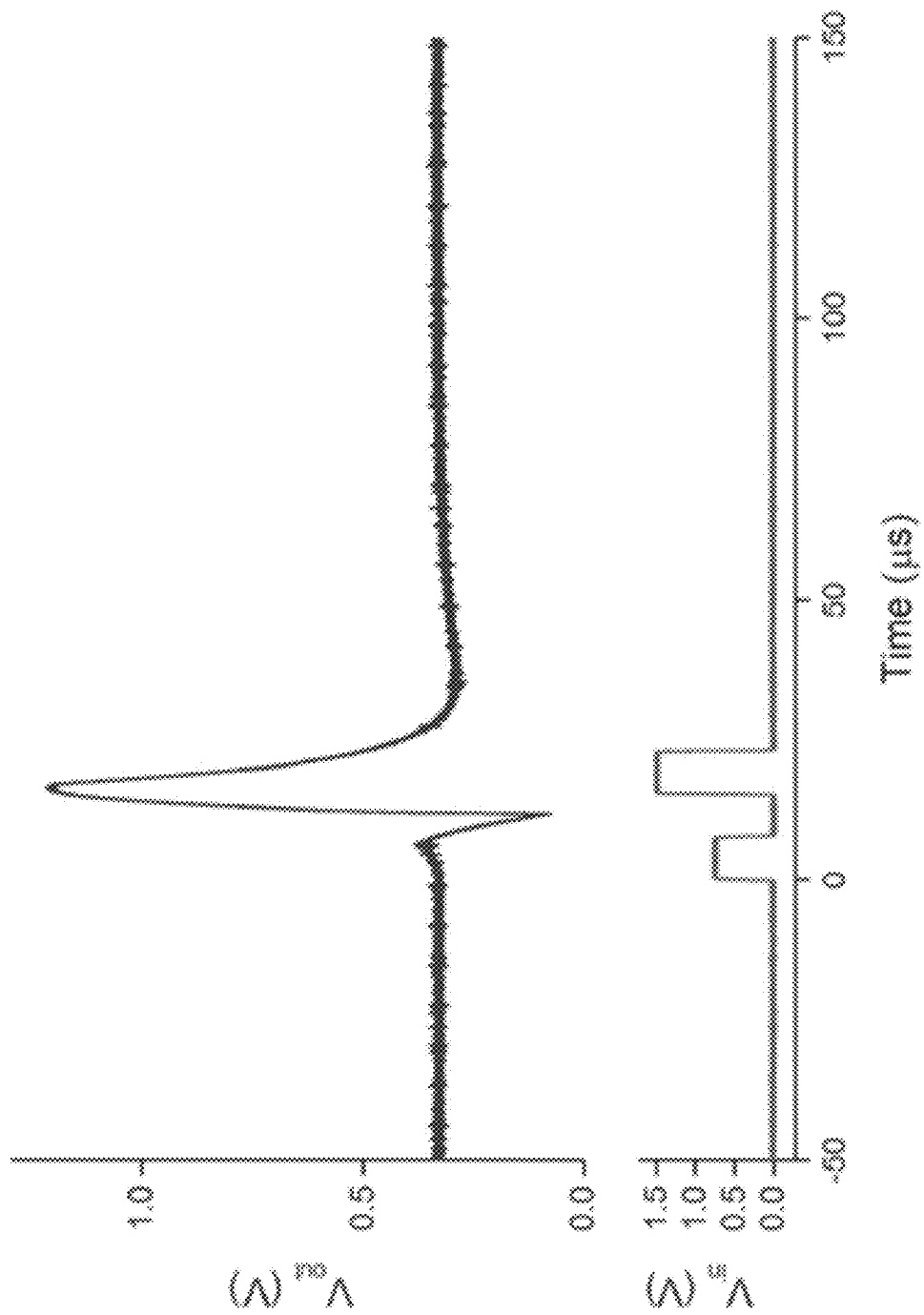
FIG. 14A illustrates a refractory period behavior of a tonic neuron circuit according to embodiments of this presentation with evidence of absolute refractory period.

FIG. 14A illustrates a refractory period behavior of a tonic neuron circuit according to embodiments of this presentation with evidence of absolute refractory period. The data illustrated in FIGS. 14A-C was measured for a neuron circuit 20 having the following characteristics and with the following stimuli:
VO2 device ID: X1=5352-1, X2=5252-13
RL1=RL2=6 kΩ
C1=4 nF, C2=1 nF (plus stray capacitance ~1 nF for each)
V1=−1.45 V, V2=1.45 V
Dual voltage input pulses
Pulse width=8 μs
Pulse 1 height=0.75 V
Pulse 2 height=1.5 V
Pulse Period: 15 μs As illustrated in FIG. 14A, if a $2^{nd}$ voltage input pulse is applied within the absolute refractory period, however strong it is (in the example illustrated, the amplitude is 1.5 V, two times as large as the first pulse), the neuron does not produce a $2^{nd}$ action potential.

FIGS. 14B and 14C illustrate a refractory period behavior of a tonic neuron circuit according to embodiments of this presentation with evidence of relative refractory period. As illustrated in FIG. 14B, if a $2^{nd}$ voltage input pulse applied within the relative refractory period, which has the same strength as a first triggering input pulse (0.75V illustrated), the neuron does not produce a $2^{nd}$ action potential. As illustrated in FIG. 14C, if a $2^{nd}$ voltage input pulse applied within the relative refractory period is much stronger (1.5V illustrated) than the first input pulse (0.75V illustrated), the neuron does produce a $2^{nd}$ actionpotential.

Figure 15A:
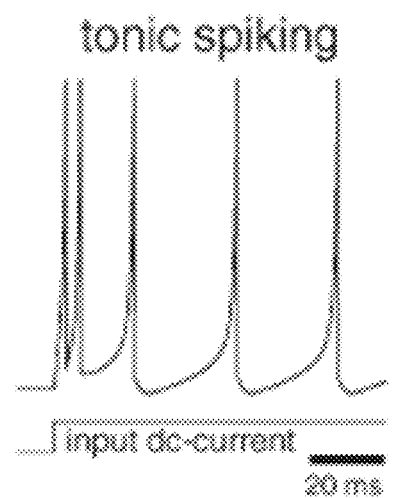
FIG. 15A illustrates a theoretical tonic spiking behavior of a biological neuron.

FIG. 15A illustrates a theoretical tonic spiking behavior of a biological neuron (see E. M. Izhikevich, "Which model to use for cortical spiking neurons?", IEEE Trans. Neural Netw. 15, 1063 (2004). DOI: 10.1109/TNN.2004.832719).

Most neurons are excitable, that is they are quiescent but can fire spikes when stimulated. To test this property, neurophysiologists inject pulses of d.c. current via an electrode attached to the neuron and record its membrane potential. The input current and the neuronal response are usually plotted one beneath the other, as shown hereafter in FIGS. 15BA-15BD. While the input is on, the neuron continues to fire a train of spikes. This kind of behavior, called tonic spiking, can be observed in three types of cortical neurons: regular spiking (RS) excitatory neurons, low-threshold spiking (LTS), and fast spiking (FS) inhibitory neurons (see E. M. Izhikevich, "Which model to use for cortical spiking neurons?" IEEE Trans. Neutral Newt. 15, 1063 (2004). DOI: 10.1109/TNN.2004.832719). Continuous firing of such neurons indicate that there is a persistent input.

Figure 15B:
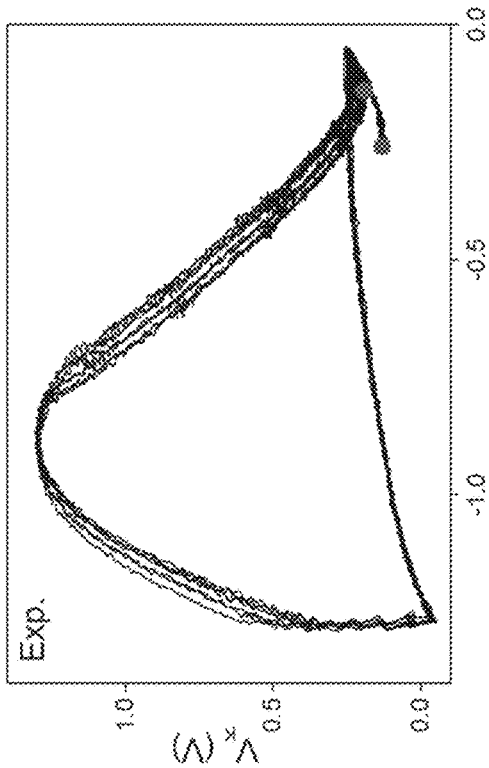
FIGS. 15BA-15BD illustrate an experimental (FIG. 15BA) and a simulated (FIG. 15BB) tonic spiking behavior of tonic neuron circuits according to embodiments of this presentation.
Figure 15B:
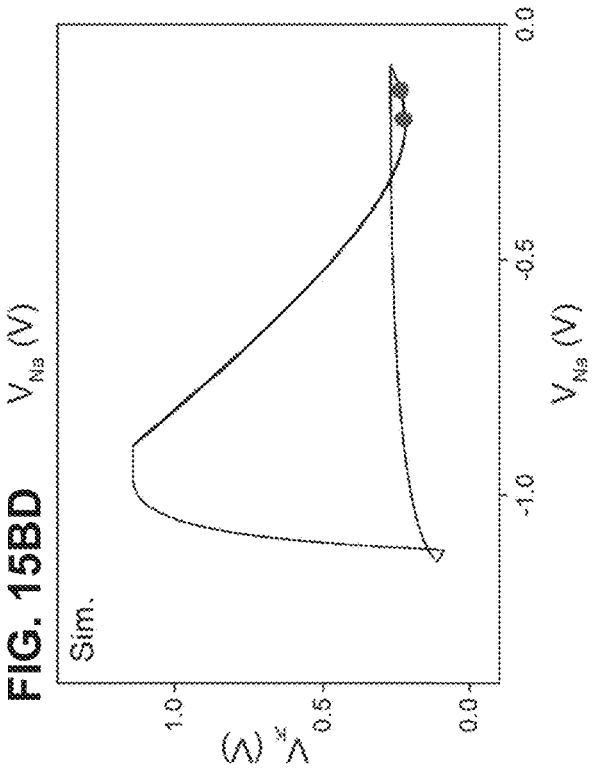
Figure 15B:
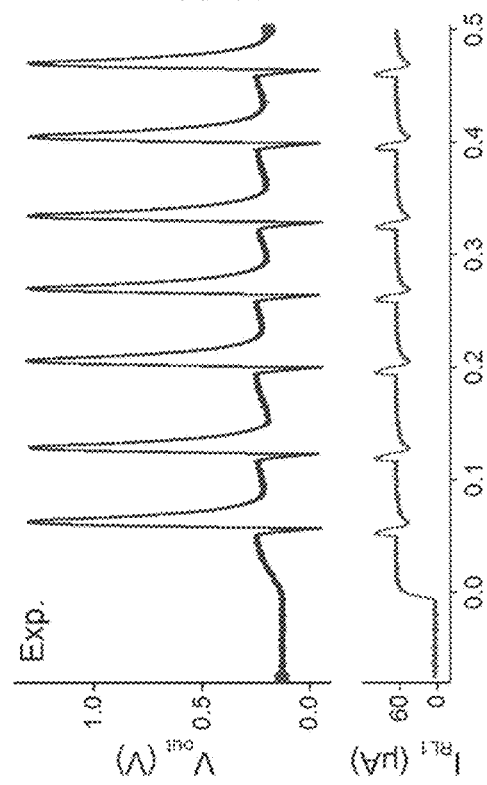
Figure 15B:
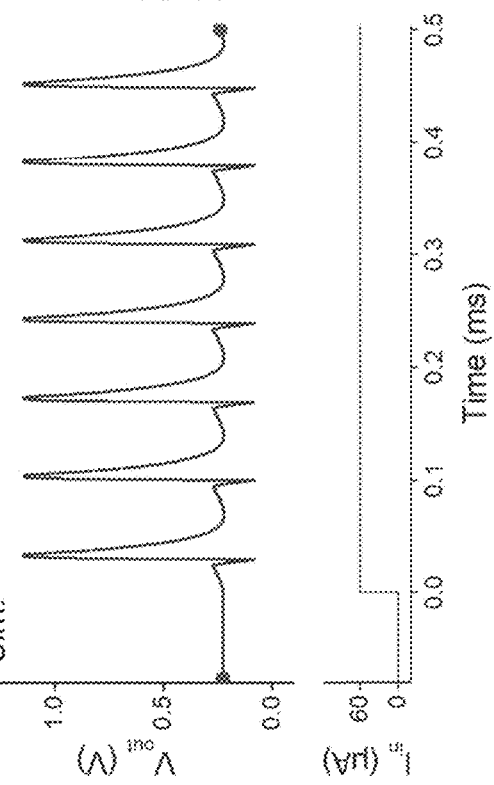

FIGS. 15BA-BD illustrate an experimental (15BA, 15BC) and simulated (15BB, 15BD) tonic spiking behavior of tonic excitatory neuron circuits according to embodiments of this presentation. The data illustrated in FIGS. 15BA-15BD was measured for a neuron circuit according to an embodiment of this presentation, having the following characteristics and with the following stimuli:
Lot ID: 29E, Wafer ID: L29E-3
VO2 device ID: X1=5151-7, X2=5151-3
RL1=RL2=5 kΩ
C1=5 nF C2=2 nF (plus stray capacitance ~1 nF for each)
V1=−1.5 V, V2=1.5 V Current clamp input is converted from a voltage square pulse using a stimulation isolator with a gain of 0.1 mA/V. It is noted that although the input current is a square wave (remains constant after the onset), the monitored current flowing through RL1 shows "glitches" caused by the back action of spikes toward RL1.

Figure 16A:
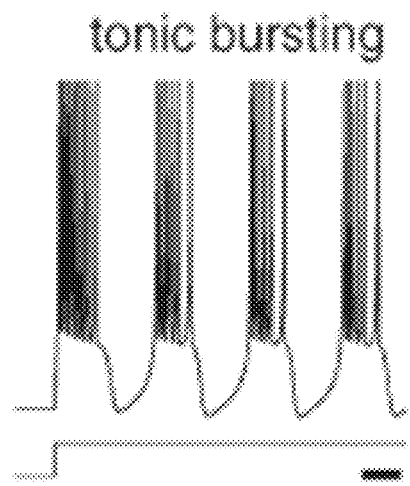
FIG. 16A illustrates a theoretical tonic bursting behavior of a biological neuron.

FIG. 16A illustrates a theoretical tonic bursting behavior of a biological neuron. Some neurons, such as the chattering neurons in cat neocortex (see E. M. Izhikevich, "Which model to use for cortical spiking neurons?" IEEE Trans. Neutral Newt. 15, 1063 (2004). DOI: 10.1109/TNN.2004.832719) fire periodic bursts of spikes when stimulated, as illustrated in FIG. 16A.

The interburst (i.e. between bursts) frequency may be as high as 50 Hz, and it is believed that such neurons contribute to the gamma-frequency oscillations in the brain.

Figure 16B:
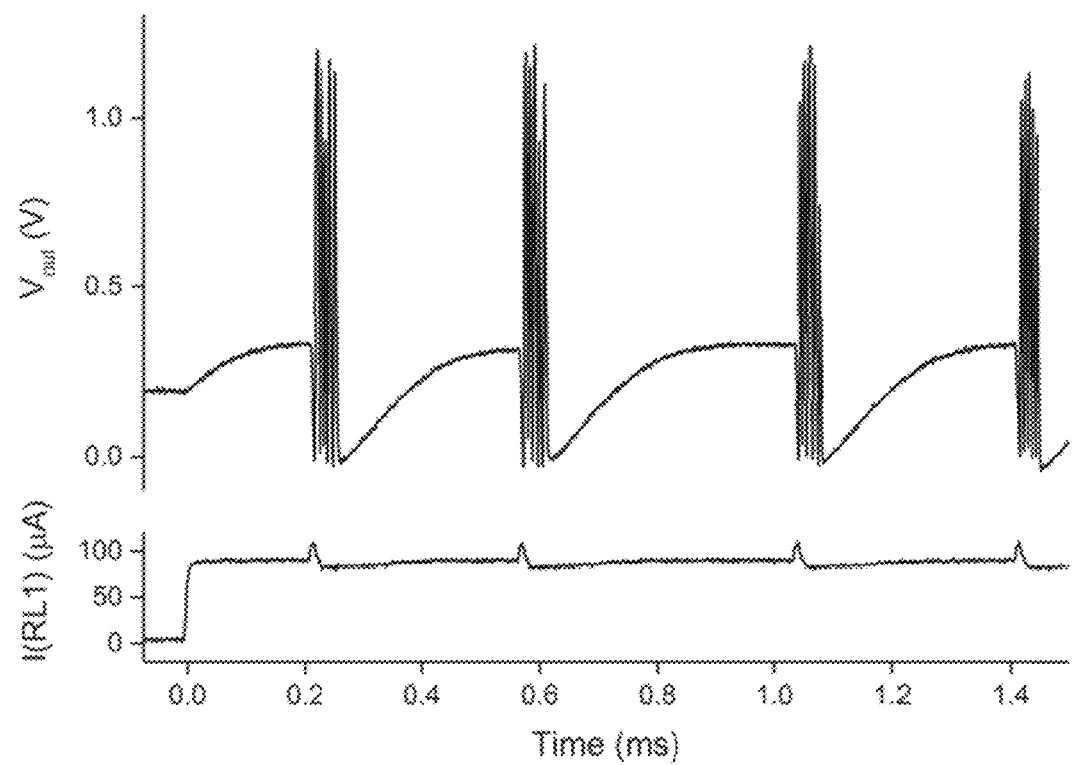
FIG. 16B illustrates an experimental tonic bursting behavior of tonic neuron circuits according to embodiments of this presentation.
Figure 16C:
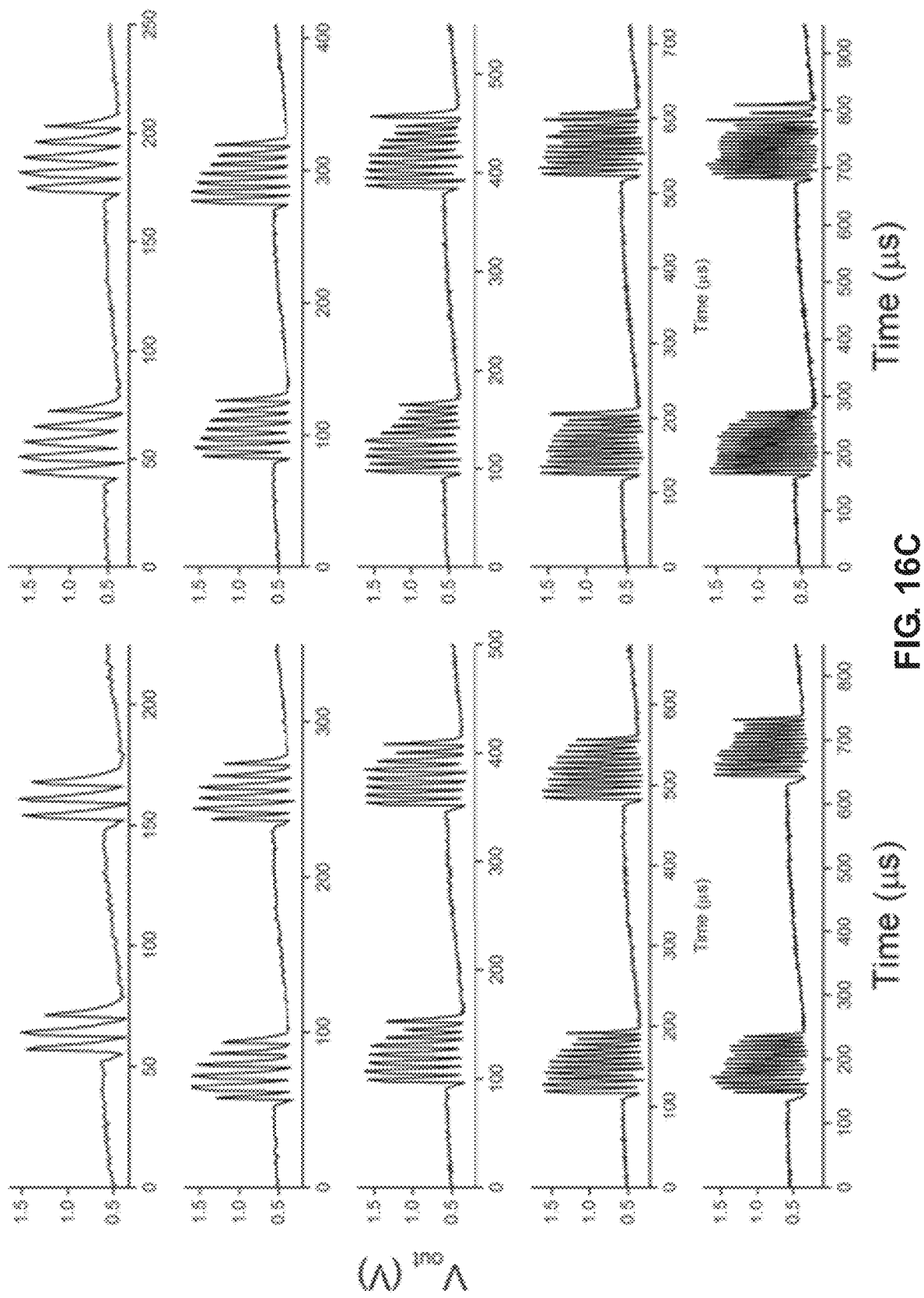
FIGS. 16C and 16D illustrate experimental tonic bursting behaviors of tonic neuron circuits according to embodiments of this presentation.
Figure 16D:
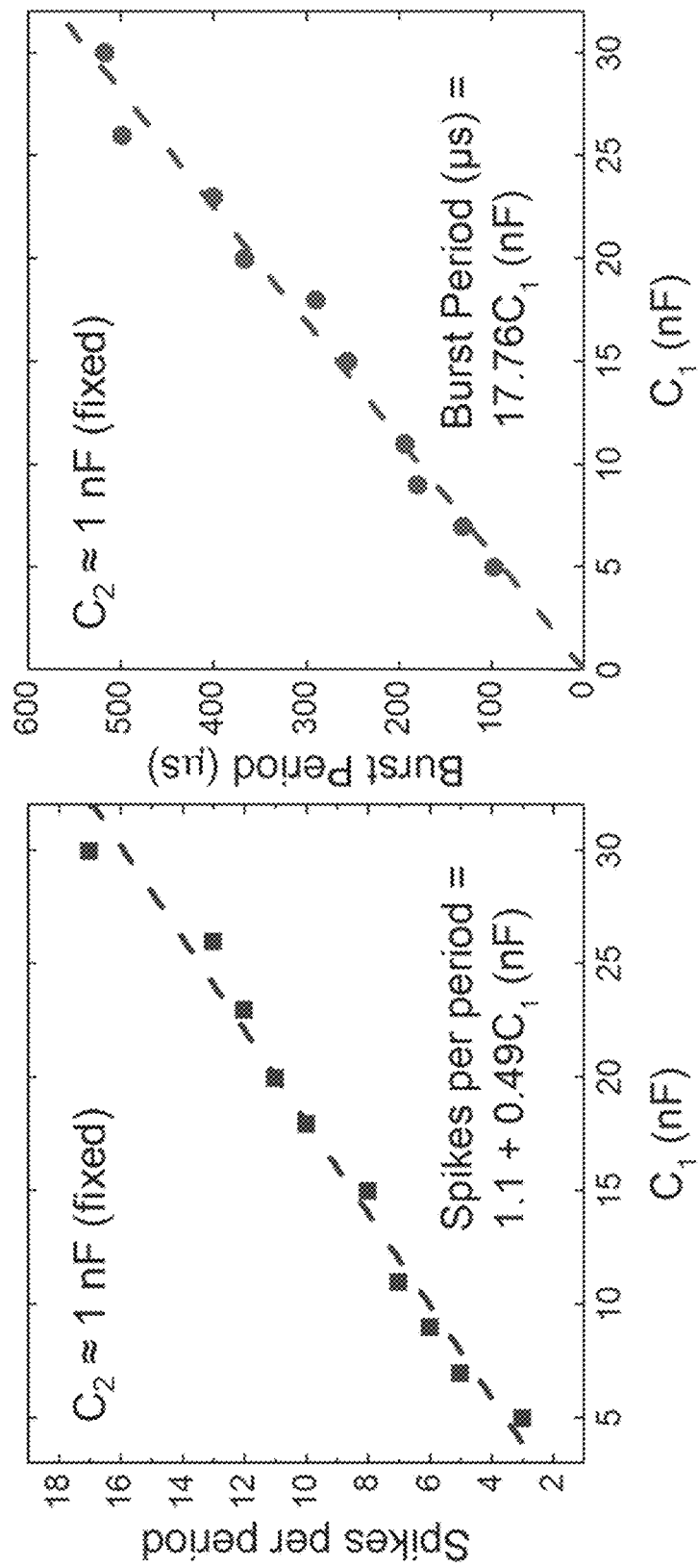

FIG. 16B illustrates a tonic bursting behavior of tonic excitatory neuron circuits according to embodiments of this presentation. The data illustrated in FIGS. 16B-D was measured for a neuron circuit according to an embodiment of this presentation, having the following characteristics and with the following stimuli:

Lot ID: 29E, Wafer ID: L29E-3
VO2 device ID: X1=5051-9, X2=5051-5
RL1=RL2=10 kΩ
C1 varies, C2=0 nF (plus stray capacitance ~1 nF for each)
V1=−1.85 V, V2=1.85 V
Current clamp input of 50 μA by Keithley 2400 SMU FIGS. 16C and 16D illustrate tonic bursting behaviors of tonic neuron circuits according to embodiments of this presentation. A neuron circuit according to an embodiment of this presentation is ergodic to get an arbitrary number of spikes in each burst period using capacitor C1 as the tuning knob. FIG. 16C illustrates the tunable tonic bursting observed when varying the value of capacitor C1, where as illustrated in FIG. 16D both the Tonic Burst Period and Number of spikes in each bursting period increase with C1 (with C2 having a fixed value of ~1 nF from the stray capacitance of the setup).

Figure 17A:
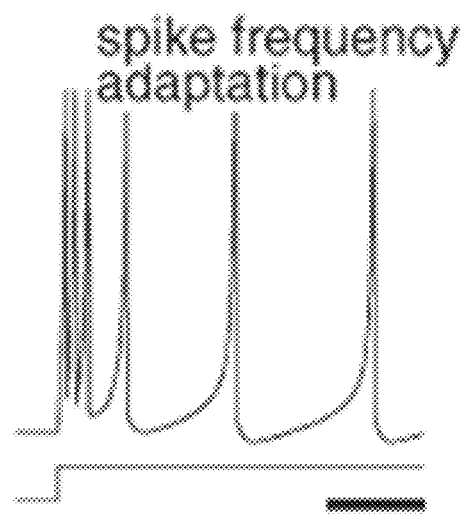
FIG. 17A illustrates a theoretical spike frequency adaptation behavior of a biological neuron.

FIG. 17A illustrates a theoretical tonic spike frequency adaptation behavior of a biological neuron (see E. M. Izhikevich, "Which model to use for cortical spiking neurons?", IEEE Trans. Neural Netw. 15, 1063 (2004). DOI: 10.1109/TNN.2004.832719).

The most common type of excitatory neuron in mammalian neocortex, namely the regular spiking (RS) cell, fires tonic spikes with decreasing frequency, as illustrated in FIG. 17A. That is, the frequency is relatively high at the onset of stimulation, and then it adapts. Low-threshold spiking (LTS) inhibitory neurons also have this property. The interspike frequency of such cells may encode the time elapsed since the onset of the input.

FIGS. 17BA-17BD illustrate an experimental (17BA, 17BC) and simulated (17BB, 17BD) tonic spike frequency adaptation behavior of tonic excitatory neuron circuits according to embodiments of this presentation. The data illustrated in FIGS. 17BA-17BD was measured for a neuron circuit according to an embodiment of this presentation, having the following characteristics and with the following stimuli:

Lot ID: 29E, Wafer ID: L29E-3
VO2 device ID: X1=5251-13, X2=5251-9
RL1=RL2=10 kΩ
C1=200 nF C2=2 nF (plus stray capacitance ~1 nF for each)
V1=−1.4 V, V2=1.4 V
Current clamp input of 90 μA is converted from a voltage square pule of 0.9 V using a stimulation isolator with a gain of 0.1 mA/V.

Figure 17C:
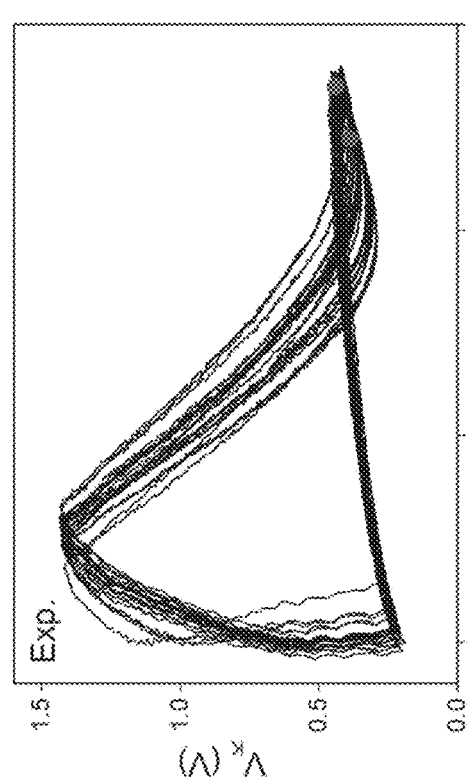
FIGS. 17CA-CD illustrate an experimental (17CA) and simulated (17CB) phasic spike frequency adaptation behavior of phasic neuron circuits according to embodiments of this presentation.
Figure 17C:
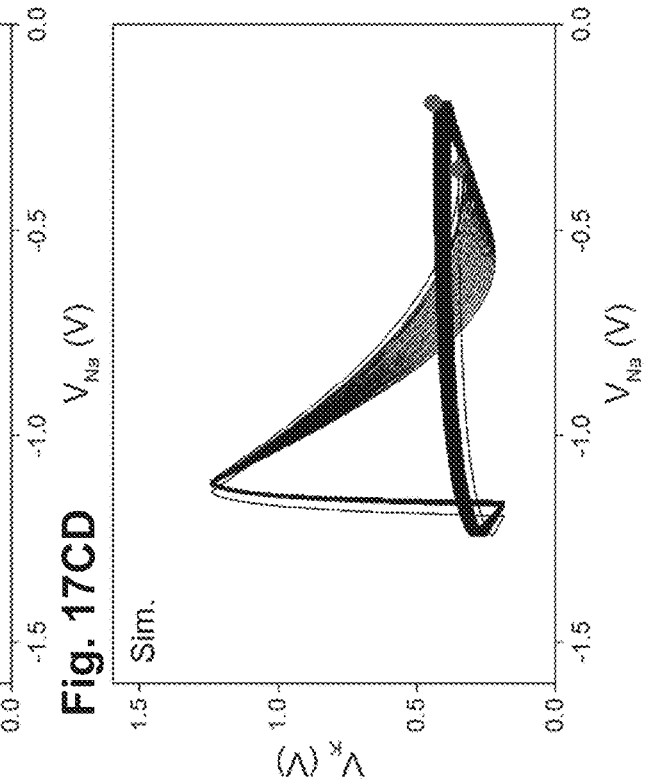
Figure 17C:
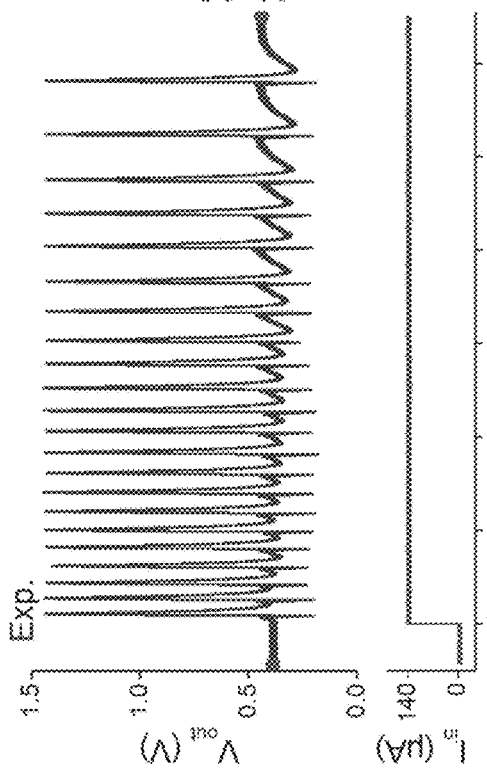
Figure 17C:
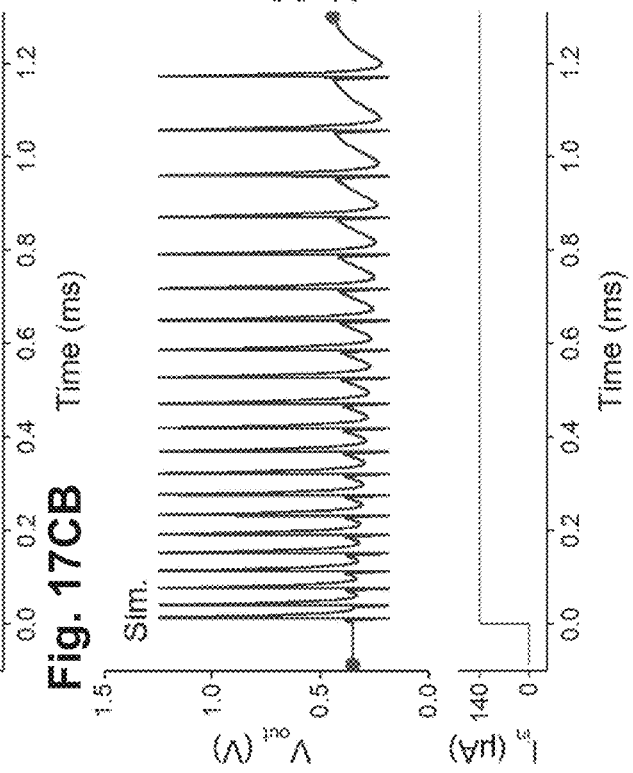

Similarly to FIGS. 17BA-17BD, FIGS. 17CA-17CD illustrate an experimental (17CA, 17CC) and simulated (17CB, 17CD) tonic spike frequency adaptation behavior of phasic excitatory neuron circuits according to embodiments of this presentation.

Figure 18A:
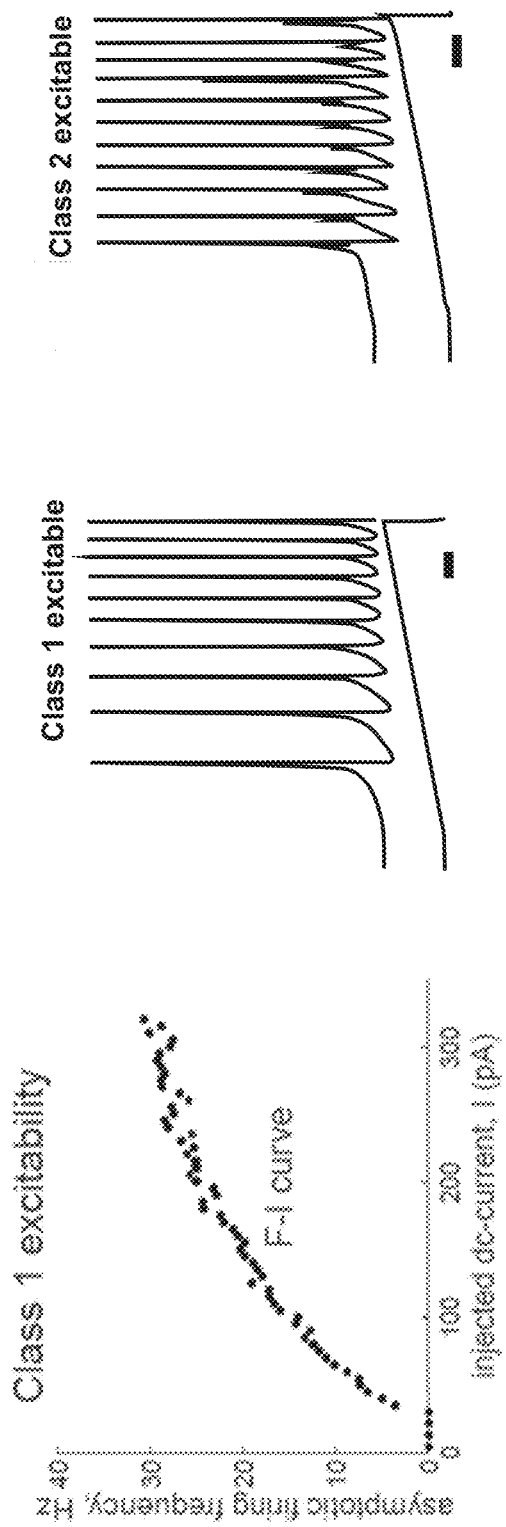
FIG. 18A illustrates theoretical class 1 excitability and class 2 excitability behaviors of a biological neuron.

FIG. 18A illustrates both a theoretical tonic class 1 excitability behavior of a biological neuron, and a theoretical tonic class 2 excitability behavior of a biological neuron (see E. M. Izhikevich, "Which model to use for cortical spiking neurons?", IEEE Trans. Neural Netw. 15, 1063 (2004). DOI: 10.1109/TNN.2004.832719). The frequency of tonic spiking of neocortical RS excitatory neurons depends on the strength of the input, and it may span a range from 2 Hz to 200 Hz, or greater. The ability to fire low-frequency spikes when the input is weak (but supra-threshold) is called Class 1 excitability (see "Frequency-current (F-I) curves of cortical pyramidal neuron" from FIG. 1.14 in E. M. Izhikevich, "Dynamical Systems in Neuroscience: The Geometry of Excitability and Bursting", The MIT Press, Cambridge MA (2007)). Class 1 excitable neurons can encode the strength of the input into their firing rate, as illustrated in FIG. 18A.

Figure 18B:
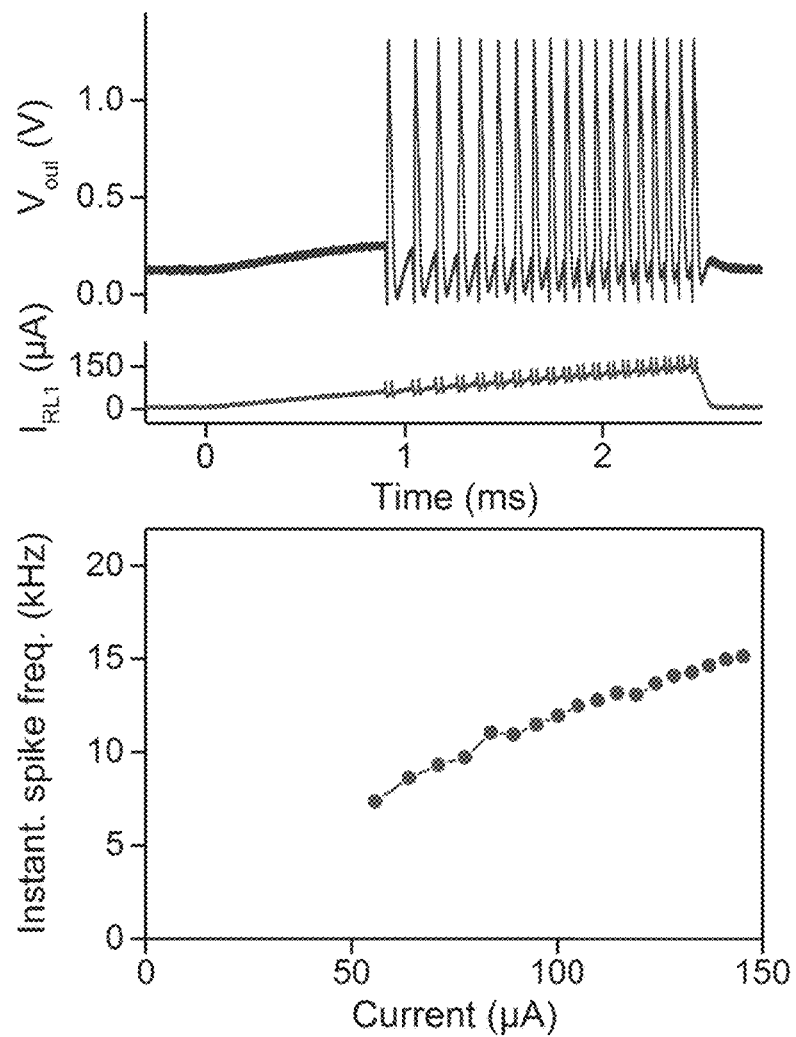
FIGS. 18B and 18C respectively illustrate experimental tonic class 1 excitability and class 2 excitability behaviors of tonic neuron circuits according to embodiments of this presentation.

FIG. 18B illustrates a tonic class 1 excitability behavior of tonic excitatory neuron circuits according to embodiments of this presentation. The data illustrated in FIG. 18B was measured for a neuron circuit according to an embodiment of this presentation, having the following characteristics and with the following stimuli:

Lot ID: 29E, Wafer ID: L29E-3
VO2 device ID: X1=5151-7, X2=5151-3
RL1=RL2=5 kΩ
C1=5 nF C2=5 nF (plus stray capacitance ~1 nF for each)
V1=−1.5 V, V2=1.5 V
Current ramp input up to 150 μA is converted from a voltage ramp up to 1.5 V using a stimulation isolator with a gain of 0.1 mA/V.

Figure 18C:
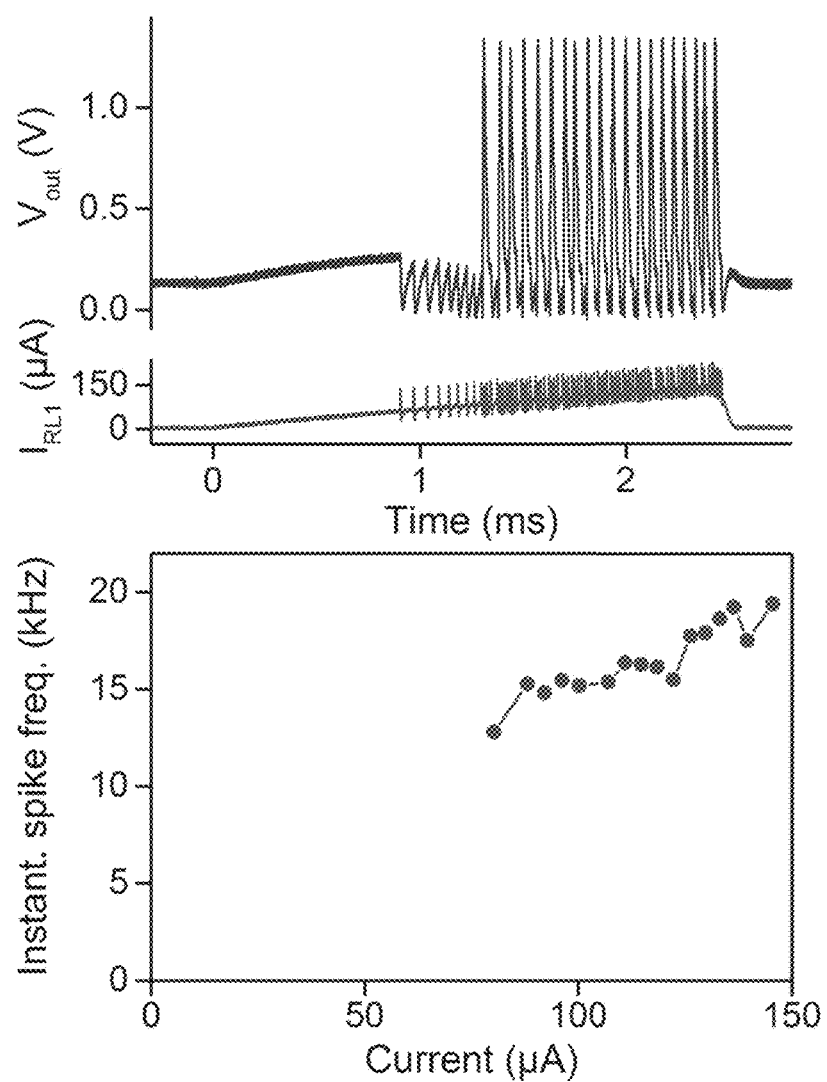

Consistently with FIG. 18B, FIG. 18C illustrates a tonic class 2 excitability behavior of tonic excitatory neuron circuits according to embodiments of this presentation.

Figure 19A:
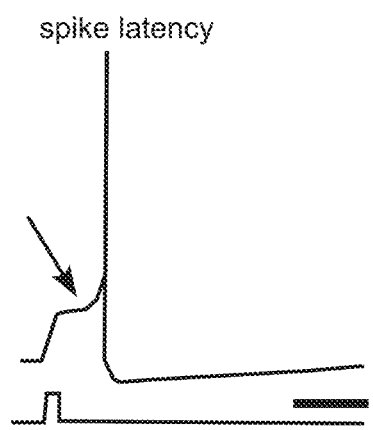
FIG. 19A illustrates a theoretical spike latency behavior of a biological neuron.

FIG. 19A illustrates a theoretical spike latency behavior of a biological neuron (see E. M. Izhikevich, "Which model to use for cortical spiking neurons?", IEEE Trans. Neural Netw. 15, 1063 (2004). DOI: 10.1109/TNN.2004.832719). Most cortical neurons fire spikes with a delay that depends on the strength of the input signal. For a relatively weak but supra-threshold input, the delay, also called spike latency, can be quite large as illustrated in FIG. 19A. The RS neuron cells in mammalian cortex can have latencies of tens of milliseconds. Such latencies provide a spike-timing mechanism to encode the strength of the input.

Figure 19B:
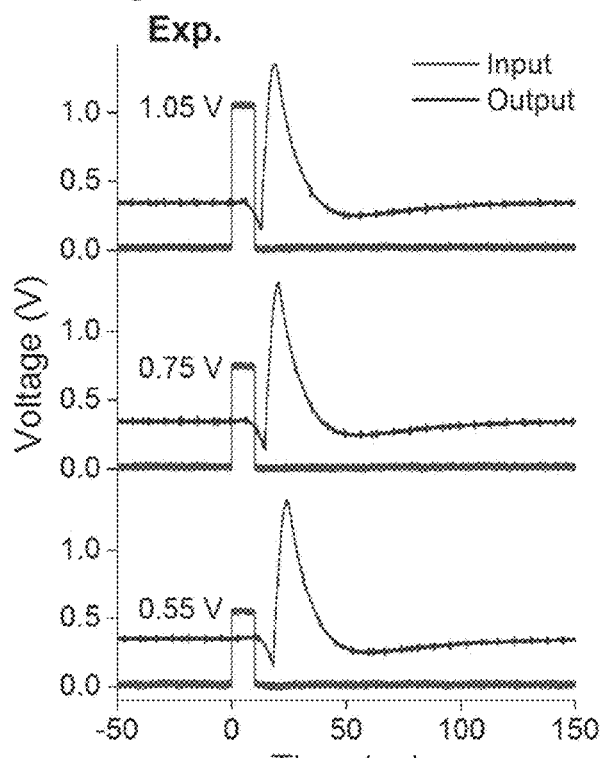
FIGS. 19BA-19BC illustrate experimental (19BA) and simulated (19BB) spike latency behavior of tonic neuron circuits according to embodiments of this presentation.
Figure 19B:
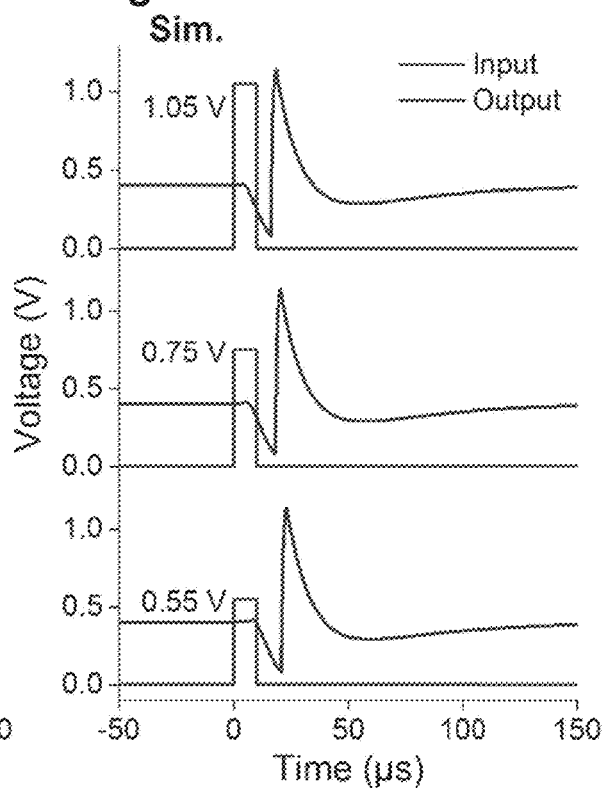
Figure 19B:
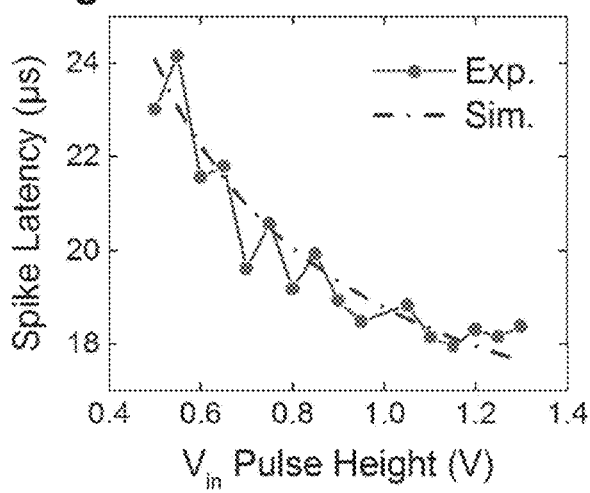

FIGS. 19BA-19BC illustrate an experimental (19BA) and simulated (19BB) spike latency behavior of tonic excitatory neuron circuits according to embodiments of this presentation. The figure also illustrates the variation of the spike latency with the pulse height in volts. The data illustrated in FIGS. 19BA-19BC was measured for a neuron circuit according to an embodiment of this presentation, having the following characteristics and with the following stimuli:

Lot ID: 29E, Wafer ID: L29E-3
VO2 device ID: X1=5352-1, X2=5252-13
RL1=RL2=6 kΩ
C1=10 nF C2=3 nF (plus stray capacitance ~1 nF for each)
V1=−1.5 V, V2=1.5 V
Input voltage pulse width=10 μs.

Figure 20A:
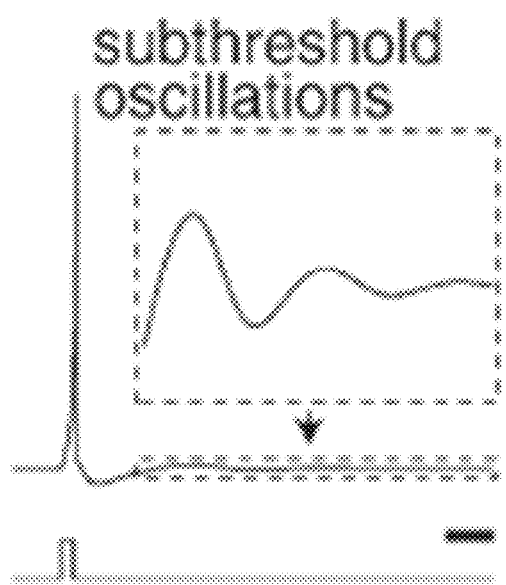
FIG. 20A illustrates a theoretical subthreshold oscillations behavior of a biological neuron.

FIG. 20A illustrates a theoretical subthreshold oscillations behavior of a biological neuron (see E. M. Izhikevich, "Which model to use for cortical spiking neurons?", IEEE Trans. Neural Netw. 15, 1063 (2004). DOI: 10.1109/

TNN.2004.832719). Practically every brain structure has neurons capable of exhibiting oscillatory potentials, as in FIG. 20A.

The frequency of such oscillations play an important role and such neurons act as bandpass filters, as discussed hereafter.

Figure 20B:
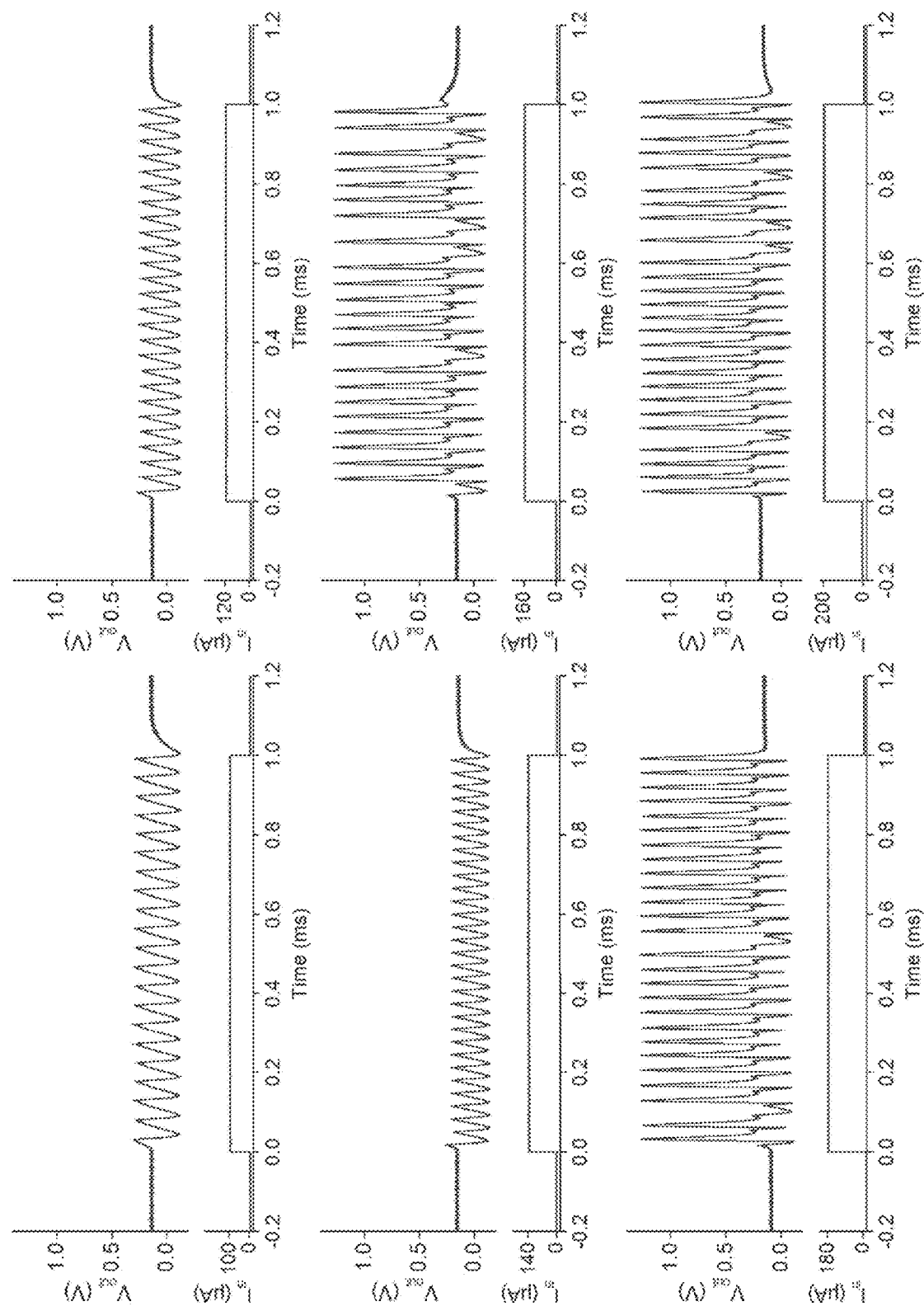
FIG. 20B illustrates an experimental subthreshold oscillations behavior of tonic neuron circuits according to embodiments of this presentation.

FIG. 20B illustrates a subthreshold oscillations behavior of tonic excitatory neuron circuits according to embodiments of this presentation.

Figure 21A:
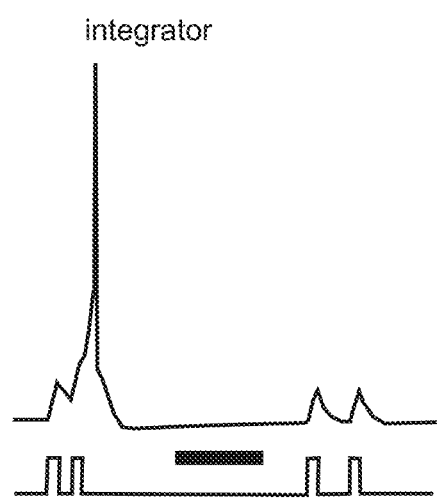
FIG. 21A illustrates a theoretical integrator behavior of a biological neuron.

The data illustrated in FIG. 20B was measured for a neuron circuit according to an embodiment of this presentation, having the following characteristics and with the following stimuli:
Lot ID: 29E, Wafer ID: L29E-3
X1=5350-11, X2=5350-7
RL1=RL2=5 kOhm
C1=2 nF, C2=3 nF
V1=−1.4 V, V2=1.4 V
Current clamps at 100 uA, 120 uA, 140 uA, 160 uA, 180 uA and 200 uA are converted from voltage square pulses using a stimulation isolator with a gain of 0.1 mA/V FIG. 21A illustrates a theoretical integrator behavior of a biological neuron (see E. M. Izhikevich, "Which model to use for cortical spiking neurons?", IEEE Trans. Neural Netw. 15, 1063 (2004). DOI: 10.1109/TNN.2004.832719). Neurons without oscillatory potentials act as integrators. They prefer high frequency input.

The higher the frequency of the input, the more likely the neuron is to fire, as illustrated in FIG. 21A. Such neurons can be useful for detecting coincident or nearly coincident spikes.

Figure 22A:
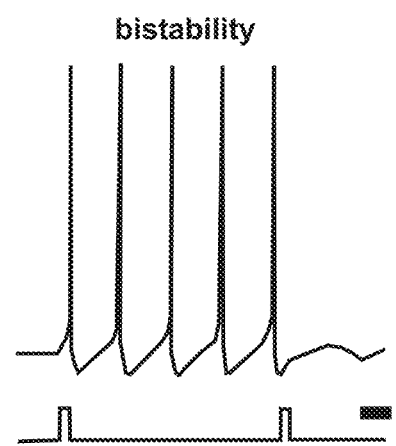
FIG. 22A illustrates a theoretical bistability behavior of a biological neuron.

FIGS. 21BA-21BB illustrate an experimental (21BA) and simulated (21BB) integration behavior of tonic excitatory neuron circuits according to embodiments of this presentation. The data illustrated in FIGS. 21BA-21BB was measured for a neuron circuit according to an embodiment of this presentation, having the following characteristics and with the following stimuli:
Lot ID: 29E, Wafer ID: L29E-3
VO2 device ID: X1=5251-13, X2=5251-9
RL1=RL2=6 kΩ
C1=8.5 nF C2=2 nF (plus stray capacitance ~1 nF for each)
V1=−1.4 V, V2=1.4 V
Input voltage pulse width=6 μs
Pulse doublet 1: pulse period=11 μs
Pulse doublet 2: pulse period=29 μs FIG. 22A illustrates a theoretical bistability behavior of a biological neuron (see E. M. Izhikevich, "Which model to use for cortical spiking neurons?", IEEE Trans. Neural Netw. 15, 1063 (2004). DOI: 10.1109/TNN.2004.832719). Some neurons can exhibit two stable modes of operation: resting and tonic spiking (or even bursting).

An excitatory or inhibitory pulse can switch between the modes, as in FIG. 9P, thereby creating an interesting possibility for bistability and short term memory. It is to be noticed that to switch from the tonic spiking to resting mode, the input must arrive at an appropriate phase of oscillation, thereby emphasizing the importance of spike-timing in such information processing.

Figure 22B:
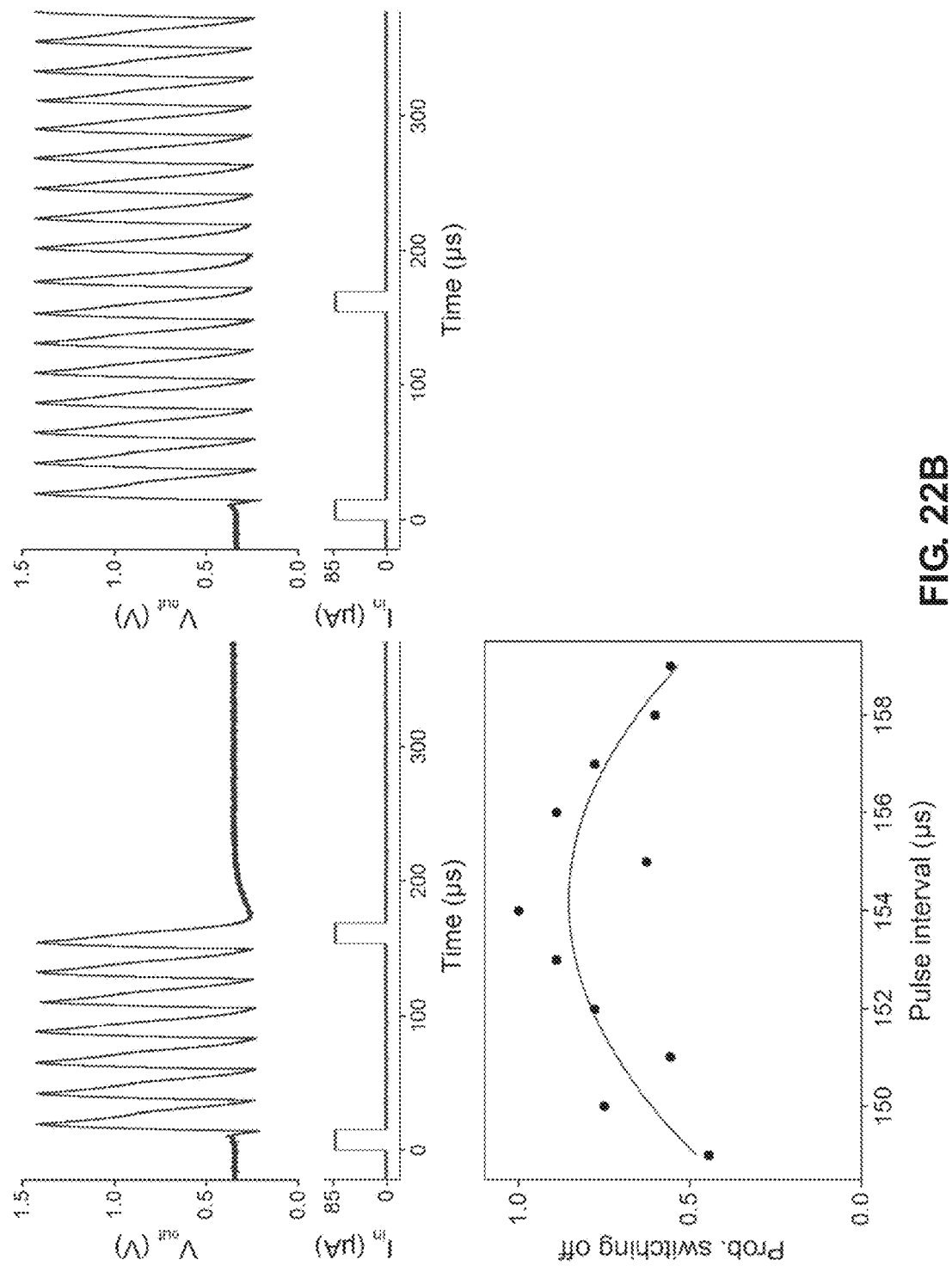
FIG. 22B illustrates an experimental bistability behavior of a tonic neuron circuit according to embodiments of this presentation.

FIG. 22B illustrates a bistability behavior of a tonic excitatory neuron circuit 20 such as illustrated in FIG. 3A. FIG. 22B illustrates the operation of an embodiment where at a pulse interval of 154 μs, the second pulse successfully switches the neuron from tonic spiking to resting mode; and at a pulse interval of 155 μs, the second pulse fails to switch the neuron from tonic spiking to resting mode. Probability (success rate) of the second input pulse switching off the self-oscillation vs. the pulse interval is calculated from statistics of 8 to 10 such attempts. At a pulse interval of 154 μs, the success rate is 100%. At a pulse interval of 155 μs, the success rate dropped to 62.5%. The success rate peaks at around 154 μs interval, and it drops off as the interval is detuned away. The data illustrated in FIG. 22B was measured for a tonic neuron circuit 20 having the following characteristics and with the following stimuli:
Lot ID: 29E, Wafer ID: L29E-3
VO2 devices: X1=5352-1, X2=5252-13
RL1=0 KΩ, RL2=7 kΩ
C1=1.5 nF, C2=2 nF (plus stray capacitance ~1 nF for each)
V1=−1.58 V, V2=1.58 V
Current input pulses of 80 μA were converted from 0.8 V, 15 μs voltage pulses using a stimulation isolator with a gain of 0.1 mA/V.

Figure 23A:
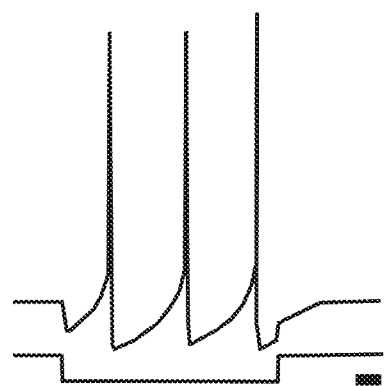
FIG. 23A illustrates a theoretical inhibition-induced spiking behavior of a biological neuron.

FIG. 23A illustrates a theoretical inhibition-induced spiking behavior of a biological neuron (see E. M. Izhikevich, "Which model to use for cortical spiking neurons?", IEEE Trans. Neural Netw. 15, 1063 (2004). DOI: 10.1109/TNN.2004.832719).

A bizarre feature of many thalamo-cortical neurons is that they are quiescent when there is no input, but fire when hyper-polarized by an inhibitory input or an injected current, as illustrated in FIG. 23A. This happens because the injected current activates the h-current and de-inactivates calcium T-current, leading to tonic spiking.

Figure 23B:
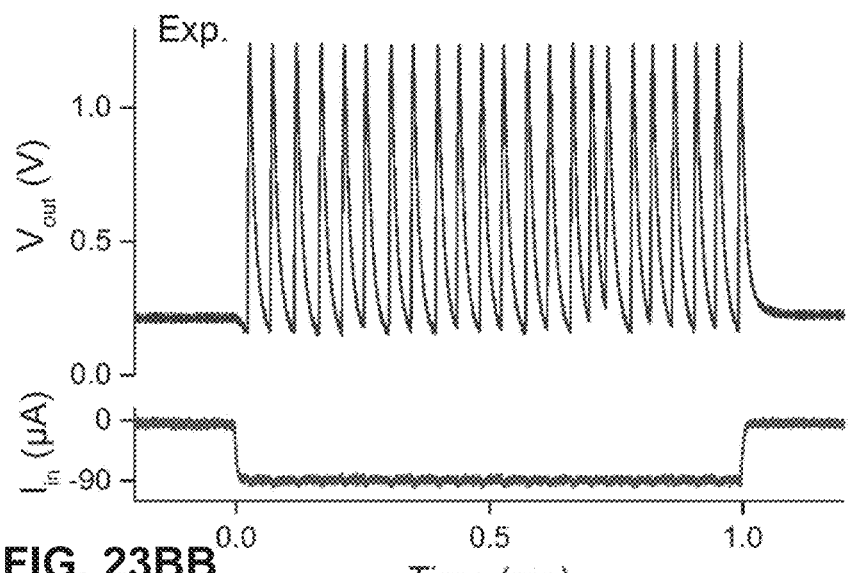
FIGS. 23BA-23BB illustrate experimental (23BA) and simulated (23BB) inhibition-induced spiking behavior of tonic neuron circuits according to embodiments of this presentation.
Figure 23B:
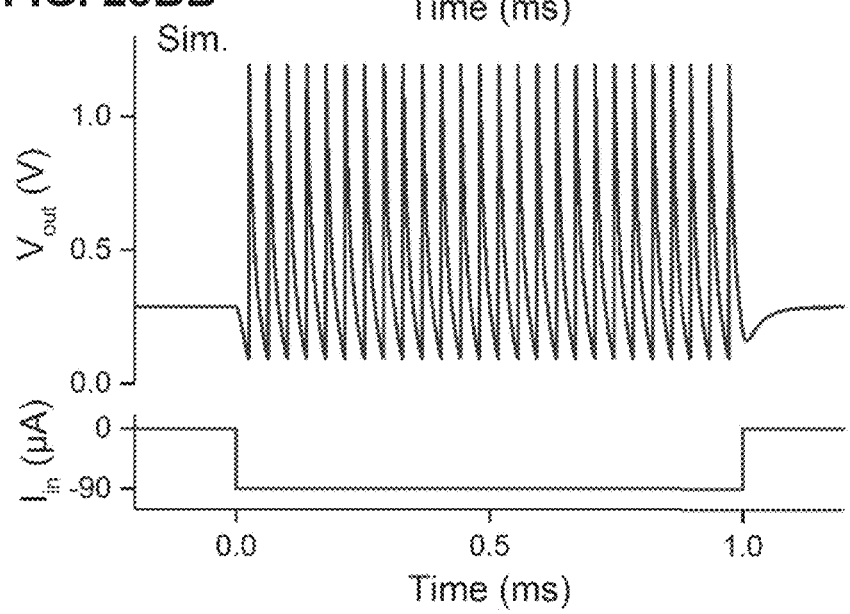

FIGS. 23BA-23BB illustrate an experimental and simulated inhibition-induced spiking behavior of excitatory tonic neuron circuits according to embodiments of this presentation. The data illustrated in FIGS. 23BA-23BB was measured for a neuron circuit according to an embodiment of this presentation, having the following characteristics and with the following stimuli:
Lot ID: 29E, Wafer ID: L29E-3
VO2 devices: X1=5251-13, X2=5251-9
RL1=RL2=6 kΩ
C1=6 nF C2=2 nF (plus stray capacitance ~1 nF for each)
V1=−1.4 V, V2=1.4 V
Current clamp input of −90 μA is converted from a voltage square pule of −0.9V using a stimulation isolator with a gain of 0.1 mA/V.

Figure 24A:
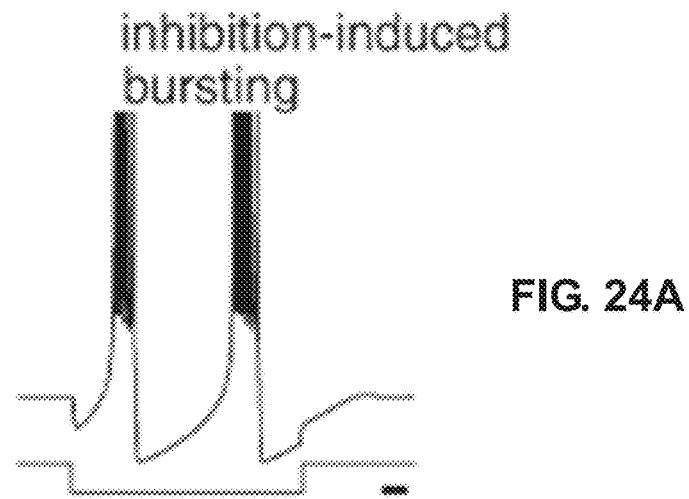
FIG. 24A illustrates a theoretical inhibition-induced bursting behavior of a biological neuron.

FIG. 24A illustrates a theoretical inhibition-induced bursting behavior of a biological neuron (see E. M. Izhikevich, "Which model to use for cortical spiking neurons?", IEEE Trans. Neural Netw. 15, 1063 (2004). DOI: 10.1109/TNN.2004.832719).

Instead of spiking, a thalamo-cortical neuron can fire tonic bursts of spikes in response to a prolonged hyperpolarization, as illustrated in FIG. 24A. It is believed that such bursting takes place during spindlewave oscillations in the thalamo-cortical system and it plays an important role in sleep rhythms.

Figure 24B:
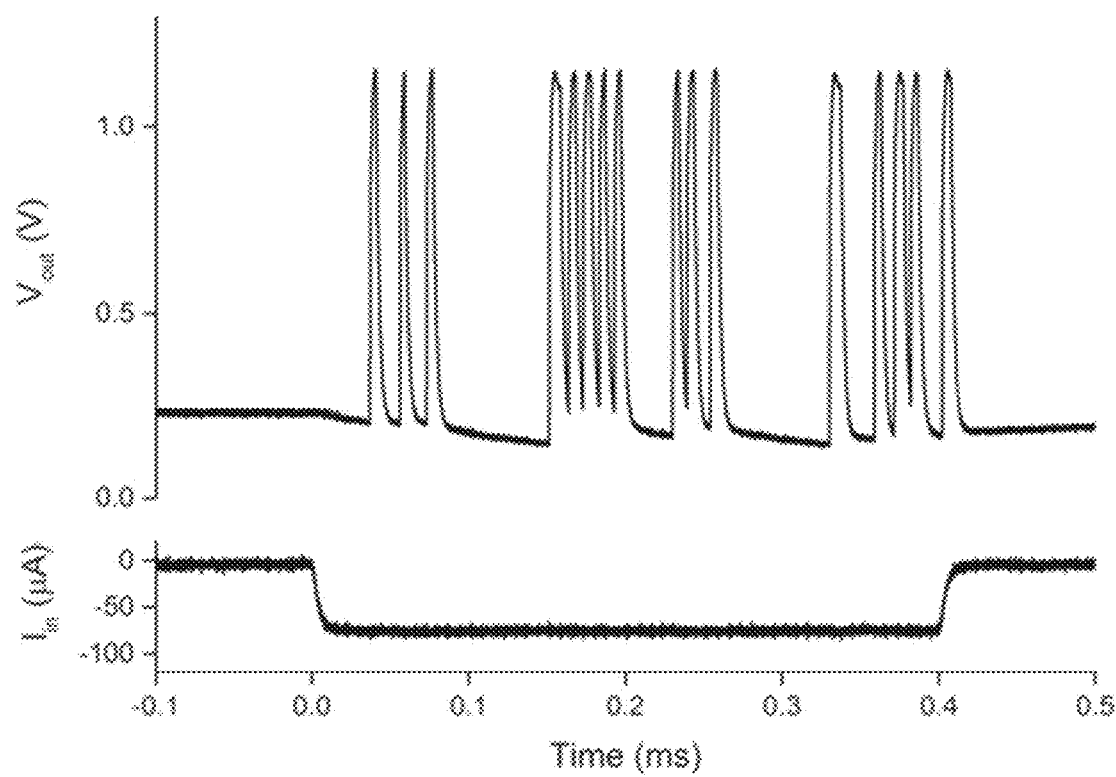
FIG. 24B illustrates an experimental inhibition-induced bursting behavior of tonic neuron circuits according to embodiments of this presentation.

FIG. 24B illustrates an inhibition-induced bursting firing of tonic excitatory neuron circuits according to embodiments of this presentation. The data illustrated in FIG. 24B was measured for a neuron circuit according to an embodiment of this presentation, having the following characteristics and with the following stimuli:
Lot ID: 29E, Wafer ID: L29E-3
VO2 device ID: X1=5251-13, X2=5251-9
RL1=RL2=6 kΩ
C1=35 nF C2=0 nF (plus stray capacitance ~1 nF for each)
V1=−1.4V, V2=1.4V Current clamp input of −70 µA is converted from a voltage square pule of −0.7 V using a stimulation isolator with a gain of 0.1 mA/V No single neuron is supposed to exhibit the neurocomputational properties discussed above, at least because some of the properties are mutually exclusive. For example, a neuron cannot be an integrator and a resonator at the same time.

However, neuron circuits according to this presentation can easily be tuned to exhibit a property or another. For example, the measurements illustrated above were obtained using a neuron having easily tunable circuit parameters.

Figure 25A:
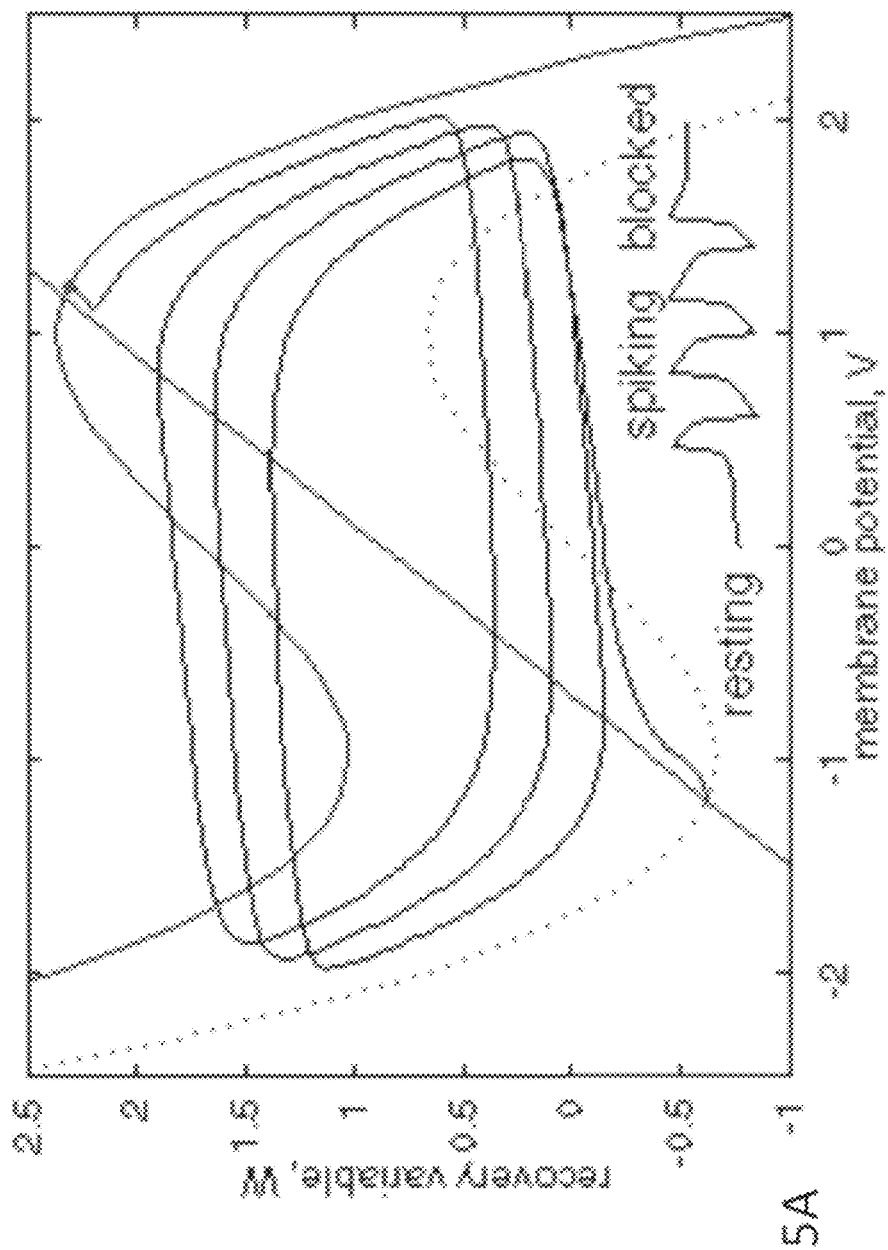
FIG. 25A illustrates a theoretical excitation block behavior of a biological neuron.

FIG. 25A illustrates a theoretical excitation block behavior of a biological neuron. The Fitz Hugh-Nagumo model explains the excitation block phenomenon, i.e., the cessation of repetitive spiking as the amplitude of the stimulus current increases.

When is weak or zero, the equilibrium (intersection of nullclines) is on the left (stable) branch of -nullcline, and the model is resting. Increasing shifts the nullcline upward and the equilibrium slides onto the middle (unstable) branch of the nullcline.

The model exhibits periodic spiking activity in this case. Increasing the stimulus further shifts the equilibrium to the right (stable) branch of the N-shaped nullcline, and the oscillations are blocked (by excitation!).

The precise mathematical mechanism involves appearance and disappearance of a limit cycle attractor (see for example: E. M. Izhikevich and R. FitzHugh, http://www.scholarpedia.org/article/FitzHugb-Nagumo_model).

Figure 25B:
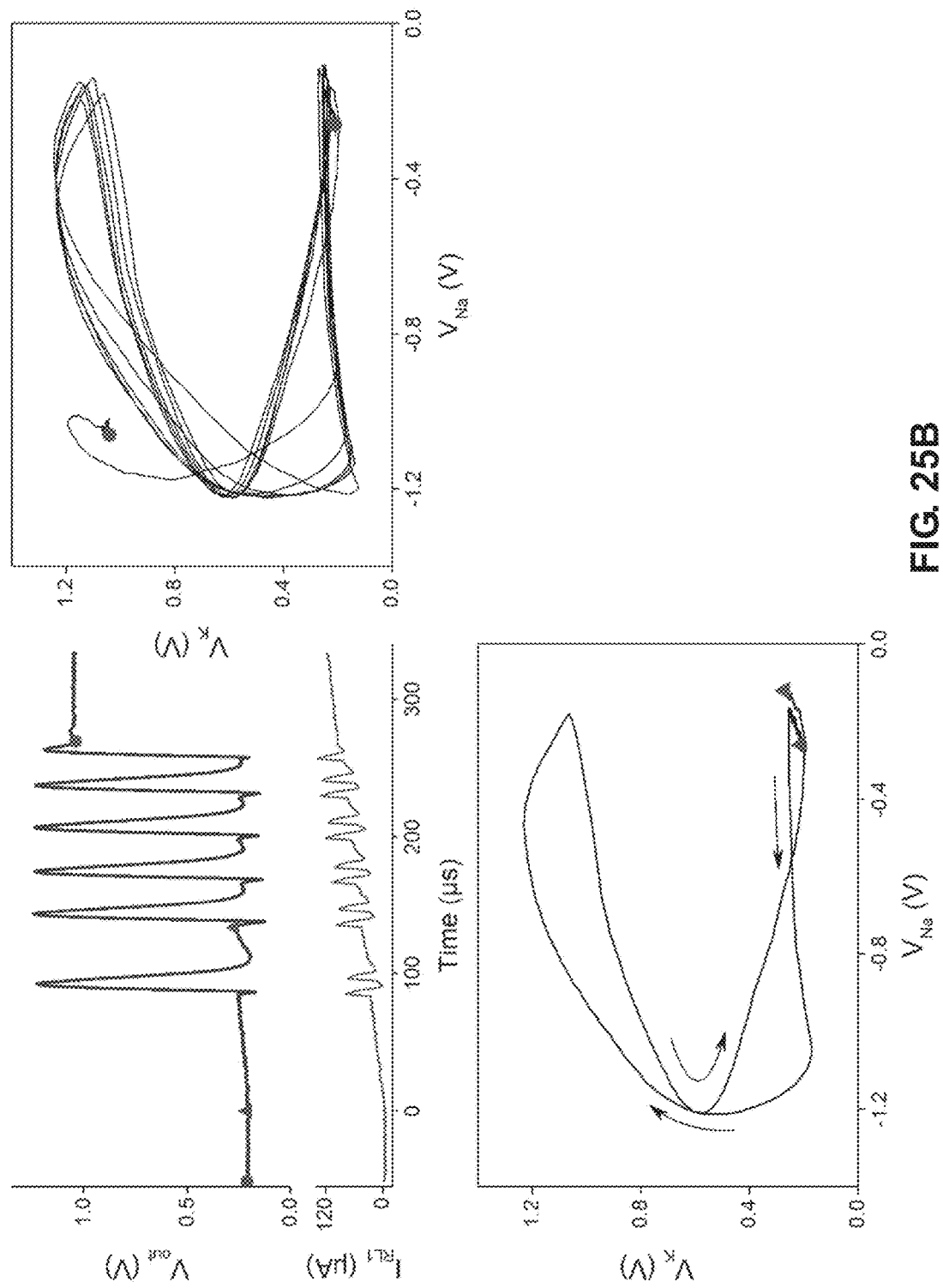
FIG. 25B illustrates an experimental excitation block behavior of tonic neuron circuits according to embodiments of this presentation.

FIG. 25B illustrates an excitation block behavior of tonic excitatory neuron circuits according to embodiments of this presentation. Excitation block is caused by the so-called supercritical Andronov-Hopf bifurcation phenomenon. Currently, there is yet no theory constructed to predict the operating domain for this behavior in memristor neurons, nonetheless, such behavior was experimentally observed for neuron circuits according to embodiments of this presentation.

It is noted that although the input current is a linear ramp waveform, the monitored current flowing through RL1 shows such "glitches" caused by the back action of action potentials (spikes) toward RL1.

The data illustrated in FIG. 25B was measured for a neuron circuit according to an embodiment of this presentation, having the following characteristics and with the following stimuli:

Lot ID: 29E, Wafer ID: L29E-3
VO2 device ID: X1=5251-13, X2=5251-9
RL1=RL2=6 kΩ
C1=0 nF C2=2 nF (plus stray capacitance ~1 nF for each)
V1=−1.4 V, V2=1.4 V
Current ramp input up to 150 µA is converted from a voltage ramp up to 1.5V using a stimulation isolator with a gain of 0.1 mA/V.

FIG. 26A illustrates a theoretical phasing spiking behavior of a biological neuron (see E. M. Izhikevich, "Which model to use for cortical spiking neurons?", IEEE Trans. Neural Netw. 15, 1063 (2004). DOI: 10.1109/TNN.2004.832719).

A neuron may fire only a single spike at the onset of the input as illustrated in FIG. 26A, and remain quiescent afterwards. Such a response is called phasic spiking, or Class 3 excitability, and it is useful for detection of the beginning of stimulation.

Figure 27A:
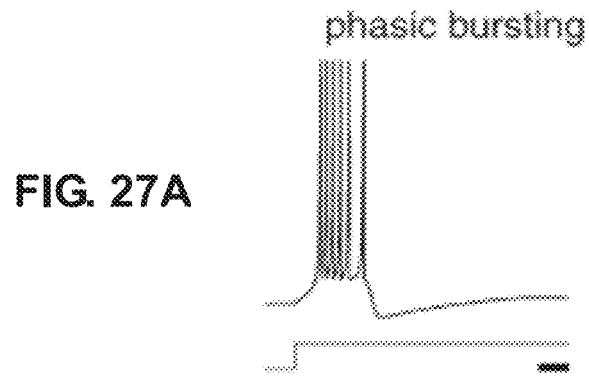
FIG. 27A illustrates a theoretical phasing bursting behavior of a biological neuron.

FIGS. 26BA-26BB illustrate an experimental (26BA) and simulated (26BB) phasing spiking behavior of a phasic excitatory neuron circuit 20' such as illustrated in FIG. 4A. A current source is used to send a current clamp as illustrated in FIG. 26A to a neuron circuit 20' as illustrated in FIG. 4A. Output is measured on output node 44 of circuit 20'. The data illustrated in FIGS. 26BA-26BB was measured for a neuron circuit according to an embodiment of this presentation, having the following characteristics and with the following stimuli:

Lot ID: 29E, Wafer ID: L29E-3
VO2 devices: X1=5352-1, X2=5252-13
RL1=0, RL2=7 kΩ
C1=1 nF C2=2 nF (plus stray capacitance ~1 nF for each)
V1=−1.6 V, V2=1.6 V
RL1 is replaced by a capacitor Cin=0.3 nF
Current clamp input is converted from a voltage square pulse using a stimulation isolator with a gain of 0.1 mA/V FIG. 27A illustrates a theoretical phasing bursting behavior of a biological neuron (see E. M. Izhikevich, "Which model to use for cortical spiking neurons?", IEEE Trans. Neural Netw. 15, 1063 (2004). DOI: 10.1109/TNN.2004.832719). Similarly to the phasic spikers, some neurons are phasic bursters, and fire as illustrated in FIG. 27A.

Such neurons report the beginning of the stimulation by transmitting a burst. There are three major hypothesis of the importance of bursts in the brain, which are: (1) bursts are needed to overcome the synaptic transmission failure and reduce neuronal noise; (2) bursts can transmit saliency of the input, because the effect of a burst on the postsynaptic neuron is stronger than the effect of a single spike; and (3) bursts can be used for selective communication between neurons, where the inter-spike frequency within the bursts encodes the channel of communication. A good model of a cortical neuronal network cannot neglect bursting neurons.

Figure 27B:
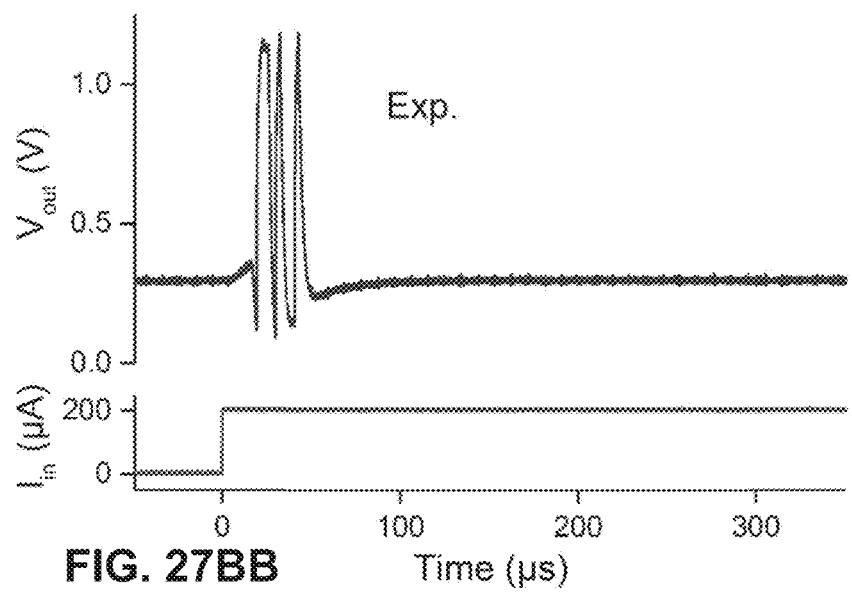
FIGS. 27BA-27BB illustrate experimental (27BA) and simulated (27BB) phasing bursting behavior of a phasic neuron circuit according to embodiments of this presentation.

FIGS. 27BA-27BB illustrate an experimental (27BA) and simulated (27BB) phasing bursting behavior of a phasic excitatory neuron circuit according to embodiments of this presentation.

Figure 28A:
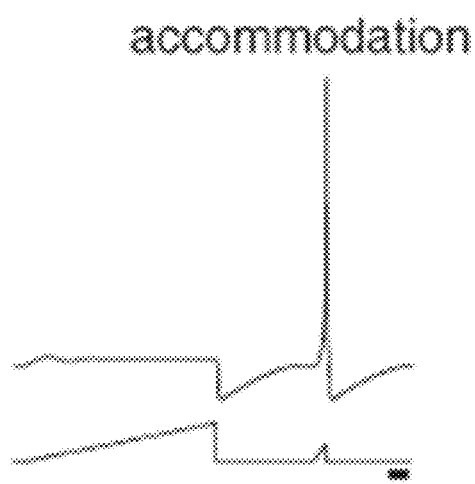
FIG. 28A illustrates a theoretical accommodation behavior of a biologic al neuron.

A current source is used to send a current clamp as illustrated in FIG. 27A to a neuron circuit 20' as illustrated in FIG. 4A. Output is measured on output node 44 of circuit 20'. The data illustrated in FIGS. 27BA-27BB was measured for a neuron circuit according to an embodiment of this presentation, having the following characteristics and with the following stimuli:

Lot ID: 29E, Wafer ID: L29E-3
VO2 device ID: X1=5352-1, X2=5252-13
RL1=0, RL2=7 kΩ
C1=4 nF C2=0 nF (plus stray capacitance ~1 nF for each)
V1=−1.6 V, V2=1.6 V
RL1 is replaced by a capacitor Cin=0.3 nF
Current clamp input is converted from a voltage square pulse using a stimulation isolator with a gain of 0.1 mA/V FIG. 28A illustrates a theoretical accommodation behavior of a biological neuron (see E. M. Izhikevich, "Which model to use for cortical spiking neurons?", IEEE Trans. Neural Netw. 15, 1063 (2004). DOI: 10.1109/TNN.2004.832719).

Neurons are extremely sensitive to brief coincident inputs, but may not fire in response to a strong but slowly increasing input, as illustrated in FIG. 28A.

The slowly ramped current illustrated does not elicit a spike, while a smaller but sharply ramped current elicits s spike. During the slow ramp, the inward currents have enough time to inactivate and outward currents have enough time to activate, so the neutron accommodates, becomes less excitable and cannot generate a spike.

Figure 27B:
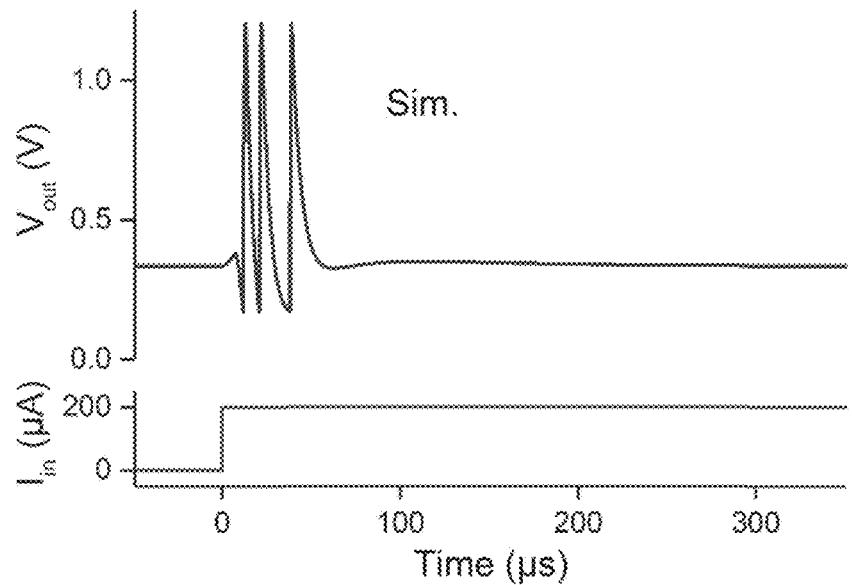
Figure 28C:
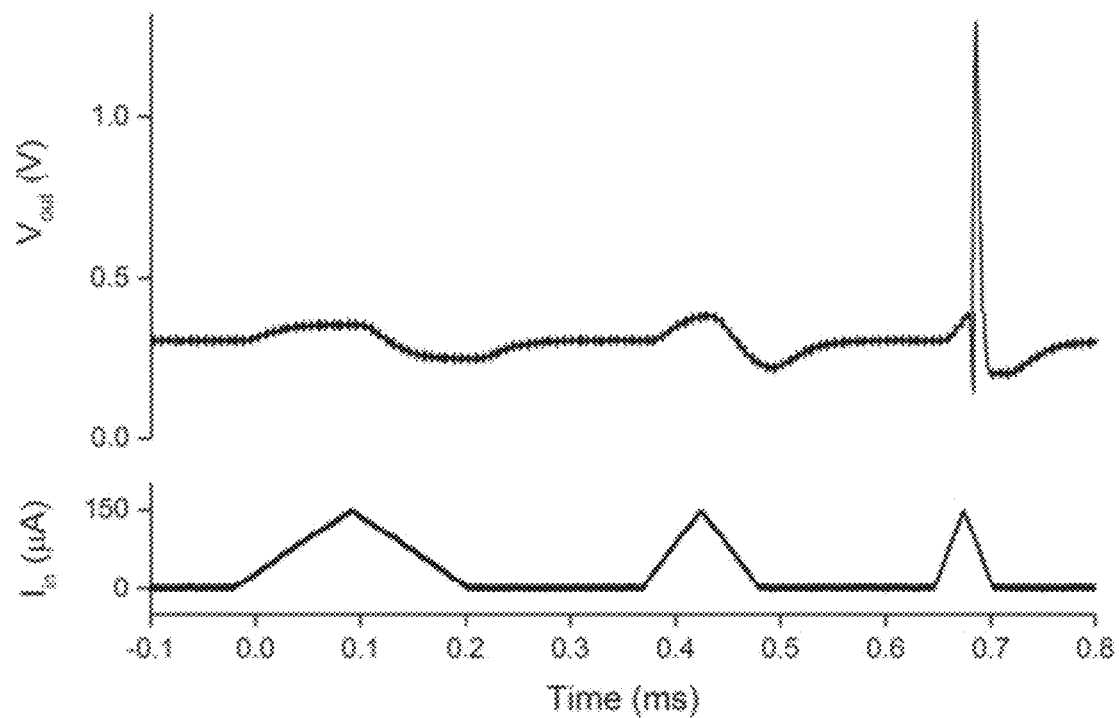
FIG. 28C illustrates an experimental accommodation behavior of a phasic neuron circuit as illustrated in FIG. 4B.

A circuit such as used to obtain the data of FIGS. 26, 27 can be used to test a neuron 20' such as illustrated in FIG. 4A, and provide results such as illustrated in FIG. 28B, and to test a neuron 20" such as illustrated in FIG. 4B, and provide results such as illustrated in FIG. 28C.

Figure 29A:
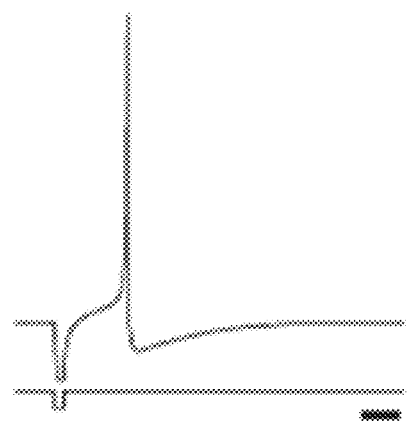
FIG. 29A illustrates a theoretical rebound spike behavior of a biological neuron.

FIG. 28B illustrates an accommodation behavior of a phasic excitatory neuron circuit according to embodiments of this presentation. Three current ramps are applied to the input of the neuron, and the neuron fires only when the slope of the ramp is steep enough. The data illustrated in FIG. 28B was measured for a neuron circuit 20' according to an embodiment of this presentation, having the following characteristics and with the following stimuli:

- Lot ID: 29E, Wafer ID: L29E-3
- VO2 device ID: X1=5352-1, X2=5252-13
- RL1=0, RL2=7 kΩ
- C1=1 nF C2=0 nF (plus stray capacitance ~1 nF for each)
  - V1=−1.68 V, V2=1.68 V
- RL1 is replaced by a capacitor Cin=0.3 nF
- Current ramp input is converted from a voltage ramp waveform using a stimulation isolator with a gain of 0.1 mA/V FIG. 28C illustrates an accommodation behavior of a phasic excitatory neuron circuit according to embodiments of this presentation. Three ramps are submitted in input of the neuron, and the neuron fires only when the slope of the ramp is steep enough. The data illustrated in FIG. 28C was measured for a neuron circuit 20" according to an embodiment of this presentation, having the following characteristics and with the following stimuli:

- Lot ID: 29E, Wafer ID: L29E-3
- VO2 device ID: X1=5152-13, X2=5152-9
- RL1=RL2=7 kΩ
- C1=0 nF C2=1 nF (plus stray capacitance ~1 nF for each)
- V1=−1.5 V, V2=1.5 V
- Cin=0.3 nF inserted before RL1
  - Current ramp input is converted from a voltage ramp waveform using a stimulation isolator with a gain of 0.1 mA/V FIG. 29A illustrates a theoretical rebound spike behavior of a biological neuron (see E. M. Izhikevich, "Which model to use for cortical spiking neurons?", IEEE Trans. Neural Netw. 15, 1063 (2004). DOI: 10.1109/TNN.2004.832719).

When a neuron receives, then is released of, an inhibitory input, it may fire a post-inhibitory (rebound) spike, as illustrated in FIG. 29A. The neuron then acts as a "rise edge" detector. This phenomenon is related to the anodal break excitation in excitable membranes. Many spiking neurons can fire in response to brief inhibitory inputs, thereby blurring the difference between excitation and inhibition.

Figure 29B:
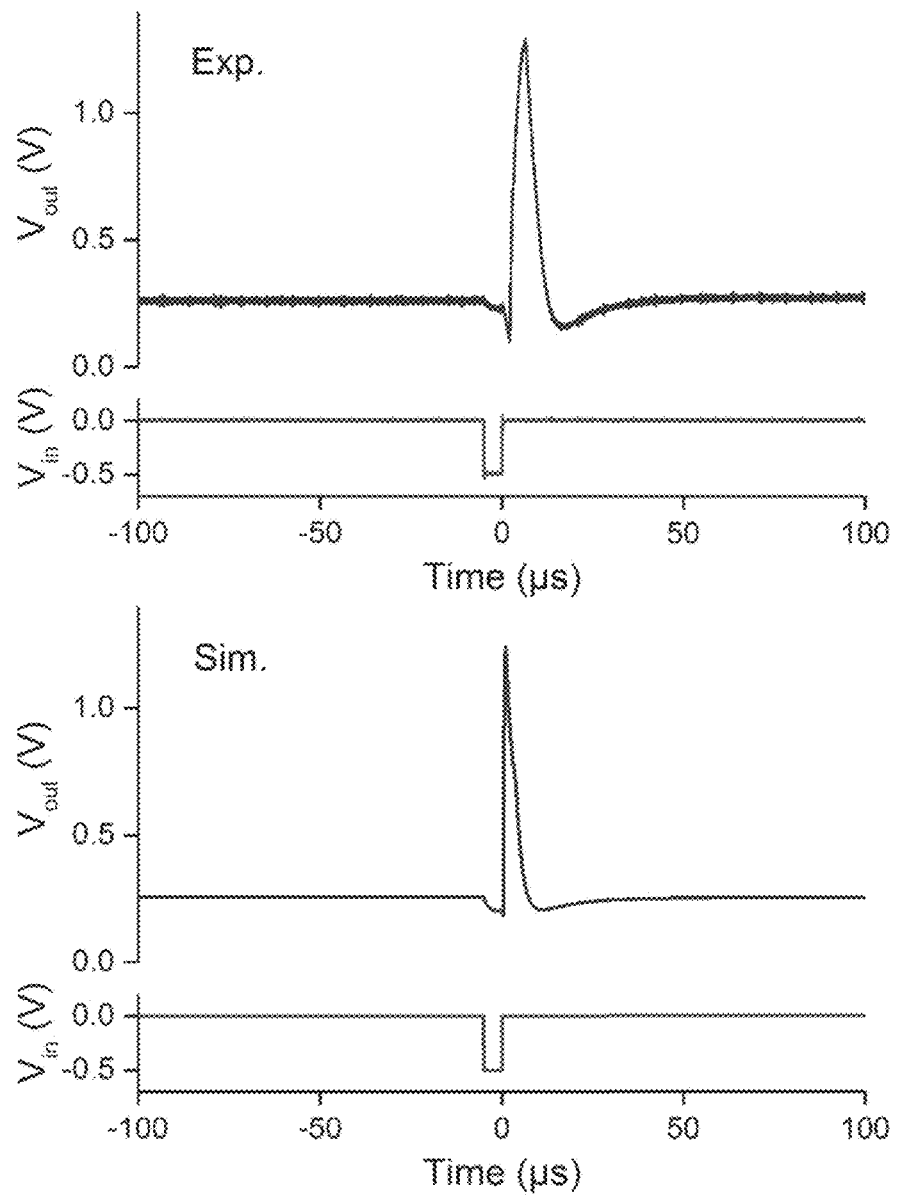
FIGS. 29B, 29C and 29D illustrate rebound spike behaviors of a phasic neuron circuit according to embodiments of this presentation.
Figure 29C:
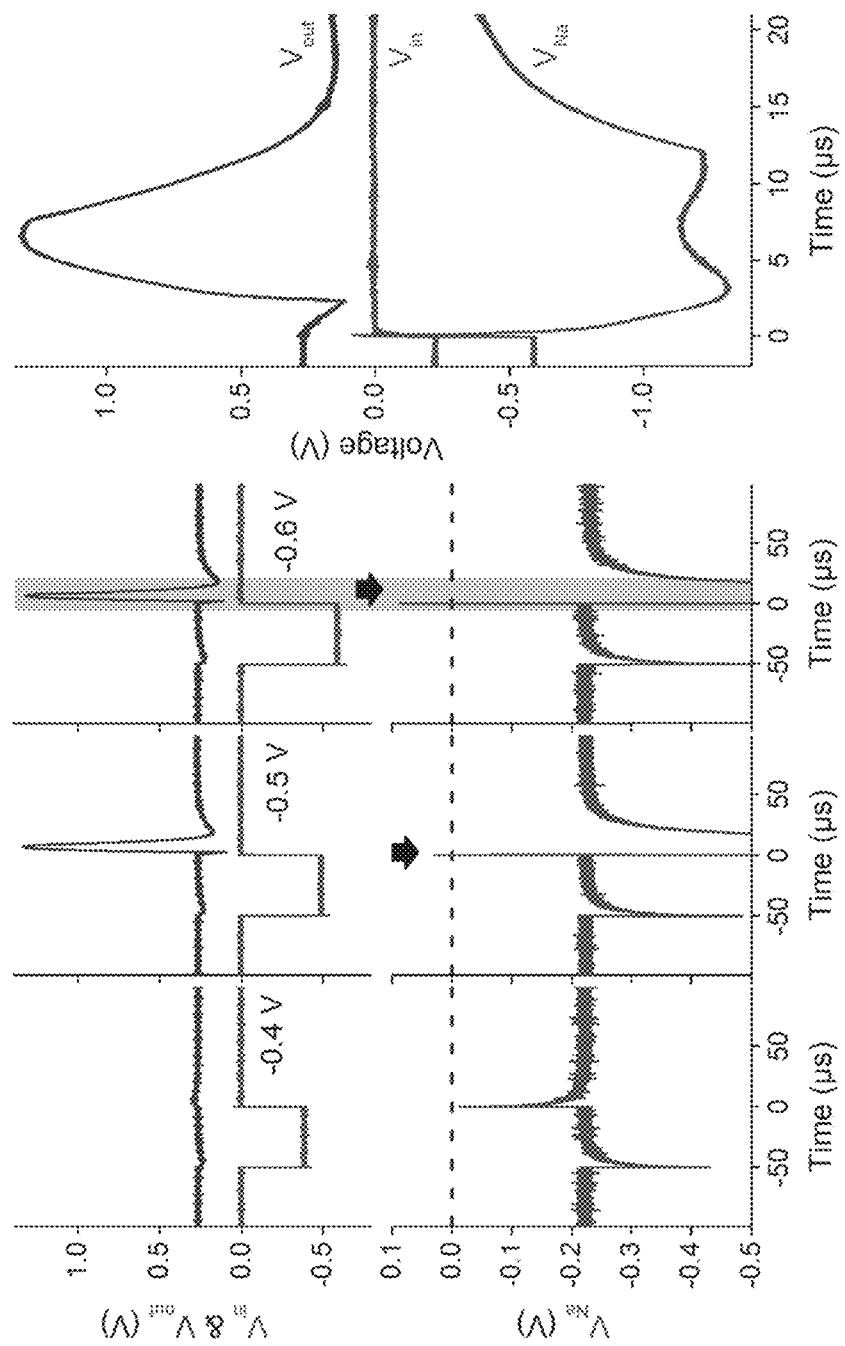
Figure 29D:
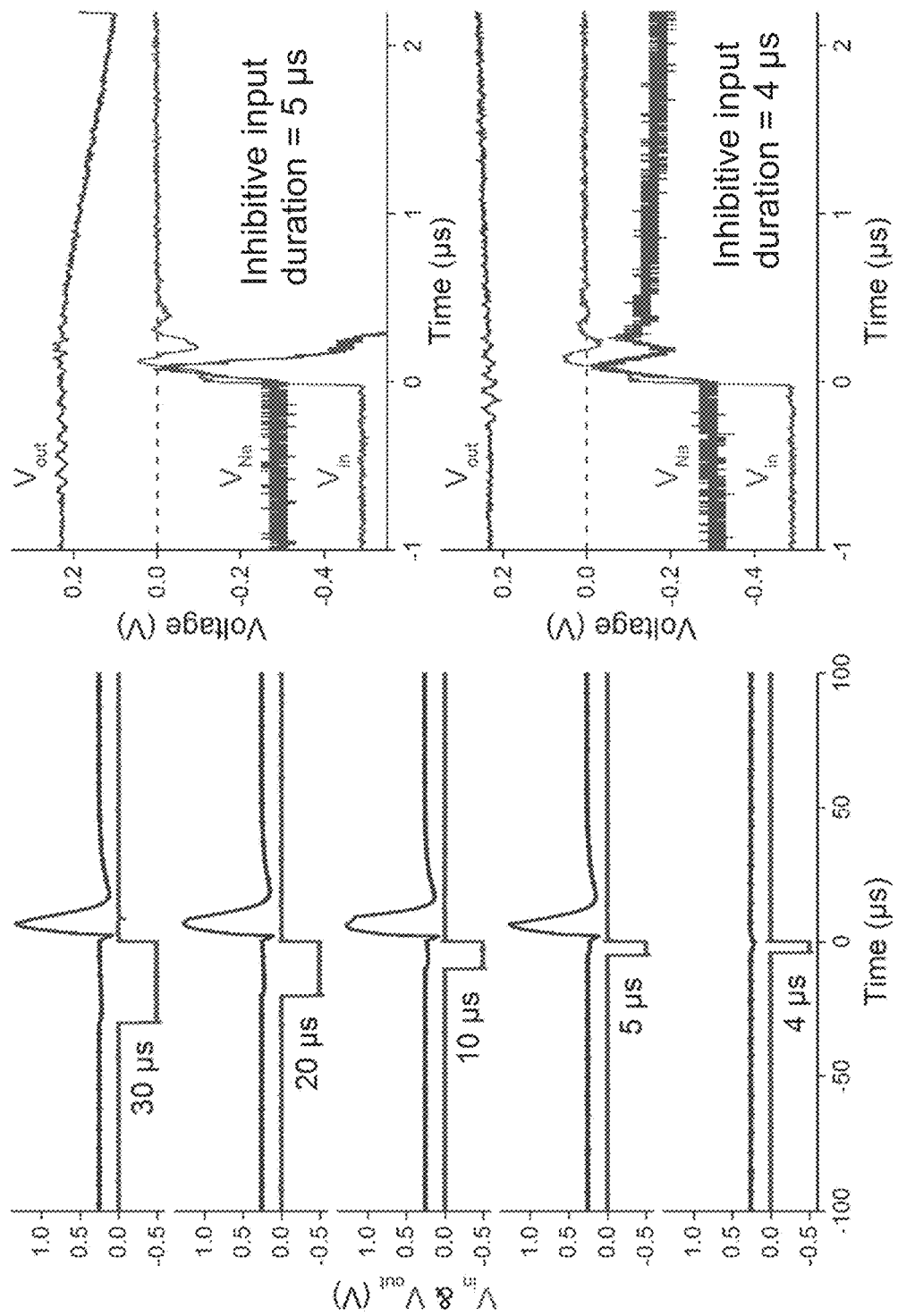

FIGS. 29B, 29C and 29D illustrate rebound spike behaviors of a phasic excitatory neuron circuit 20' such as illustrated in FIG. 4A. As illustrated in FIG. 29C, in the measured neuron circuit there exists a threshold amplitude of 0.5V for the negative inhibitive input pulse to elicit a rebound spike, above which an action potential is generated at the rise edge of the inhibitive input pulse.

FIG. 29C also shows the measured Na gate potentials: the Na gate potential produces a spikelet (downward arrow) at the rise edge of the inhibitive voltage input, triggering the Na gate and subsequently the K gate openings—and an action potential generation. The Na spikelet has to go across zero to become positive for the action potential to be triggered.

Figure 30A:
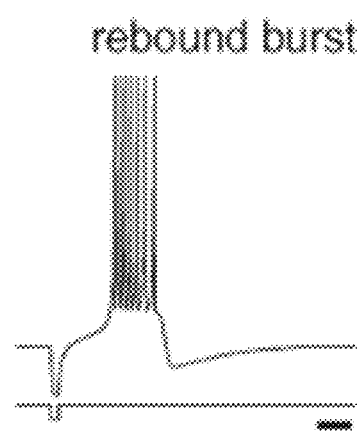
FIG. 30A illustrates a theoretical rebound burst behavior of a biological neuron.

As illustrated in FIG. 29D, in the measured neuron circuit, there exists a threshold input pulse duration of ~5 μs for rebound spike to occur, a shorter inhibitive input pulse (4 μs) will not elicit a rebound spike at its rise edge. The data illustrated in FIGS. 29B, 29C and 29D was measured for a neuron circuit 20' according to an embodiment of this presentation, having the following characteristics and with the following stimuli:

- Lot ID: 29E, Wafer ID: L29E-3
- VO2 device ID: X1=5352-1, X2=5252-13
- RL1 replaced by Cin=0.3 nF, RL2=5.9 kΩ
- C1=0 nF C2=1 nF (plus stray capacitance ~1 nF for each)
- V1=−1.5 V, V2=1.5 V
- Inhibitory voltage input pulse height=−0.4 V to −0.6 V
- Inhibitory voltage input pulse width: 4 μs to 50 μs FIG. 30A illustrates a theoretical rebound burst behavior of a biological neuron (see E. M. Izhikevich, "Which model to use for cortical spiking neurons?", IEEE Trans. Neural Netw. 15, 1063 (2004). DOI: 10.1109/TNN.2004.832719). Some neurons, including the thalamo-cortical cells, may fire post inhibitory bursts, as illustrated in FIG. 30A. It is believed that such bursts contribute to the sleep oscillations in the thalamo-cortical cells.

Figure 30B:
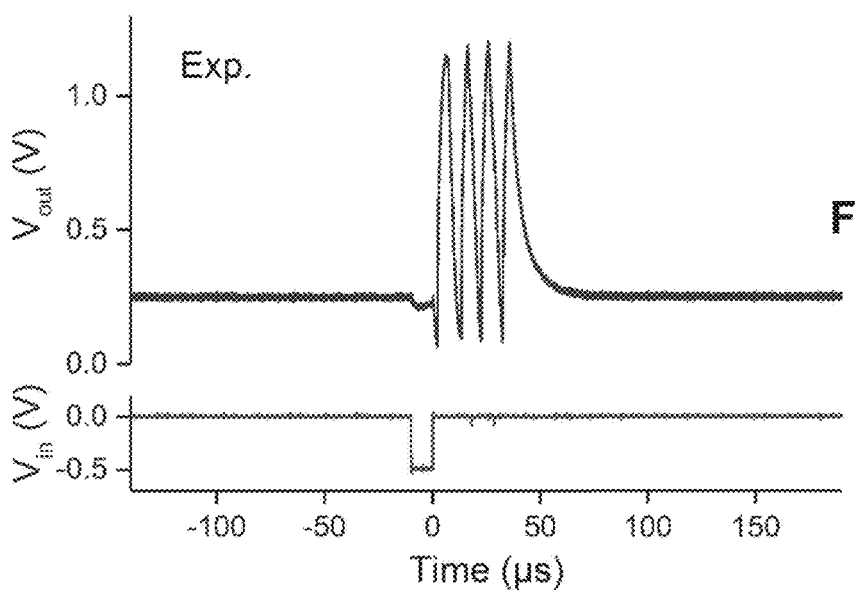
FIGS. 30BA-30BB illustrate experimental (30BA) and simulated (30BB) rebound burst behavior of a phasic neuron circuit according to embodiments of this presentation.
Figure 30B:
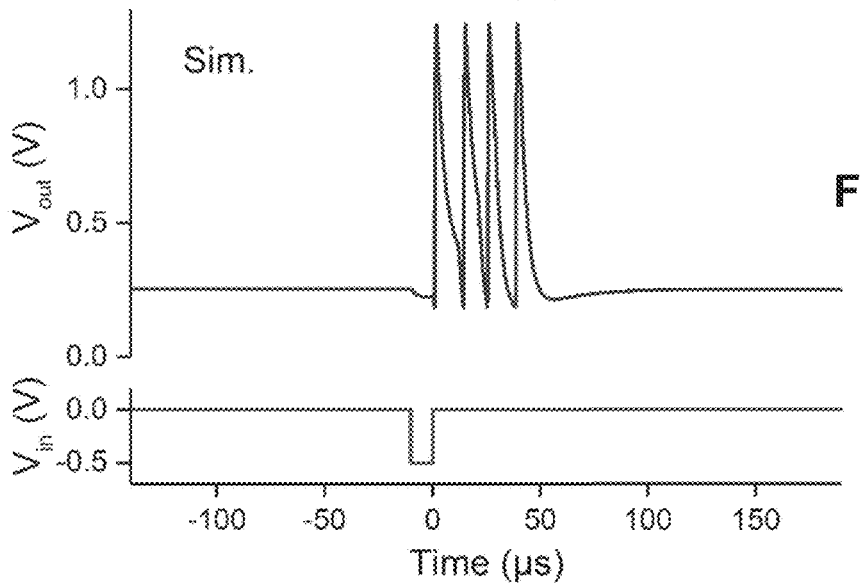
Figure 31A:
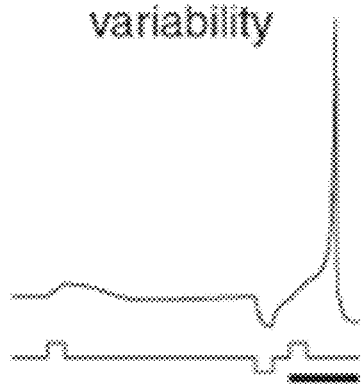
FIG. 31A illustrates a theoretical threshold variability behavior of a biological neuron.

FIGS. 30BA-30BB illustrate an experimental (30BA) and simulated (30BB) rebound burst behavior of a phasic excitatory neuron circuit 20' such as illustrated in FIG. 4A. The data illustrated in FIGS. 30BA-30BB was measured for a neuron circuit 20' having the following characteristics and with the following stimuli:

- Lot ID: 29E, Wafer ID: L29E-3
- VO2 device ID: X1=5352-1, X2=5252-13
- RL1 replaced by Cin=0.3 nF, RL2=5.9 kΩ
- C1=0 nF C2=0.5 nF (plus stray capacitance ~1 nF for each)
- V1=−1.5 V, V2=1.5 V
- Inhibitory voltage input pulse height=−0.5 V
- Inhibitory voltage input pulse width=10 μs FIG. 31A illustrates a theoretical threshold variability behavior of a biological neuron (see E. M. Izhikevich, "Which model to use for cortical spiking neurons?", IEEE Trans. Neural Netw. 15, 1063 (2004). DOI: 10.1109/TNN.2004.832719).

A common misconception in the artificial neural network community is the belief that spiking neurons have a fixed voltage threshold. It is known that biological neurons have a variable threshold that depends on the prior activity of the neurons. FIG. 31A illustrates a first stimulation of a neuron with a brief excitatory pulse of current that produces a 10 mV depolarization. The neuron does not fire, hence the input is subthreshold. Then a brief inhibitory pulse is applied, followed by the same "subthreshold" pulse of current as sent in the first place. The neuron fires the second time because its "threshold" was lowered by the preceding inhibitory input. Hence, the same 10 mV can be subthreshold or supra-threshold depending on the prior activity.

Interestingly, in some neurons according to an embodiment of this presentation, a preceding excitatory pulse can raise the threshold and make the neuron less excitable.

Figure 31B:
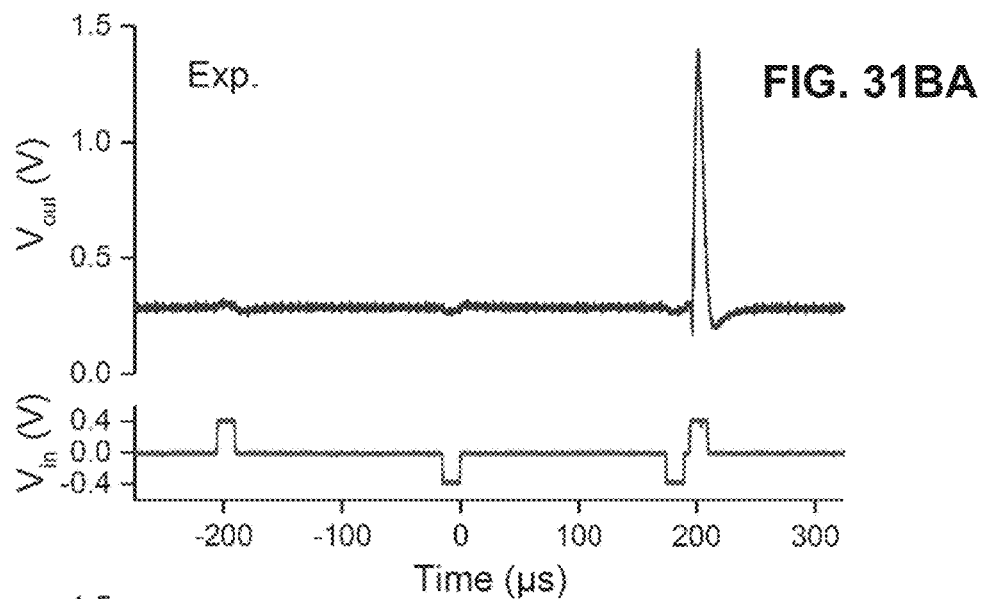
FIGS. 31BA-31BB illustrate experimental (31BA) and simulated (31BB) threshold variability behavior of a phasic neuron circuit according to embodiments of this presentation.
Figure 31B:
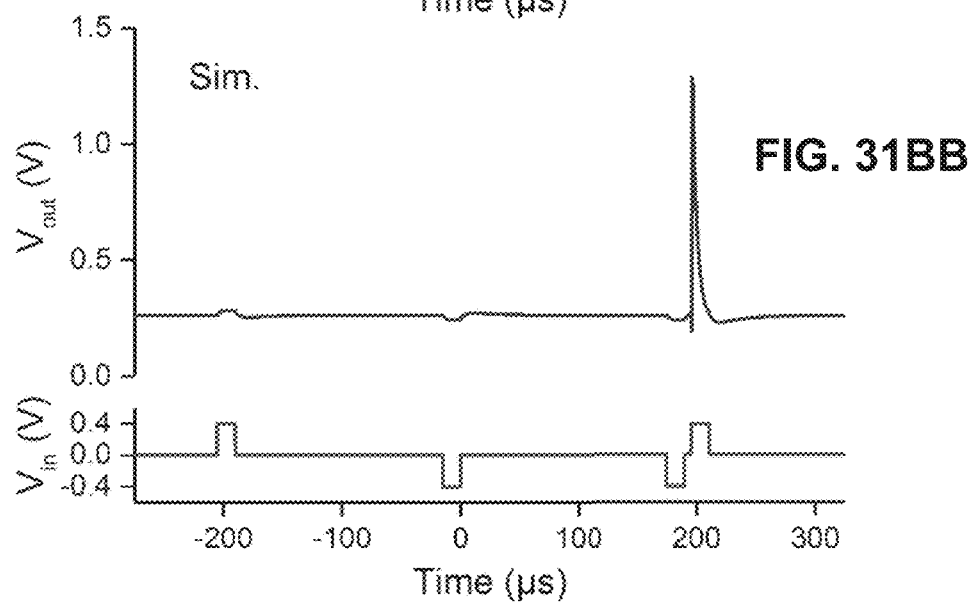

FIGS. 31BA-31BB illustrate an experimental (31BA) and simulated (31BB) threshold variability behavior of a phasic excitatory neuron circuit 20' such as illustrated in FIG. 4A. The data illustrated in FIGS. 31BA-31BB was measured for a neuron circuit 20' having the following characteristics and with the following stimuli:

- Lot ID: 29E, Wafer ID: L29E-3
- VO2 device ID: X1=5352-1, X2=5252-13
- RL1 replaced by Cin=0.3 nF, RL2=5.9 kΩ

Figure 32:
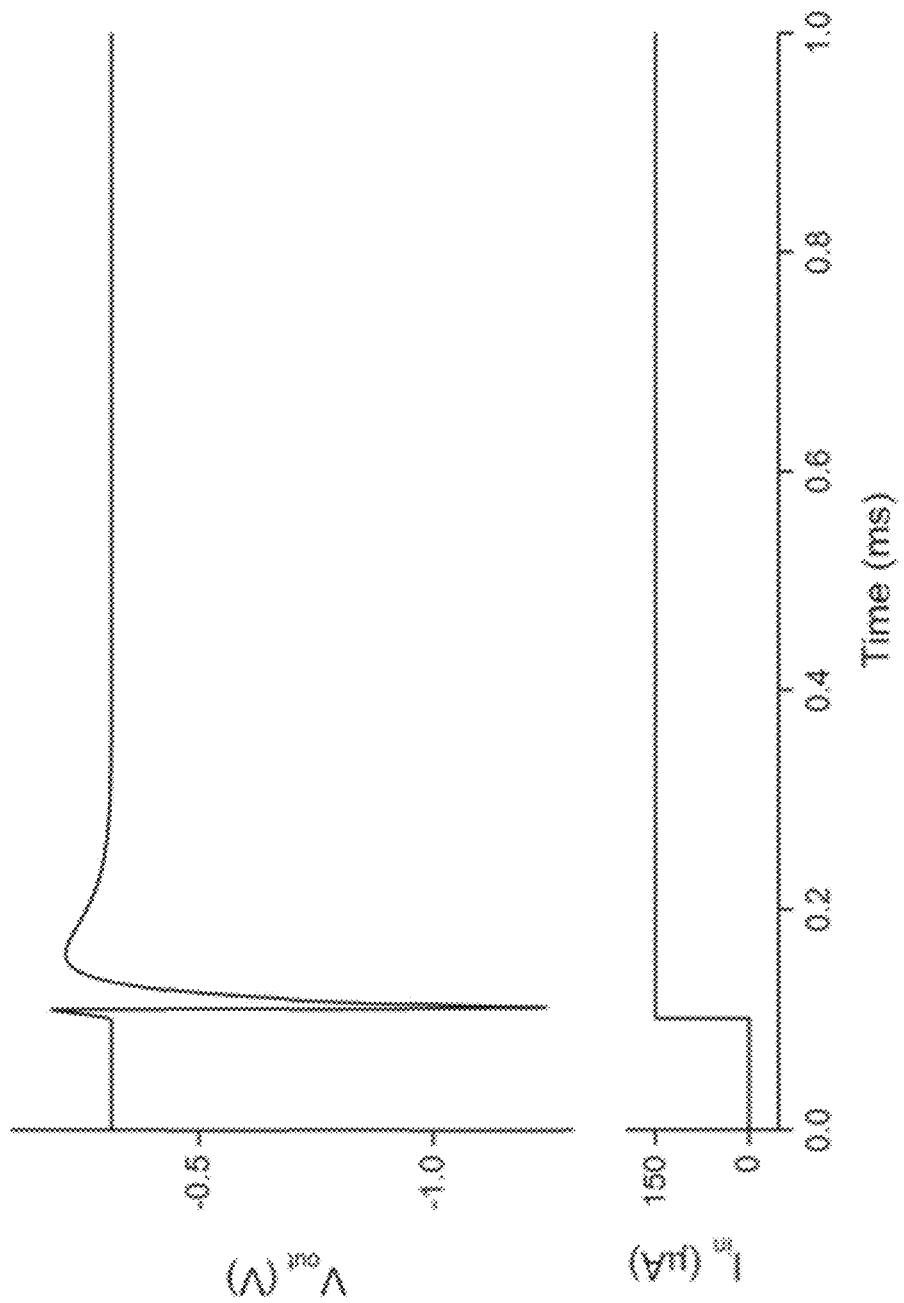
FIG. 32 illustrates an inhibitive phasic spike (action potential) generation of an inhibitive phasic neuron such as illustrated in FIG. 5.

C1=0 nF C2=0.5 nF (plus stray capacitance ~1 nF for each)
V1=−1.5 V, V2=1.5 V
Subthreshold excitatory & inhibitory voltage inputs
Pulse height=0.4 V, Pulse width=15 μs
Excitatory-inhibitory pulse interval=5 μs FIG. 32 illustrates a simulated action potential generation (polarity-inverted mirror of the phasic spiking as illustrated in FIG. 26(B)) of a neuron such as illustrated in FIG. 5.

Inhibitory neurons according to embodiments of this presentation can have all the spiking behaviors listed in FIG. 8 and illustrated in FIGS. 9A-9W and 10B-10R, where each behavior is a polarity-inverted mirror of the excitatory behavior.

Figure 33A:
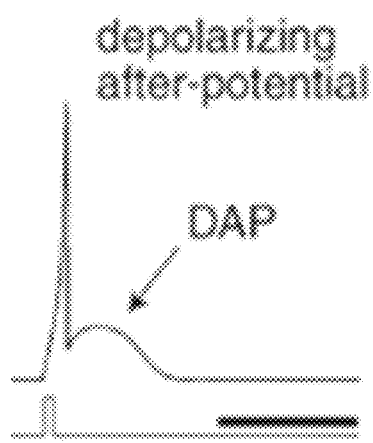
FIG. 33A illustrates a theoretical Depolarizing After-Potential behavior of a biological neuron.

FIG. 33A illustrates a theoretical Depolarizing After-Potentials behavior of a biological neuron (see E. M. Izhikevich, "Which model to use for cortical spiking neurons?", IEEE Trans. Neural Netw. 15, 1063 (2004). DOI: 10.1109/TNN.2004.832719). After firing a spike, the membrane potential of a neuron may exhibit a prolonged after-hyperpolarization (AHP) as, e.g. in FIG. 10B or 10M, or a prolonged depolarized after-potential (DAP) as in FIG. 10Q. Such DAP behaviors can appear because of dendridic influence, because of high-threshold inward currents activated during the spike, or because of an interplay between subthreshold voltage-gated currents. In any case, such a neuron has a shortened refractory period and it becomes superexitable.

It is noted that DAP is described in E. M. Izhikevich, "Which model to use for cortical spiking neurons?", IEEE Trans. Neural Netw. 15, 1063 (2004). DOI: 10.1109/TNN.2004.832719. However, differently from the Izhikevich's paper, the DAP behavior observed for a neuron according to this presentation requires a phasic neuron circuit and a D.C. input current instead of a short current pulse.

Figure 33B:
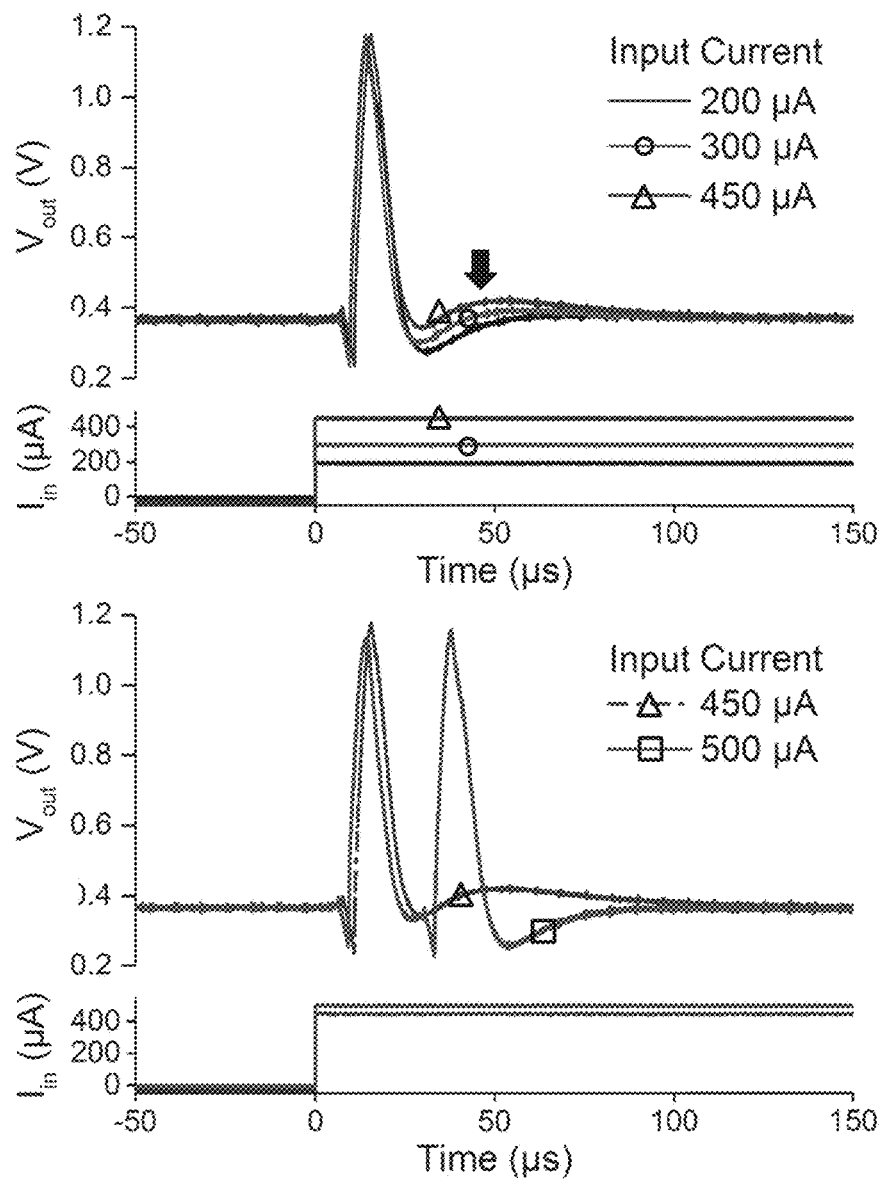
FIG. 33B illustrates an experimental Depolarizing After-Potential behavior of a phasic neuron circuit according to embodiments of this presentation.

The left panel of FIG. 33B illustrates that in a phasic excitatory neuron circuit, the original hyperpolarizing after-potential gradually morphs into a DAP (downward arrow) at higher input current levels. The right panel of FIG. 33B illustrates that when the observed DAP is developed, the neuron becomes superexcitable, and a small further increase of input current elicits a second spike.

Figure 34A:
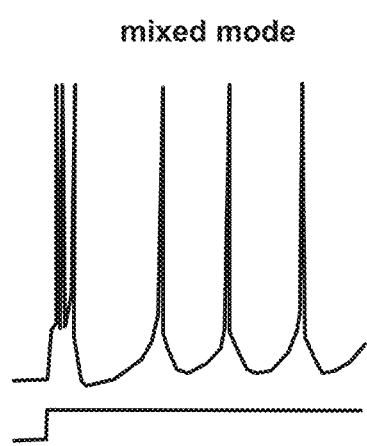
FIG. 34A illustrates a theoretical Mixed Mode behavior of a biological neuron.

The data illustrated in FIG. 33B was measured for a phasic neuron circuit 20' having the following characteristics and with the following stimuli:
Lot ID: 29E, Wafer ID: L29E-3
VO2 devices: X1=5352-1, X2=5252-13
RL1 replaced by Cin=0.3 nF, RL2=6 kΩ
C1=0.9 nF C2=2 nF (plus stray capacitance ~1 nF for each)
V1=−1.3 V, V2=1.3 V
Current clamp input is converted from a voltage square pulse using a stimulation isolator with a gain of 0.1 mA/V FIG. 34A illustrates a theoretical Mixed Mode behavior of a biological neuron (see E. M. Izhikevich, "Which model to use for cortical spiking neurons?", IEEE Trans. Neural Netw. 15, 1063 (2004). DOI: 10.1109/TNN.2004.832719). Intrinsically bursting excitatory neurons in mammalian neocortex can exhibit a mixed type of spiking activity as depicted for example in FIG. 34A. Such neurons fire a phasic burst at the onset of stimulation and then switch to a tonic spiking mode. It is not clear yet what type of computation such a neuron can do in addition to detecting the onset and reporting the extent of the stimulus.

Figure 34C:
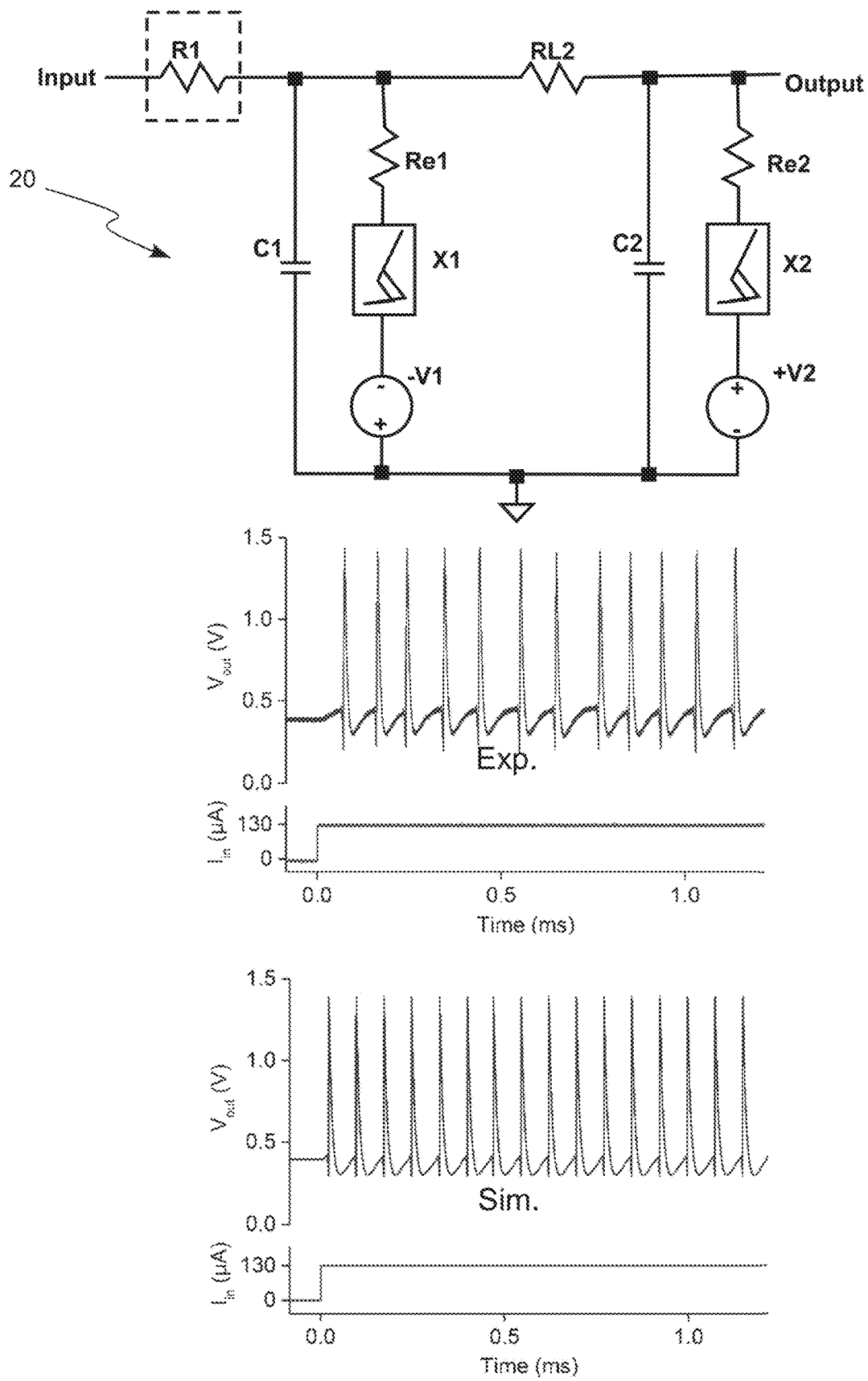
Figure 34D:
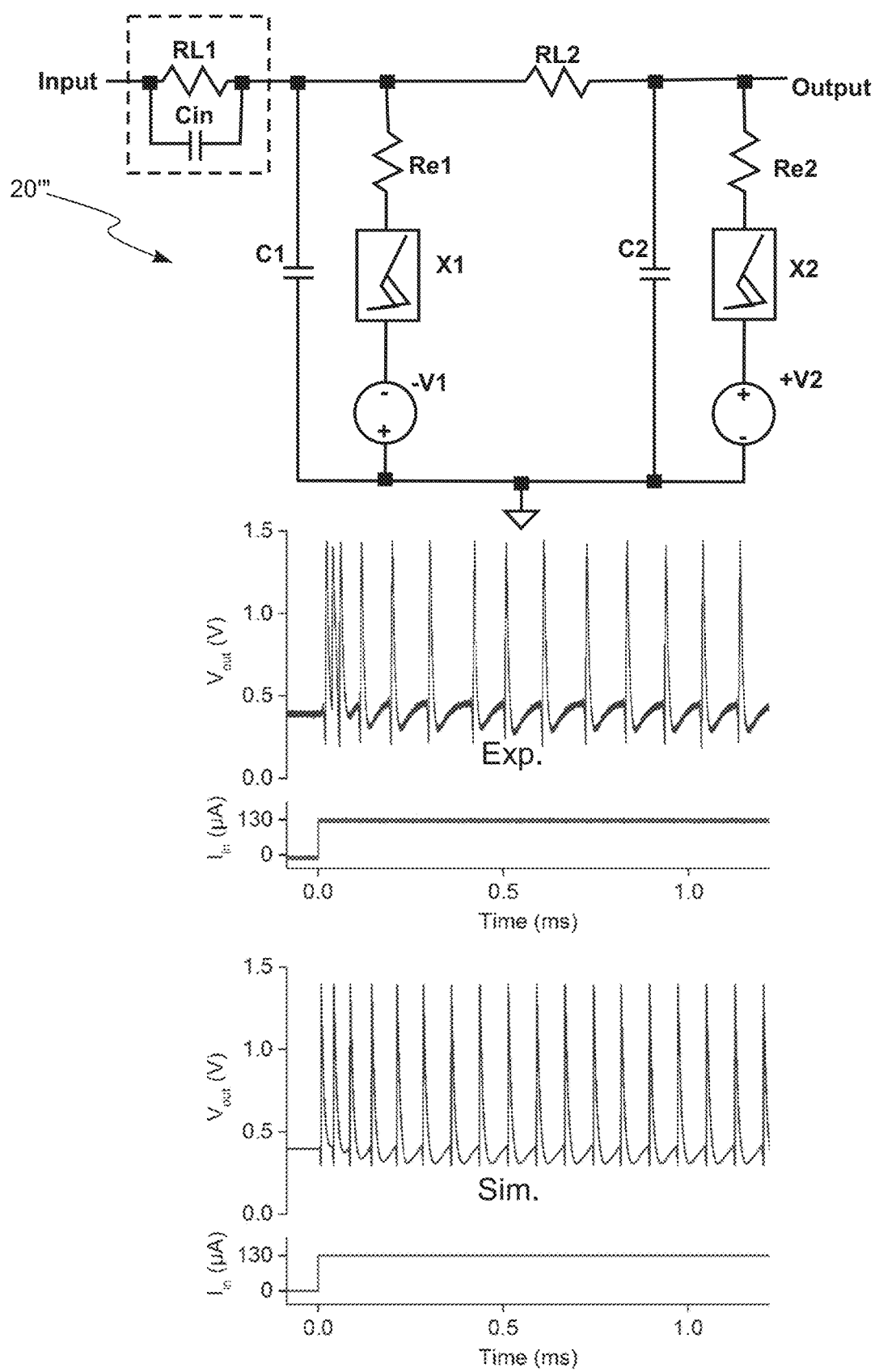

FIG. 34B-D illustrates the schematics of a phasic mode neuron circuit 20' according to this presentation, a tonic mode neuron circuit 20 according to this presentation and a mixed mode neuron circuit 20''' according to this presentation, as well as their compared responses to a same current clamp stimulus. It is noted that circuit 20''' differs from circuits 20 and 20', by having in parallel a first load capacitor Cin and a first load resistor RL1 instead of a first load resistor RL1 and a first load capacitor Cin, respectively.

As illustrated in FIG. 34B, a phasic neuron circuit 20' with a capacitive input impedance has a Phasic bursting behavior; a tonic neuron circuit 20 with a resistive input impedance has a Tonic spiking behavior; and a mixed-mode neuron circuit 20''' with in parallel Cin and RL1 input impedance has a phasic burst then tonic spiking behavior. Their simulated spiking behaviors agree well with the experimental data.

The data illustrated in FIGS. 34B-D was measured for a mixed mode neuron circuit 20''' having the following characteristics and with the following stimuli:
Lot ID: 29E, Wafer ID: L29E-3
VO2 device ID: X1=5351-11, X2=5351-7
RL1=240 kΩ, Cin=1 nF, RL2=9 kΩ
C1=4 nF C2=1.2 nF (plus stray capacitance ~1 nF for each)
V1=−1.6 V, V2=1.6 V
Current clamp input is converted from a voltage square pulse using a stimulation isolator with a gain of 0.1 mA/V The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this presentation with respect to the current state of the art, but also contemplates advancements and that adaptations in the future may take into consideration of those advancements, namely in accordance with the then current state of the art. Reference to a feature element in the singular is not intended to mean "one and only one" unless explicitly so stated. Moreover, no element, component, nor method or process step in this presentation is intended to be dedicated to the public regardless of whether the element, component, or step is explicitly recited in this presentation. No element disclosed herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

The invention claimed is:
1. A neural circuit comprising:
 a first neuron circuit, comprising first and second resistively coupled relaxation oscillators, the first and second relaxation oscillators comprising respectively first and second passive load resistors in series with first and second locally-active current-controlled negative differential resistance devices, in series with first and second DC opposite voltage sources, in parallel with first and second grounded capacitors;

said first relaxation oscillator being also coupled to an input node of the first neuron circuit by a first load resistor and the first DC voltage source being a first, negative, voltage source; and the second DC voltage source being a positive, voltage source;

the second relaxation oscillator being also coupled to an output node of the first neuron circuit;

a second neuron circuit, comprising third and fourth resistively coupled relaxation oscillators, the third and fourth relaxation oscillators comprising respectively third and fourth passive load resistors in series with third and fourth locally-active current-controlled negative differential resistance devices, in series with third and fourth DC opposite voltage sources, in parallel with third and fourth grounded capacitors; wherein:

said third relaxation oscillator is also coupled to an input node of the second neuron circuit by a third load resistor and the third DC voltage source is a third, positive, voltage source; and said fourth DC voltage source being a fourth, negative, voltage source;

said fourth relaxation oscillator is also coupled to an output node of the second neuron circuit;

the first and second neuron circuits being connected in series.

2. A neural circuit comprising:

a first neuron circuit comprising first and second resistively coupled relaxation oscillators, the first and second relaxation oscillators comprising respectively first and second passive load resistors in series with first and second locally-active current-controlled negative differential resistance devices, in series with first and second DC opposite voltage sources, in parallel with first and second grounded capacitors; wherein:

said first relaxation oscillator is coupled to an input node of the first neuron circuit by a first load capacitor and said first DC voltage source is a first, negative, voltage source; and said second DC voltage source is a second, positive, voltage source; said second relaxation oscillator being also coupled to an output node of the first neuron circuit;

a second neuron circuit, comprising third and fourth resistively coupled relaxation oscillators, the third and fourth relaxation oscillators comprising respectively third and fourth passive load resistors in series with third and fourth locally-active current-controlled negative differential resistance devices, in series with third and fourth DC opposite voltage sources, in parallel with third and fourth grounded capacitors wherein:

said third relaxation oscillator is also coupled to an input node of the second neuron circuit by a third load capacitor and said third DC voltage source is a third, positive, voltage source; and said fourth DC voltage source is a fourth, negative, voltage source; said fourth relaxation oscillator being coupled to an output node of the second neuron circuit;

the first and second neuron circuits being connected in series.

3. A neuron circuit comprising first and second resistively coupled relaxation oscillators, the first and second relaxation oscillators comprising respectively first and second passive load resistors in series with first and second locally-active current-controlled negative differential resistance devices, in series with first and second DC opposite voltage sources, in parallel with first and second grounded capacitors.

4. The neuron circuit of claim 3, wherein said first DC voltage source is a negative voltage source and said second DC voltage source is a positive voltage source.

5. The neuron circuit of claim 3, wherein said first DC voltage source is a positive voltage source and said second DC voltage source is a negative voltage source.

6. The neuron circuit of claim 3, wherein at least one of the first and second locally active current controlled negative differential resistance devices comprises a resistance connected in series with a negative differential resistance material between first and second nodes.

7. The neuron circuit of claim 3, wherein at least one of the first and second locally active current controlled negative differential resistance devices comprises a vanadium dioxide layer between first and second nodes.

8. The neuron circuit of claim 3, wherein:

the first and second relaxation oscillators are resistively coupled at a first node of the first relaxation oscillator and a first node of the second relaxation oscillator;

said first node of said first relaxation oscillator being connected to an input node of the neuron circuit by a first load capacitor; and said first node of said second relaxation oscillator, forming an output node of the neuron circuit.

9. The neuron circuit of claim 8, wherein said first DC voltage source is a negative voltage source and said second DC voltage source is a positive voltage source.

10. The neuron circuit of claim 8, wherein said first DC voltage source is a positive voltage source and said second DC voltage source is a negative voltage source.

11. The neuron circuit of claim 8, further comprising a load resistance in series or in parallel with the first load capacitor.

12. The neuron circuit of claim 3, wherein said first and second DC voltage sources are voltage sources arranged to bring the first and second locally-active current-controlled negative differential resistance devices to a bias voltage less than their respective Mott insulator-to-metal transition voltages.

13. A neural circuit comprising at least a neuron circuit of claim 8, said neuron circuit having its input node arranged to receive an input pulse through an input impedance; and having its output node arranged to provide an output pulse through an output impedance.

* * * * *